(12) United States Patent
Ohmaru

(10) Patent No.: US 10,306,168 B2
(45) Date of Patent: May 28, 2019

(54) SEMICONDUCTOR DEVICE, IMAGING SYSTEM, AND ELECTRONIC DEVICE

(71) Applicant: Semiconductor Energy Laboratory Co., Ltd., Atsugi-shi, Kanagawa-ken (JP)

(72) Inventor: Takuro Ohmaru, Fukuoka (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 289 days.

(21) Appl. No.: 15/137,381

(22) Filed: Apr. 25, 2016

(65) Prior Publication Data
US 2016/0329368 A1 Nov. 10, 2016

(30) Foreign Application Priority Data
May 4, 2015 (JP) .................................. 2015-094491

(51) Int. Cl.
*H04N 5/3745* (2011.01)
*H04N 5/369* (2011.01)
(Continued)

(52) U.S. Cl.
CPC ..... *H04N 5/3745* (2013.01); *H01L 27/14616* (2013.01); *H01L 27/14636* (2013.01);
(Continued)

(58) Field of Classification Search
CPC ......... H01L 27/14616; H01L 27/14636; H01L 27/14663; H01L 27/14667;
(Continued)

(56) References Cited

U.S. PATENT DOCUMENTS 4,789,890 A 12/1988 Itoh et al.
5,705,807 A 1/1998 Throngnumchai
(Continued)

FOREIGN PATENT DOCUMENTS

JP H11-275523 10/1999
JP 2003-032668 1/2003
(Continued)

OTHER PUBLICATIONS

Chi et al., "CMOS Camera With In-Pixel Temporal Change Detection and ADC", IEEE Journal of Solid-State Circuits, vol. 42, No. 10, Oct. 2007, pp. 2187-2196 (Year: 2007).*
(Continued)

*Primary Examiner* — Nelson D. Hernández Hernández
(74) *Attorney, Agent, or Firm* — Fish & Richardson P.C.

(57) ABSTRACT

To provide a novel semiconductor device, a semiconductor device capable of operating at a high speed, or a semiconductor device with reduced area, or a semiconductor device with low power consumption. The semiconductor device which has a function of taking a moving image includes a pixel portion including a plurality of pixels, a first circuit, and a second circuit. Each of the plurality of pixels has a function of converting irradiation light to generate first data and a function of generating second data corresponding to a difference between the first data in a first frame period and the first data in a second frame period. The first circuit has a function of converting the second data into a digital signal and outputting the digital signal as compressed data of the moving image. The second circuit has a function of controlling output of the compressed data.

19 Claims, 55 Drawing Sheets

(51) Int. Cl.
    *H01L 27/146*     (2006.01)
    *H04N 9/04*     (2006.01)
    *H01L 29/786*     (2006.01)
    *H04N 5/355*     (2011.01)

(52) U.S. Cl.
    CPC .. *H01L 27/14663* (2013.01); *H01L 27/14667* (2013.01); *H01L 29/7869* (2013.01); *H04N 5/35563* (2013.01); *H04N 5/3698* (2013.01); *H04N 5/37457* (2013.01); *H04N 9/045* (2013.01)

(58) Field of Classification Search
    CPC ............. H04N 5/35563; H04N 5/3698; H04N 5/3745; H04N 5/37457; H04N 9/045
    See application file for complete search history.

(56) References Cited

U.S. PATENT DOCUMENTS

| | | | |
|---|---|---|---|
| 6,696,687 B1 * | 2/2004 | Tomisaki | H01L 27/14658 250/370.09 |
| 7,046,282 B1 | 5/2006 | Zhang et al. | |
| 7,286,173 B2 | 10/2007 | Zhang et al. | |
| 7,674,650 B2 | 3/2010 | Akimoto et al. | |
| 7,791,117 B2 | 9/2010 | Zhang et al. | |
| 8,564,035 B2 | 10/2013 | Zhang et al. | |
| 8,576,317 B2 | 11/2013 | Sakakibara et al. | |
| 8,836,626 B2 | 9/2014 | Ikeda | |
| 2003/0067424 A1 | 4/2003 | Akimoto et al. | |
| 2005/0007316 A1 | 1/2005 | Akimoto et al. | |
| 2008/0002857 A1 | 1/2008 | Tsunashima | |
| 2008/0049128 A1 | 2/2008 | Murata et al. | |
| 2009/0101948 A1 | 4/2009 | Park et al. | |
| 2010/0182470 A1 | 7/2010 | Sugawa et al. | |
| 2011/0133706 A1 | 6/2011 | Takahashi et al. | |
| 2011/0176038 A1 | 7/2011 | Kurokawa et al. | |
| 2011/0198483 A1 | 8/2011 | Kurokawa | |
| 2011/0199526 A1 | 8/2011 | Nitta et al. | |
| 2012/0002090 A1 | 1/2012 | Aoki et al. | |
| 2013/0222584 A1 | 8/2013 | Aoki et al. | |
| 2014/0036123 A1 | 2/2014 | Sakakibara et al. | |
| 2014/0361296 A1 | 12/2014 | Ikeda | |
| 2015/0332568 A1 | 11/2015 | Kurokawa | |
| 2016/0037106 A1 | 2/2016 | Ohmaru | |
| 2016/0094796 A1 * | 3/2016 | Govil | H04N 5/3456 348/295 |

FOREIGN PATENT DOCUMENTS

| | | |
|---|---|---|
| JP | 2004-072683 | 3/2004 |
| JP | 2008-042827 A | 2/2008 |
| JP | 2009-206353 | 9/2009 |
| JP | 2009-296353 | 12/2009 |

OTHER PUBLICATIONS

Brandli et al., "A 240×180 130 dB 3 µs Latency Global Shutter Spatiotemporal Vision Sensor", IEEE Journal of Solid-State Circuits, vol. 49, No. 10, Oct. 2014, pp. 2333-2341 (Year: 2014).*

* cited by examiner 831  832  830

831  835  832

832
831

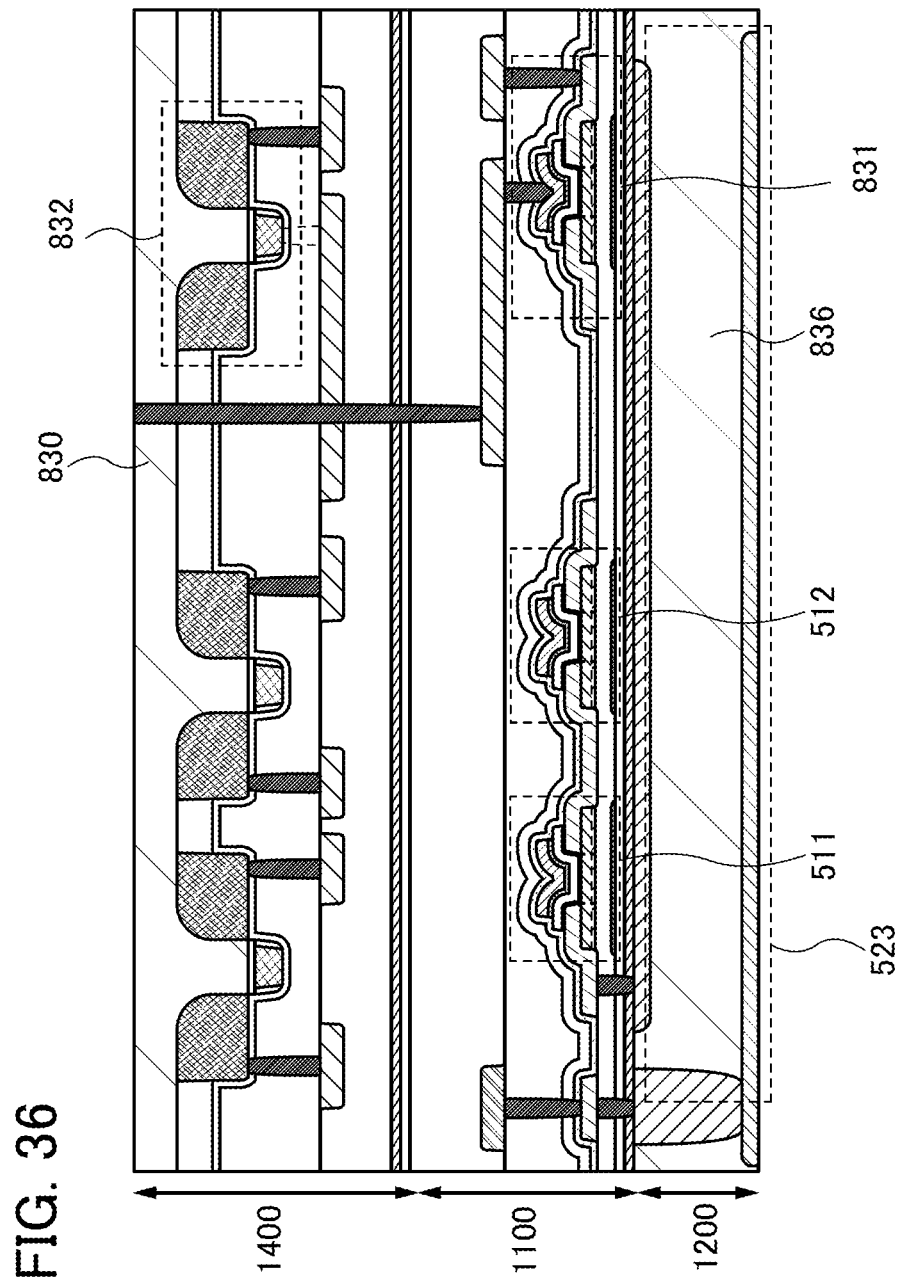

FIG. 42A1
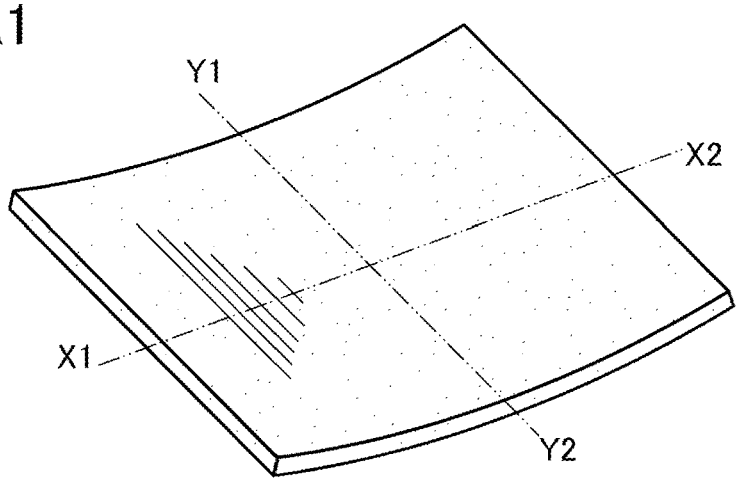
FIG. 42A2
FIG. 42A3
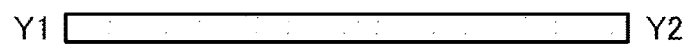
FIG. 42B1
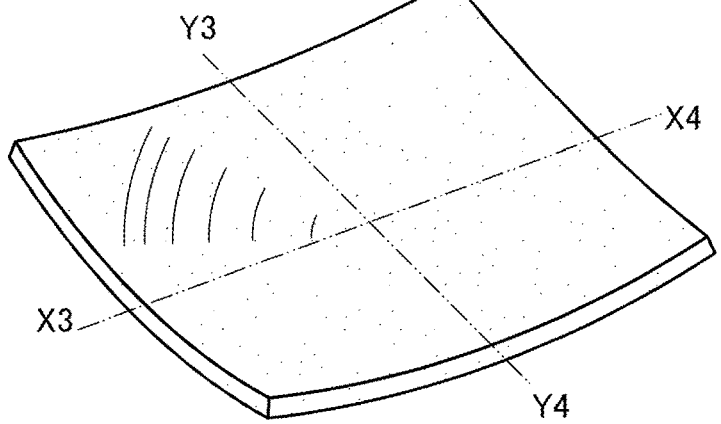
FIG. 42B2
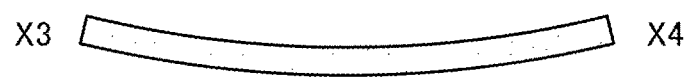
FIG. 42B3

SEMICONDUCTOR DEVICE, IMAGING SYSTEM, AND ELECTRONIC DEVICE

BACKGROUND OF THE INVENTION

1. Field of the Invention

One embodiment of the present invention relates to a semiconductor device, an imaging system, and an electronic device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. One embodiment of the present invention relates to a semiconductor device, an imaging device, a display device, a light-emitting device, a power storage device, a memory device, an electronic device, a method for driving them, or a method for manufacturing them.

2. Description of the Related Art

Imaging elements are provided in a wide variety of electronic devices such as digital cameras or mobile phones. In recent years, the number of pixels in imaging elements has been increased, and accordingly, the amount of data obtained by imaging also has been increased. Therefore, higher speed of reading or transfer of data has been required.

A technique in which image data is compressed in order to deal with the increase in amount of image data in accordance with the increase in number of pixels in imaging elements has been known. Patent Document 1 discloses an imaging element module in which difference data between captured image data of the previous period and captured image data of the present period is calculated in taking a moving image or in continuous shooting and data is compressed.

REFERENCE

Patent Document

[Patent Document 1] Japanese Published Patent Application No. 2009-296353

SUMMARY OF THE INVENTION

An object of one embodiment of the present invention is to provide a novel semiconductor device or a novel imaging device. Another object of one embodiment of the present invention is to provide a semiconductor device or an imaging device capable of operating at a high speed. Another object of one embodiment of the present invention is to provide a semiconductor device or an imaging device with reduced area. Another object of one embodiment of the present invention is to provide a semiconductor device or an imaging device with low power consumption.

One embodiment of the present invention does not necessarily achieve all the objects listed above and only needs to achieve at least one of the objects. The description of the above objects does not disturb the existence of other objects. Other objects will be apparent from and can be derived from the description of the specification, the drawings, and the claims.

A semiconductor device according to one embodiment of the present invention which has a function of taking a moving image includes a pixel portion including a plurality of pixels, a first circuit, and a second circuit. Each of the plurality of pixels has a function of converting irradiation light to generate first data and a function of generating second data corresponding to a difference between the first data in a first frame period and the first data in a second frame period. The first circuit has a function of converting the second data into a digital signal and outputting the digital signal as compressed data of the moving image. The second circuit has a function of controlling output of the compressed data.

A semiconductor device according to another embodiment of the present invention which has a function of taking a moving image includes a pixel portion including a plurality of pixels, a first circuit, a second circuit, and a third circuit. Each of the plurality of pixels has a function of converting irradiation light to generate first data and a function of generating second data corresponding to a difference between the first data in a first frame period and the first data in a second frame period. The first circuit has a function of converting the second data into a digital signal and outputting the digital signal as compressed data of the moving image. The second circuit has a function of controlling output of the compressed data. The third circuit has a function of determining whether or not there is the difference on the basis of the second data. When the third circuit determines that there is no difference, power supply to at least one of the first circuit and the second circuit is stopped. When the third circuit determines that there is the difference, power is supplied to the first circuit and the second circuit, and thus the second data converted into a digital signal by the first circuit is output from the second circuit.

In the semiconductor device according to the above embodiment of the present invention, the third circuit may include a fourth circuit and a fifth circuit. The fourth circuit may have a function of making reference current flow in the fourth circuit. The fifth circuit may have a function of correcting current flowing in the fourth circuit to the reference current when the current flowing in the fourth circuit is changed from the reference current. The power supply may be stopped when the current flowing in the fourth circuit is corrected.

In the semiconductor device according to the above embodiment of the present invention, each of the pixels may include a photoelectric conversion element and a transistor. The photoelectric conversion element may be electrically connected to the transistor. A channel formation region of the transistor may include an oxide semiconductor.

In the semiconductor device according to the above embodiment of the present invention, the photoelectric conversion element may include a selenium-based semiconductor.

The semiconductor device according to the above embodiment of the present invention may have a function of taking an image with a global shutter system.

An imaging system according to one embodiment of the present invention includes a photodetector portion including the above semiconductor device and a data processing portion. The data processing portion includes a decoder. The decoder has a function of extracting the compressed data input from the photodetector portion.

An electronic device according to another embodiment of the present invention includes the above semiconductor device or the above imaging system, and a housing, a display portion, or an operation key.

According to one embodiment of the present invention, a novel semiconductor device or a novel imaging device can be provided. Alternatively, according to one embodiment of the present invention, a semiconductor device or an imaging device capable of operating at a high speed can be provided. Alternatively, according to one embodiment of the present invention, a semiconductor device or an imaging device with reduced area can be provided. Alternatively, according to one embodiment of the present invention, a semiconductor device or an imaging device with low power consumption can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIG. 36 is a cross-sectional view illustrating one embodiment of the present invention.

FIGS. 42A1, 42A2, 42A3, 42B1, 42B2, and 42B3 illustrate bent semiconductor devices.

DETAILED DESCRIPTION OF THE INVENTION

Figure 1:
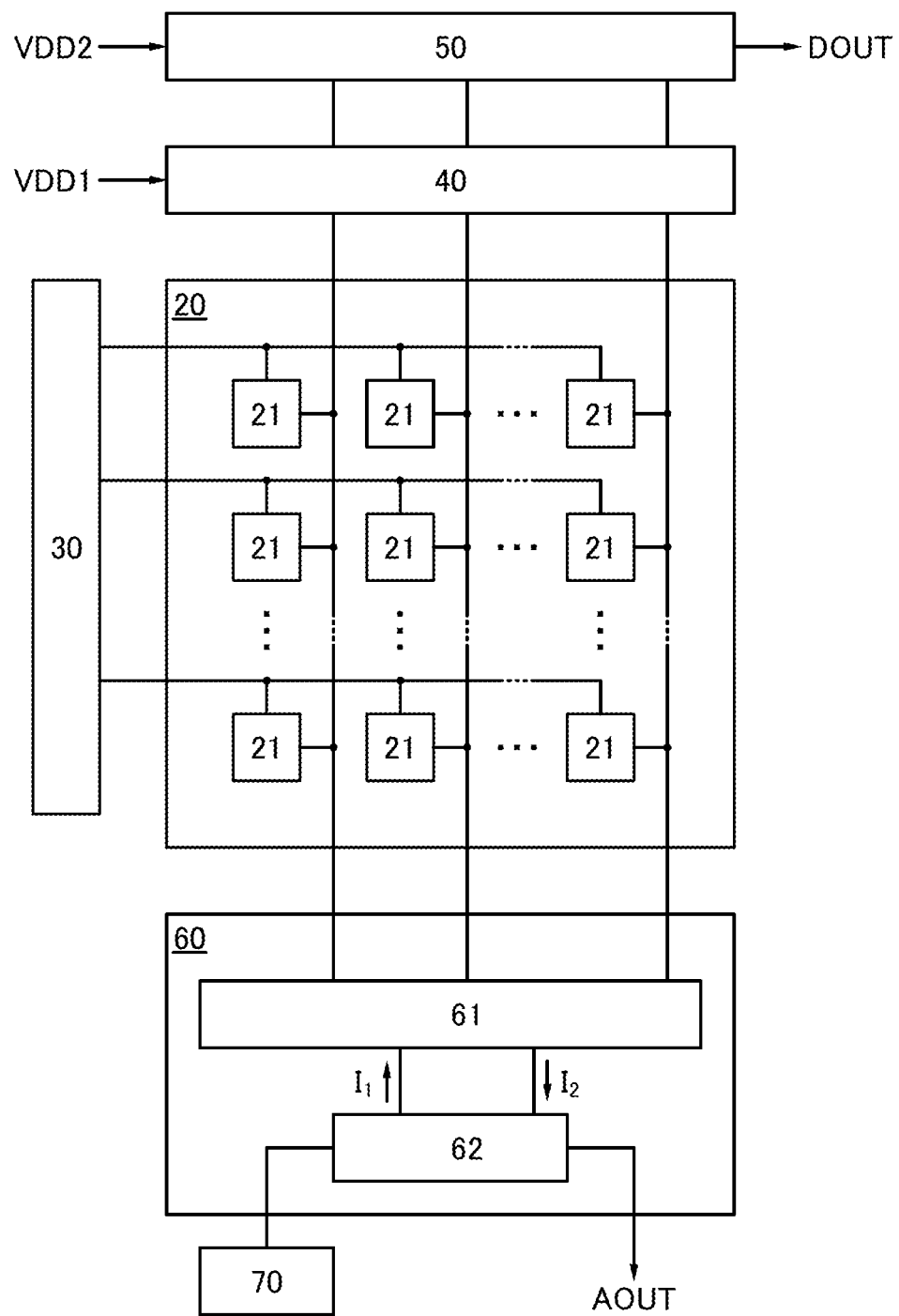
FIG. 1 is a view illustrating one embodiment of the present invention.

Hereinafter, embodiments of the present invention will be described below in detail with reference to the accompanying drawings. Note that the present invention is not limited to the description in the following embodiments, and it will be easily understood by those skilled in the art that various changes and modifications can be made without departing from the spirit and scope of the present invention. Therefore, the present invention should not be interpreted as being limited to the description of embodiments below.

One embodiment of the present invention includes, in its category, devices such as a semiconductor device, an imaging device, a display device, a memory device, an integrated circuit, and a radio frequency (RF) tag. The display device includes, in its category, a display device including an integrated circuit, such as a liquid crystal display device, a light-emitting device in which a light-emitting element typified by an organic light-emitting element is provided in each pixel, an electronic paper, a digital micromirror device (DMD), a plasma display panel (PDP), and a field emission display (FED).

In describing structures of the present invention with reference to the drawings, the same reference numerals are used in common for the same portions in different drawings in some cases.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text. Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal conversion circuit such as a DA conversion circuit, an AD conversion circuit, or a gamma correction circuit; a potential level conversion circuit such as a power supply circuit (e.g., a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Even when independent components are electrically connected to each other in a diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a structural example of a semiconductor device of one embodiment of the present invention are described.

<Structural Example of Semiconductor Device>

FIG. 1 illustrates a structural example of a semiconductor device 10 of one embodiment of the present invention. The semiconductor device 10 includes a pixel portion 20, a driver circuit 30, an analog/digital conversion circuit 40 (hereinafter also referred to as an A/D conversion circuit 40), a driver circuit 50, an analog processing circuit 60, and a control circuit 70. The semiconductor device 10 has a function of performing imaging. Therefore, the semiconductor device 10 can also be referred to as an imaging device 10.

The pixel portion 20 is a circuit including a plurality of pixels 21. Here, the pixel portion 20 includes the pixels 21 arranged in N rows and M columns (each of N and M is a natural number). The pixel 21 has a function of converting irradiation light into an electrical signal. Specifically, irradiation light of a photoelectric conversion element provided in each pixel 21 is converted into an electrical signal. Accordingly, the pixel 21 can be used as a photodetector circuit in the imaging device. Hereinafter, an electrical signal obtained by conversion of light with which the pixel 21 is irradiated is also referred to as imaging data.

Note that a pixel 21 receiving red light, a pixel 21 receiving green light, and a pixel 21 receiving blue light each of which generates imaging data may be provided in the pixel portion 20. The imaging data are synthesized with each other to generate full-color image data. Instead of or in addition to these pixels 21, a pixel 21 receiving light exhibiting one or more of cyan, magenta, and yellow may be provided, in which case the number of reproducible colors in an image, which is displayed on the basis of image data generated by the pixels 21, can be increased. For example, by providing a color filter, which transmits light of a particular color in a pixel 21 and letting light enter the pixel 21 through the color filter, the imaging data in accordance with the intensity of light of a particular color can be generated. Note that light detected in the pixel 21 can be visible or invisible.

The pixel 21 can also be provided with a cooling unit, which suppresses occurrence of noise due to heat.

The imaging element included in the pixel 21 can be a photoelectric conversion element using the photovoltaic effect, such as a photodiode, a photoelectric conversion element which uses the photoconductive effect and is formed using a semiconductor including selenium (a selenium-based semiconductor), or the like.

In the case where the pixel 21 includes a transistor, it is preferable to use a transistor including an oxide semiconductor in a channel formation region (hereinafter also referred to as an OS transistor) as the transistor. An oxide semiconductor has a wider band gap and a lower carrier density than other semiconductors such as silicon. Thus, the off-state current of the OS transistor is extremely low. Accordingly, with the use of an OS transistor in the pixel 21, charge retained in the pixel 21 can be retained for a long time and thus imaging data can be retained in the pixel 21 for a long time.

Note that a transistor that can be used in the pixel 21 is not limited to an OS transistor. For example, a transistor whose channel formation region is formed in part of a substrate including a single crystal semiconductor (the transistor is hereinafter also referred to as a single crystal transistor) may be used. As the substrate including a single crystal semiconductor, a single crystal silicon substrate, a single crystal germanium substrate, or the like can be given. The single crystal transistor can perform high-speed operation. The use of the single crystal transistor in the pixel 21 allows the pixel 21 to perform operation such as imaging at higher speed.

A transistor whose channel formation region is formed in a film including a semiconductor other than an oxide semiconductor can also be used in the pixel 21. Examples of a semiconductor other than an oxide semiconductor include silicon, germanium, silicon germanium, silicon carbide, gallium arsenide, aluminum gallium arsenide, indium phosphide, gallium nitride, and an organic semiconductor. A semiconductor other than an oxide semiconductor may be a non-single-crystal semiconductor. Examples of the non-single-crystal semiconductor include an amorphous semiconductor, a microcrystalline semiconductor, and a polycrystalline semiconductor.

The pixel 21 in one embodiment of the present invention has a function of obtaining data corresponding to a difference between imaging data in one frame period and imaging data in another frame period (hereinafter, this data is also referred to as difference data) and retaining the difference data, in addition to a function of obtaining imaging data. Therefore, the pixel 21 can obtain and retain difference data between imaging data of a reference frame and that of the present frame.

Here, in taking a moving image or in continuous shooting, a difference between imaging data of the reference frame and that of the present frame is obtained, whereby time compression of the imaging data can be performed. Specifically, the imaging data of the reference frame and the imaging data of the present frame are compared with each other, and only the difference between them is used as data, whereby the imaging data can be compressed. Such time compression is also referred to as inter-frame compression.

Difference data obtained in the pixel 21 can be used as compressed data of imaging data obtained by taking a moving image or in continuous shooting. That is, inter-frame compression can be performed in the pixel portion 20. A specific circuit configuration and the detail of operation of the pixel 21 having a function of obtaining and retaining difference data are described in Embodiment 5.

The driver circuit 30 is a circuit having a function of selecting pixels 21 in a specific row. The driver circuit 30 selects pixels 21 in a specific row which obtain and output imaging data. Specifically, the driver circuit 30 has a function of outputting a signal for selecting a specific row to a wiring connected to pixels 21 in the specific row (hereinafter, the signal is also referred to as a selection signal). Note that the driver circuit 30 may have a function of supplying a reset signal to the pixels 21. The driver circuit 30 can be formed using a decoder or the like.

Pixels 21 in rows are sequentially selected by the driver circuit 30, and imaging data is obtained in pixels 21 in a selected row, whereby imaging can be performed. Pixels 21 in rows are sequentially selected by the driver circuit 30, and difference data is obtained from pixels 21 in a selected row, whereby imaging data obtained by taking a moving image or in continuous shooting can be compressed.

The A/D conversion circuit 40 has a function of converting an analog signal into a digital signal. Specifically, the A/D conversion circuit 40 has a function of converting imaging data or difference data input from the pixel 21 into digital data and outputting the digital data to the driver circuit 50. Accordingly, the A/D conversion circuit 40 can convert difference data into a digital signal and output the digital signal as compressed data.

The driver circuit 50 has a function of controlling output of imaging data or difference data obtained in the pixel portion 20 to the outside. Specifically, the driver circuit 50 is connected to the pixels 21 through the A/D conversion circuit 40 and has a function of outputting, as a signal DOUT, imaging data or difference data which is output from predetermined pixels 21 and converted into digital data by the A/D conversion circuit 40 to the outside. Accordingly, the driver circuit 50 can control output of compressed data input from the A/D conversion circuit 40 to the outside.

Note that the driver circuit 50 may have a function of precharging a wiring connected to the pixels 21 to a predetermined potential. Alternatively, when the driver circuit 50 is configured to have the function of the A/D conversion circuit 40, the A/D conversion circuit 40 can be omitted.

The analog processing circuit 60 includes a current adder-subtractor circuit 61 and a current correction circuit 62. The analog processing circuit 60 has a function of processing imaging data or difference data which is analog data input from the pixels 21. Specifically, the analog processing circuit 60 has a function of determining whether or not there is a change in difference data input from the pixels 21 and outputting the determination result as a signal AOUT.

The current adder-subtractor circuit 61 includes a constant current source, and has a function of making constant current (reference current) flow in the current adder-subtractor circuit 61. Current which flows in the current adder-subtractor circuit 61 when predetermined data obtained in the pixels 21 in a predetermined frame period is input to the current adder-subtractor circuit 61 can be used as reference current. Hereinafter, a frame in which reference current is set is also referred to as the reference frame.

Current corresponding to imaging data or difference data input from the pixels 21 flows in the current adder-subtractor circuit 61. Here, in the case where there is no difference between imaging data of the reference frame and imaging data of the present frame (in the case where the difference is zero), even when difference data is input to the current adder-subtractor circuit 61 in the present frame, current flowing in the current adder-subtractor circuit 61 remains at the reference current. In the case where there is a difference between imaging data of the reference frame and imaging data of the present frame (in the case where the difference is positive or negative), current flowing in the current adder-subtractor circuit 61 is changed from the reference current. The difference between current flowing in the current adder-subtractor circuit 61 and the reference current is also referred to as differential current.

The current correction circuit 62 has a function of correcting current flowing in the current adder-subtractor circuit 61. Specifically, in the case where a differential current is generated in the current adder-subtractor circuit 61, the current correction circuit 62 has a function of correcting current flowing in the current adder-subtractor circuit 61 to the reference current (correcting the difference current). In the case where difference data is input from the pixels 21 to the current adder-subtractor circuit 61 and current flowing in the current adder-subtractor circuit 61 is reduced from the reference current $I_0$ by current $I_1$, for example, the current $I_1$ flows from the current correction circuit 62 to the current adder-subtractor circuit 61, so that the current flowing in the current adder-subtractor circuit 61 is corrected to the reference current $I_0$. In the case where difference data is input from the pixels 21 to the current adder-subtractor circuit 61 and the current flowing in the current adder-subtractor circuit 61 is increased from the reference current $I_0$ by current $I_2$, for example, the current $I_2$ flows from the current adder-subtractor circuit 61 to the current correction circuit 62, so that the current flowing in the current adder-subtractor circuit 61 is corrected to the reference current $I_0$.

The current correction circuit 62 has a function of determining whether or not there is a difference between imaging data of the reference frame and imaging data of the present frame by sensing differential current and outputting the determination result as a signal AOUT. In the case where the current correction circuit 62 determines that there is a difference, the A/D conversion circuit 40 and the driver circuit 50 are driven, difference data is obtained from the pixels 21, and the difference data is transmitted as the signal DOUT to the outside. The signal DOUT at this time corresponds to compressed data in which inter-frame compression has been performed on imaging data. In contrast, in the case where the current correction circuit 62 determines that there is no difference, difference data is not obtained from the pixels 21, and a signal showing that there is no difference between imaging data may be output as the signal DOUT. That is, power may be supplied to the A/D conversion circuit 40 and the driver circuit 50 only when there is a change in an image, and current supply to the A/D conversion circuit 40 or the driver circuit 50 can be stopped in a period during which there is no change in an image. Thus, power consumption of the semiconductor device 10 can be reduced.

FIG. 1 illustrates, as an example, a configuration in which a high power supply potential VDD1 is supplied to the A/D conversion circuit 40 and a high power supply potential VDD2 is supplied to the driver circuit 50. Power supply can be stopped by stopping supply of these power supply potentials. Stop of power supply may be performed on one or both of the A/D conversion circuit 40 and the driver circuit 50. Note that the A/D conversion circuit 40 which converts analog data into digital data consumes a particularly large amount of power. Accordingly, particularly when power supply to the A/D conversion circuit 40 is stopped, power consumption of the semiconductor device 10 can be effectively suppressed.

Whether or not power is supplied to the A/D conversion circuit 40 and the driver circuit 50 can be determined by the signal AOUT. Specifically, in the case where a change in difference data is sensed in the current correction circuit 62 and a predetermined signal (e.g. a high-level signal) is output as the signal AOUT, the power supply potentials are supplied to the A/D conversion circuit 40 and the driver circuit 50. In contrast, in the case where no change in difference data is sensed in the current correction circuit 62 and a predetermined signal (e.g. a low-level signal) is output as the signal AOUT, supply of the power supply potentials to the A/D conversion circuit 40 and the driver circuit 50 is stopped.

The control circuit 70 has a function of outputting a signal for controlling the current adder-subtractor circuit 61 and the current correction circuit 62.

As described above, in one embodiment of the present invention, difference data is obtained in the pixels 21, whereby imaging data obtained by taking a moving image or in continuous shooting can be compressed in the pixel portion 20. Therefore, a circuit for compressing data does not need to be provided, leading to a reduction in area and power consumption of the semiconductor device 10. Furthermore, in one embodiment of the present invention, power supply to the A/D conversion circuit 40 or the driver circuit 50 can be stopped in a period during which there is no difference between imaging data. Accordingly, power consumption of the semiconductor device 10 can be reduced.

<Operation Example of Semiconductor Device>

Figure 2:
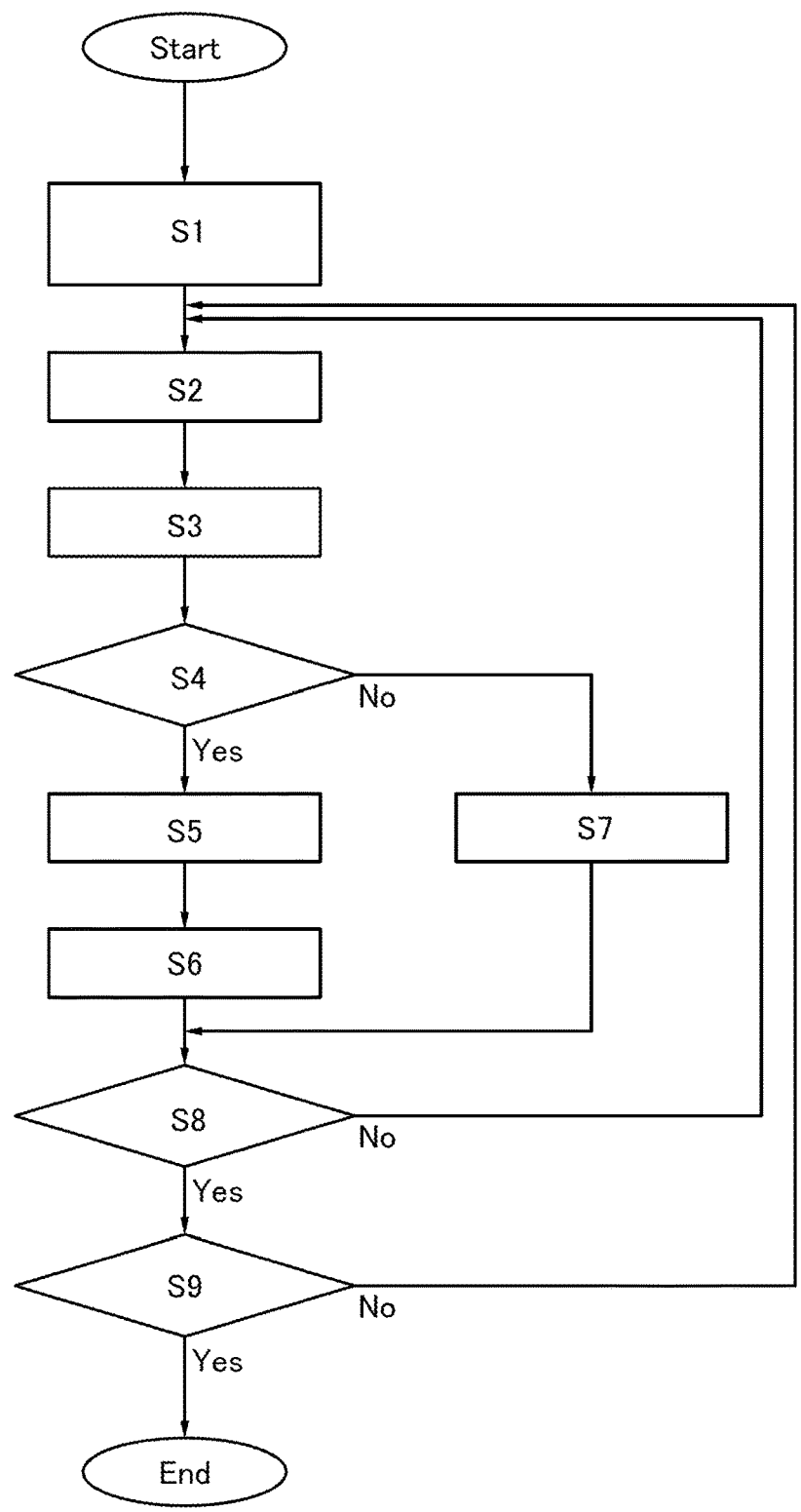
FIG. 2 is a flow chart.

Next, an operation example of the semiconductor device 10 of one embodiment of the present invention is described with reference to a flow chart shown in FIG. 2.

First, imaging is performed in a first frame period, and imaging data is obtained in the pixels 21. In the first frame period, data used as a reference when difference data is obtained in another frame period (hereinafter, the data is also referred to as reference data) is obtained. Note that the reference data is also data corresponding to a state in which there is no difference between imaging data of the reference frame and imaging data of another frame.

Then, the reference data is input from the pixels 21 to the current adder-subtractor circuit 61, and first current corresponding to the reference data flows in the current adder-subtractor circuit 61. The first current corresponds to the reference current (Step 1). The first frame in which the reference current is set corresponds to the reference frame.

Next, imaging is performed in a second frame period after the first frame period, and difference data between imaging data of the first frame and imaging data of the second frame is obtained in the pixels 21 (Step S2). Then, the difference data is input from the pixels 21 to the current adder-subtractor circuit 61, and second current corresponding to the difference data flows in the current adder-subtractor circuit 61. After that, in the analog processing circuit 60, the first current (the reference current) and the second current are compared with each other, and whether or not there is a change in an image between the first frame and the second frame is determined (Step S3).

In the case where there is a change in the image between the first frame (the reference frame) and the second frame (in the case of "Yes" in Step S4), a predetermined signal (e.g. a high-level signal) is output as the signal AOUT from the current correction circuit 62, and power is supplied to the A/D conversion circuit 40 and the driver circuit 50 (Step S5). Then, the difference data obtained in the pixels 21 is read and output as the signal DOUT from the driver circuit 50 to the outside.

Here, the difference data obtained in the second frame period is data including information on a change in the image between the first frame and the second frame. Accordingly, the difference data corresponds to compressed data in which inter-frame compression has been performed on imaging data. Thus, compressed data is output as the signal DOUT in Step S6.

In the case where there is no change in the image between the first frame (the reference frame) and the second frame (in the case of "No" in Step S4), a predetermined signal (e.g. a low-level signal) is output as the signal AOUT from the current correction circuit 62, and power supply to the A/D conversion circuit 40 and the driver circuit 50 is stopped (Step S7). Thus, power consumption in the A/D conversion circuit 40 or the driver circuit 50 can be reduced in a period during which there is no change in an image in taking a moving image or in continuous shooting. In this case, a signal (e.g. a low-level signal) corresponding to a state where there is no change in the image may be output as the signal DOUT.

After that, whether or not the second frame period is terminated is determined. In the case where the second frame period is not terminated (in the case of "No" in Step S8), the operation from Step S2 is performed in the pixels 21 in a next row. In the case where the second frame period is terminated (in the case of "Yes" in Step S8), whether or not imaging is terminated is determined. In the case where the imaging is terminated (in the case of "Yes" in Step S9), the operation of the semiconductor device 10 is terminated. In the case where the imaging is continued (in the case of "No" in Step S9), difference data is obtained in a third frame period after the second frame period.

Note that in frame periods after the third frame period, the operation of Step S1 may be performed as appropriate to obtain reference data and set reference current every predetermined number of frames. This operation is preferably performed in a frame or the like where there is a large change in imaging data.

As described above, in one embodiment of the present invention, imaging data can be compressed in the pixel portion 20. Furthermore, power supply to the A/D conversion circuit 40 or the driver circuit 50 can be stopped in a period during which an image is not changed.

Figure 3:
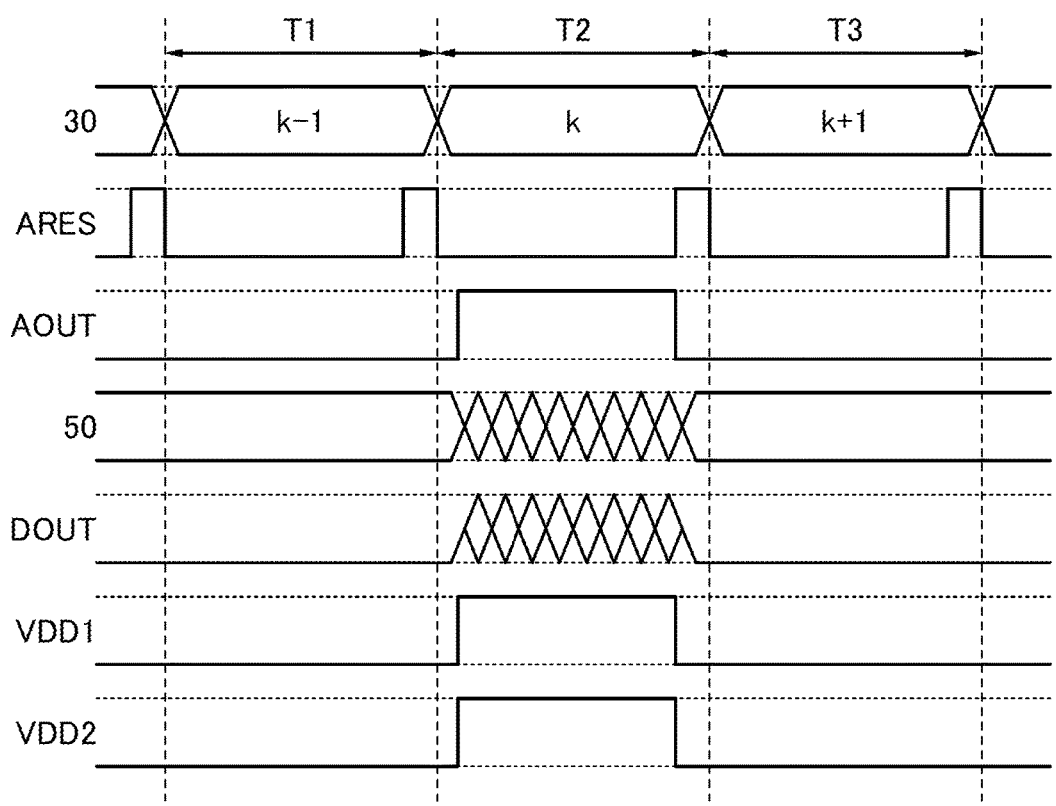
FIG. 3 is a timing diagram.

Next, a specific operation example of each circuit included in the semiconductor device 10 in the above operation is described with reference to a timing chart shown in FIG. 3.

The analog processing circuit 60 obtains difference data for every row of the pixels 21 selected by the driver circuit 30 and determines whether an image is changed or not. When a change in the image is sensed in an arbitrary row, a predetermined signal (e.g. a high-level signal) corresponding to a state in which there is a change in an image is output as the signal AOUT. Thus, power is supplied to the A/D conversion circuit 40 and the driver circuit 50, and the difference data is output as the signal DOUT. The operation at this time is described below. Note that in FIG. 3, the reference numeral 30 represents operation of the driver circuit 30, "ARES" represents a signal for resetting the signal AOUT output from the analog processing circuit 60, and the reference numeral 50 represents operation of the driver circuit 50.

First, in a period T1, the pixels 21 in a k−1-th row (k is an integer greater than or equal to 2 and less than or equal to N−1) are selected by the driver circuit 30, and difference data is obtained in the pixels 21 in the k−1-th row. Here, a case where there is no difference between imaging data of the reference frame and imaging data of the present frame is shown. In this case, the signal AOUT remains at a low level, and supply of the high power supply potentials VDD1 and VDD2 is stopped. Then, the operation of the driver circuit 50 is stopped, and the signal DOUT is set at a low level.

Next, in a period T2, the pixels 21 in a k-th row are selected by the driver circuit 30, and difference data is obtained in the pixels 21 in the k-th row. Here, a case where there is a difference between imaging data of the reference frame and imaging data of the present frame is shown. When a difference between the image data is sensed, the signal AOUT is set at a high level. Thus, the high power supply potentials VDD1 and VDD2 are supplied to the A/D conversion circuit 40 and the driver circuit 50, respectively. Then, the A/D conversion circuit 40 and the driver circuit 50 are operated, the difference data is read from the pixels 21 and output as the signal DOUT. The difference data corresponds to data in which inter-frame compression has been performed on imaging data in the pixels 21. After that, the signal ARES is set at a high level, and thus the signal AOUT is reset to a low level.

Next, in a period T3, the pixels 21 in a k+1-th row are selected by the driver circuit 30, and difference data is obtained in the pixels 21 in the k+1-th row. Here, a case where there is no difference between imaging data of the reference frame and imaging data of the present frame is shown. In this case, the signal AOUT remains at a low level, and supply of the high power supply potentials VDD1 and VDD2 is stopped. Then, the operation of the driver circuit 50 is stopped, and the signal DOUT is set at a low level.

Through the above operation, in a period during which there is a change in an image, compressed data can be output, and in a period during which there is no change in an image, power supply to the A/D conversion circuit 40 or the driver circuit 50 can be stopped.

As described above, in one embodiment of the present invention, difference data is obtained in the pixels 21, whereby imaging data obtained by taking a moving image or in continuous shooting can be compressed in the pixel portion 20. Therefore, a circuit for compressing data does not need to be provided, leading to a reduction in area and power consumption of the semiconductor device 10. Furthermore, in one embodiment of the present invention, power supply to the A/D conversion circuit 40 or the driver circuit 50 can be stopped in a period during which there is no difference between imaging data. Accordingly, power consumption of the semiconductor device 10 can be reduced.

Note that both compression of imaging data in the pixel portion 20 and stop of power supply to the A/D conversion circuit 40 or the driver circuit 50 are performed in this embodiment; however, both the compression of the imaging data and the stop of the power supply are not necessarily performed. For example, the semiconductor device 10 can have a structure in which power is constantly supplied to the A/D conversion circuit 40 and the driver circuit 50 in a period during which difference data is obtained in the pixel portion 20 (data is compressed).

This embodiment can be combined with any of the other embodiments as appropriate.

Embodiment 2

In this embodiment, a specific configuration example of each circuit included in a semiconductor device of one embodiment of the present invention is described.

<Configuration Example of Analog Processing Circuit>

Figure 4:
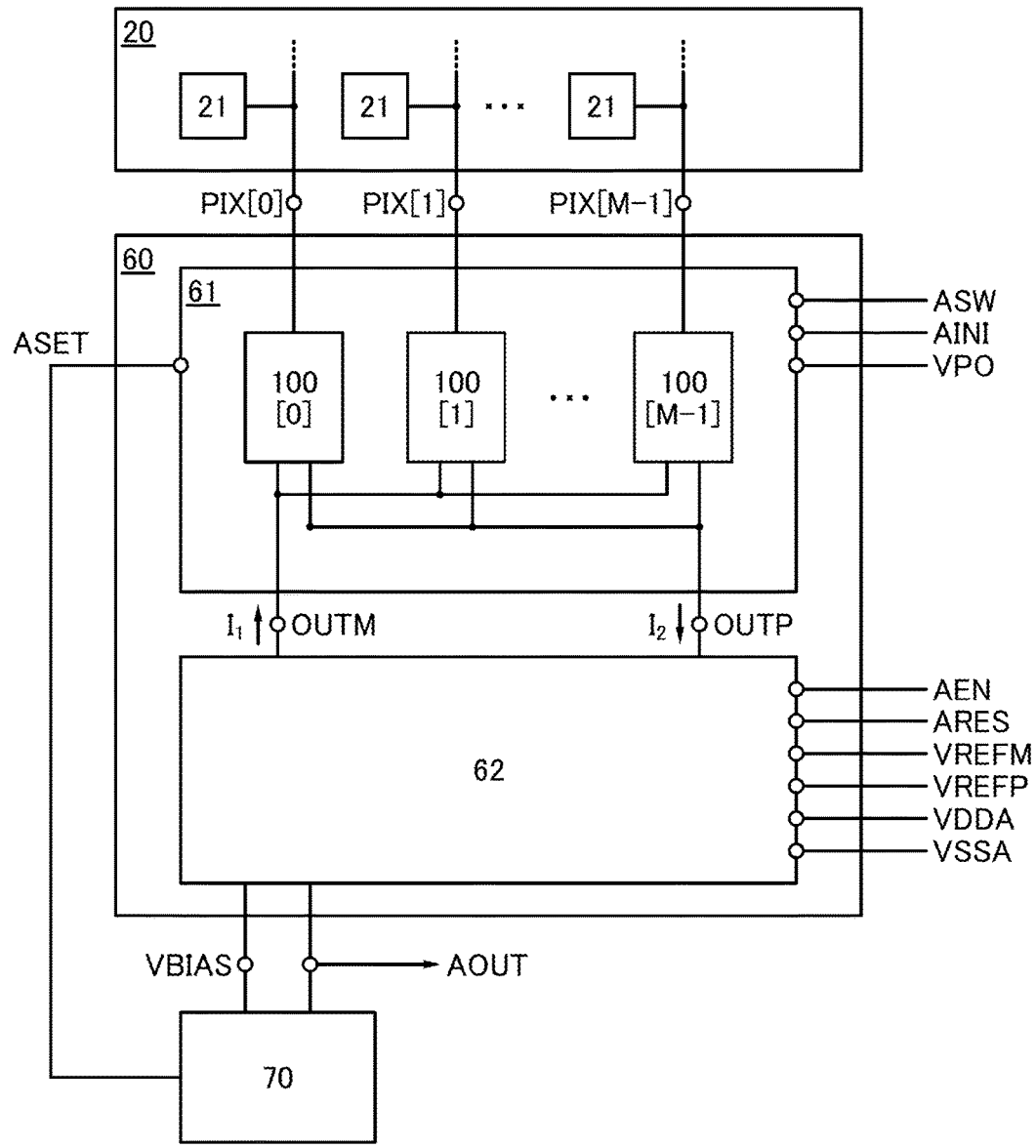
FIG. 4 is a view illustrating one embodiment of the present invention.

FIG. 4 illustrates a configuration example of the analog processing circuit 60, the pixel portion 20 connected to the analog processing circuit 60, and the control circuit 70 connected to the analog processing circuit 60. The pixel portion 20 includes the pixels 21 in M columns which are connected to the analog processing circuit 60.

The current adder-subtractor circuit 61 includes a plurality of constant current circuits 100. Here, the current adder-subtractor circuit 61 includes M constant current circuits 100[0] to 100[M−1] which are connected to the pixels 21 in the corresponding columns.

The constant current circuits 100[0] to 100[M−1] are connected to terminals PIX, a terminal OUTM, and a terminal OUTP. Each of the constant current circuits 100[0] to 100[M−1] is connected to the pixels 21 in the same column through the terminal PIX in the same column. Current corresponding to reference data or difference data input from the pixels 21 flows in the constant current circuits 100[0] to 100[M−1]. The current $I_1$ for correcting current flowing in the constant current circuits 100[0] to 100[M−1] to the reference current flows in the terminal OUTM in the case where the amount of current flowing in each of the constant current circuits 100[0] to 100[M−1] is smaller than the reference current set in each column. The current $I_2$ for correcting current flowing in the constant current circuits 100[0] to 100[M−1] to the reference current flows in the terminal OUTP in the case where the amount of current flowing in each of the constant current circuits 100[0] to 100[M−1] is larger than the reference current set in each column.

A signal ASET, a signal ASW, a signal AINI, and a signal VPO are supplied to the constant current circuits 100[0] to 100[M−1]. The signal ASET is a signal for controlling input of reference data or difference data to the constant current circuits 100[0] to 100[M−1] and input from the control circuit 70. The signal ASW is a signal for controlling correction of differential current. The signal AINI is a signal for controlling setting of reference current. The signal VPO is a power supply potential supplied to the constant current circuits 100[0] to 100[M−1].

The current correction circuit 62 has a function of supplying the current $I_1$ or $I_2$ for correcting current flowing in the constant current circuits 100[0] to 100[M−1] to the reference current set in each column to the terminal OUTM or OUTP in the case where the amount of current flowing in the constant current circuits 100[0] to 100[M−1] is different from that of the reference current. Furthermore, the current correction circuit 62 has a function of outputting a predetermined signal as the signal AOUT in the case where the amount of current flowing in the constant current circuits 100[0] to 100[M−1] is changed from the reference current set in each column.

The current correction circuit 62 is supplied with a signal VBIAS, a signal AEN, the signal ARES, a signal VREFM, a signal VREFP, a signal VDDA, and a signal VSSA. The signal VBIAS is a signal for controlling the operation of the current correction circuit 62 and input from the control circuit 70. The signals AEN and ARES are each a signal for controlling output of the signal AOUT. The signals VREFM and VREFP are each a reference potential used for correction of differential current. The signal VDDA is a high power supply potential used for driving of the current correction circuit 62. The signal VSSA is a low power supply potential used for driving of the current correction circuit 62.

More specific configuration examples of the current adder-subtractor circuit 61 and the current correction circuit 62 are described below.

(Configuration Example of Current Adder-Subtractor Circuit)

Figure 5:
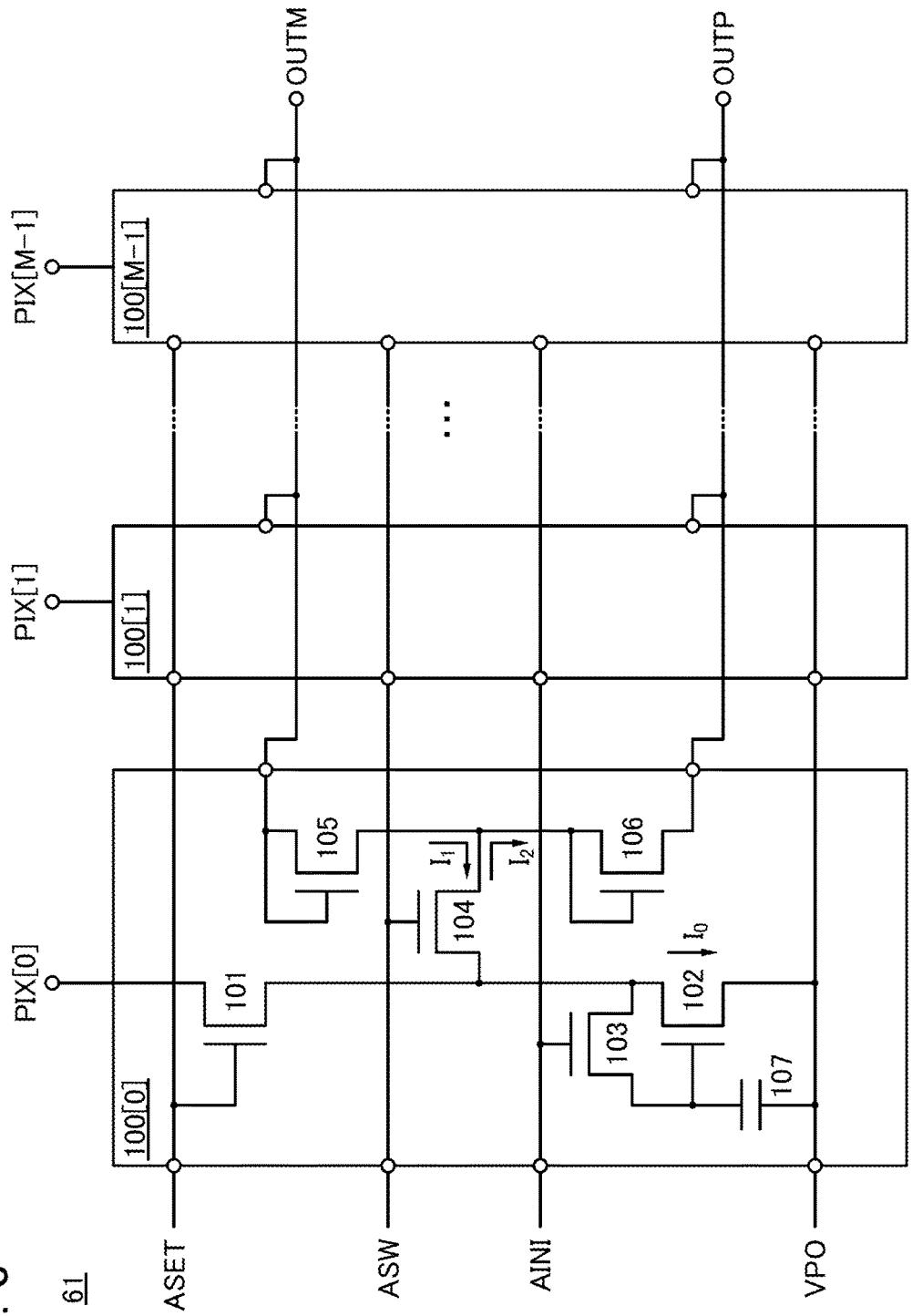
FIG. 5 is a circuit diagram illustrating one embodiment of the present invention.

FIG. 5 illustrates a configuration example of the current adder-subtractor circuit 61. The current adder-subtractor circuit 61 includes M constant current circuits 100[0] to 100[M−1] as described above.

The constant current circuits 100[0] to 100[M−1] each include a transistor 101, a transistor 102, a transistor 103, a transistor 104, a transistor 105, a transistor 106, and a capacitor 107. The transistors 101 to 106 are n-channel transistors here but may be p-channel transistors. Note that although connection relations of the transistors and the capacitor in the constant current circuit 100[0] are particularly illustrated in FIG. 5, the constant current circuits 100[1] to 100[M−1] can each have the same configuration as the constant current circuit 100[0].

A gate of the transistor 101 is connected to a terminal supplied with the signal ASET, one of a source and a drain of the transistor 101 is connected to the terminal PIX, the other of the source and the drain of the transistor 101 is connected to one of a source and a drain of the transistor 102, one of a source and a drain of the transistor 103, and one of a source and a drain of the transistor 104. A gate of the transistor 102 is connected to the other of the source and the drain of the transistor 103 and one electrode of the capacitor 107, and the other of the source and the drain of the transistor 102 is connected to a terminal supplied with the signal VPO. A gate of the transistor 103 is connected to a terminal supplied with the signal AINI. A gate of the transistor 104 is connected to a terminal supplied with the signal ASW, the other of the source and the drain of the transistor 104 is connected to one of a source and a drain of the transistor 105, a gate of the transistor 106, and one of a source and a drain of the transistor 106. The other of the source and the drain of the transistor 105 is connected to a gate of the transistor 105 and the terminal OUTM. The other of the source and the drain of the transistor 106 is connected to the terminal OUTP. The other electrode of the capacitor 107 is connected to a terminal supplied with the signal VPO.

Note that a source of a transistor in this specification and the like means a source region that is part of a semiconductor layer functioning as an active layer, a source electrode connected to the semiconductor layer, or the like. Similarly, a "drain" of a transistor means a drain region that is part of the semiconductor layer, a drain electrode connected to the semiconductor layer, or the like. A gate of a transistor means a gate electrode or the like.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. Furthermore, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Next, an example of operation of the constant current circuit 100 is described. Note that operation of the constant current circuit 100[0] which senses difference in the pixels in a first column is described below for easy understanding. Although whether or not there is a difference between imaging data can also be sensed in the constant current circuits 100[1] to 100[M−1] as in the constant current circuit 100[0], a case where there is no difference between imaging data in the pixels in the columns other than the first column is described as an example here.

First, reference current is set in the constant current circuit 100[0]. After reference data is obtained in the pixels 21 in a reference frame period, the signal ASET is set at a high level, the signal ASW is set at a low level, and the signal AINI is set at a high level. Thus, current corresponding to the reference data input from the pixels 21 in the first column flows in the constant current circuit 100[0]. This current is the reference current $I_0$. Note that the reference current also flows in the constant current circuits 100[1] to 100[M−1] as in the constant current circuit 100[0].

A potential of the one of the source and the drain of the transistor 102 is supplied to the gate of the transistor 102 and the one electrode of the capacitor 107 through the transistor 103. This potential is a potential for making the reference current $I_0$ flow in the transistor 102. Through such operation, the reference current $I_0$ is set in the constant current circuit 100[0]. Note that the potential of the gate of the transistor 102 and the one electrode of the capacitor 107 is retained by turning off the transistor 103.

Next, operation in the case where there is no difference between imaging data of the reference frame and imaging data of the present frame is described. After difference data is obtained in the pixels 21 in each column in a frame period after setting of the reference current, the signal ASET and the signal ASW are set at a high level, and the signal AINI is set at a low level. At this time, current corresponding to the difference data input from the pixels 21 in each column flows in the constant current circuits 100[0] to 100[M−1] through the respective transistors 101. Here, in the case where there is no difference between imaging data of the reference frame and imaging data of the present frame in the pixels 21 in the first column, difference data input to the constant current circuit 100[0] in the present frame period is not changed from the reference data input in the reference frame period, and thus current flowing in the transistor 102 is not changed from the reference current $I_0$. Similarly, current flowing in the constant current circuits 100[1] to 100[M−1] are not changed from the reference current. Therefore, current flowing from the terminal OUTM to the transistor 104 through the transistor 105 and current flowing from the transistor 104 to the terminal OUTP through the transistor 106 are not generated.

Next, operation in the case where there is a difference between imaging data of the reference frame and imaging data of the present frame is described. After difference data is obtained in the pixels 21 in each column in a frame period after setting of the reference current, the signal ASET and the signal ASW are set at a high level, and the signal AINI is set at a low level. At this time, current corresponding to the difference data input from the pixels 21 in each column flows in the constant current circuits 100[0] to 100[M−1] through the respective transistors 101. Here, in the case where there is a difference between imaging data of the reference frame and imaging data of the present frame in the pixels 21 in the first column, difference data input to the constant current circuit 100[0] in the present frame period is changed from the reference data input in the reference frame period, and thus current flowing in the transistor 101 is changed from the reference current $I_0$. Here, in the constant current circuits 100[1] to 100[M−1], there is no difference between imaging data of the reference frame and imaging data of the present frame, and current flowing in the respective transistors 101 is not changed from the reference current. Thus, current flowing from the terminal OUTM to the transistor 104 through the transistor 105 or current flowing from the transistor 104 to the terminal OUTP through the transistor 106 is generated, so that differential current is corrected. As a result, the current flowing in the transistor 102 in the constant current circuit 100[0] is corrected to the reference current $I_0$.

Specifically, when difference data is input from the pixels 21 in the first column and the amount of current flowing in the transistor 102 is reduced to $I_0-I_1$, the current $I_1$ flows from the terminal OUTM to the transistor 104 through the transistor 105, and thus the current flowing in the transistor 102 is corrected to the reference current $I_0$. When difference data is input from the pixels 21 in the first column and the amount of current flowing in the transistor 102 is increased to $I_0+I_2$, the current $I_2$ flows from the transistor 104 to the terminal OUTP through the transistor 106, and thus the current flowing in the transistor 102 is corrected to the reference current $I_0$.

In order to stop the operation of the constant current circuits 100[0] to 100[M−1], the signal ASET, the signal ASW, and the signal AINI are set at a low level. Thus, the current flowing in the transistor 102 can be stopped, and the operation of the constant current circuits 100[0] to 100[M−1] can be stopped.

In the case where the operation of the constant current circuits 100[0] to 100[M−1] is restarted, operation for setting reference current may be performed again. Alternatively, in the case where a potential which is necessary for the reference current flow is retained in the capacitor 107, the signal ASET and the signal ASW may be set at a high level, the signal AINI may be set at a low level, and sensing of a change from the reference data may be restarted.

Through the above operation, the current flowing in the constant current circuits 100[0] to 100[M−1] can be corrected.

<Configuration Example of Current Correction Circuit>

Figure 6:
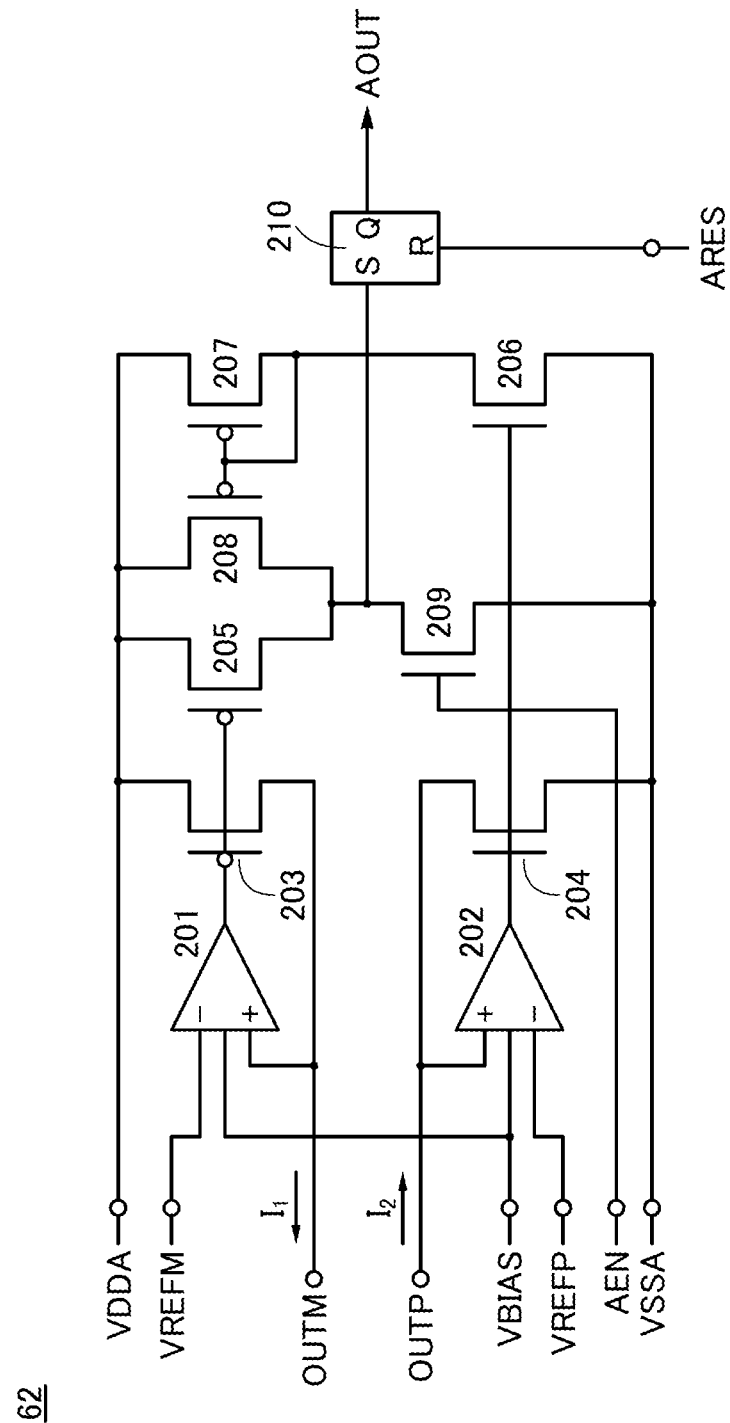
FIG. 6 is a circuit diagram illustrating one embodiment of the present invention.

FIG. 6 shows a configuration example of the current correction circuit 62. The current correction circuit 62 includes a comparator 201, a comparator 202, a transistor 203, a transistor 204, a transistor 205, a transistor 206, a transistor 207, a transistor 208, a transistor 209, and a latch circuit 210. The transistors 203 to 209 are n-channel transistors here but may be p-channel transistors.

A non-inverting input terminal of the comparator 201 is connected to the terminal OUTM, an inverting input terminal of the comparator 201 is connected to a terminal to which the signal VREFM is input, an output terminal of the comparator 201 is connected to a gate of the transistor 203 and a gate of the transistor 205. An non-inverting input terminal of the comparator 202 is connected to the terminal OUTP, an inverting input terminal of the comparator 202 is connected to a terminal to which the signal VREFP is input, an output terminal of the comparator 202 is connected to a gate of the transistor 204 and a gate of the transistor 206. One of a source and a drain of the transistor 203 is connected to the terminal OUTM, and the other of the source and the drain of the transistor 203 is connected to a terminal to which the signal VDDA is input. One of a source and a drain of the transistor 204 is connected to the terminal OUTP, and the other of the source and the drain of the transistor 204 is connected to a terminal to which the signal VSSA is input. One of a source and a drain of the transistor 205 is connected to a first terminal (a set terminal) of the latch circuit 210, and the other of the source and the drain of the transistor 205 is connected to the terminal to which the signal VDDA is input. One of a source and a drain of the transistor 206 is connected to a gate of the transistor 207, a gate of the transistor 208, and one of a source and a drain of the transistor 207, and the other of the source and the drain of the transistor 206 is connected to the terminal to which the signal VSSA is input. The other of the source and the drain of the transistor 207 is connected to the terminal to which the signal VDDA is input. One of a source and a drain of the transistor 208 is connected to the first terminal of the latch circuit 210, the other of the source and the drain of the transistor 208 is connected to the terminal to which the signal VDDA is input. A gate of the transistor 209 is connected to a terminal to which the signal AEN is input, one of a source and a drain of the transistor 209 is connected to the terminal to which the signal VSSA is input, and the other of the source and the drain of the transistor 209 is connected to the first terminal of the latch circuit 210. A second terminal (a reset terminal) of the latch circuit 210 is connected to a terminal to which the signal ARES is input, and the signal AOUT is output to an output terminal of the latch circuit 210. The signal VBIAS is input as a bias voltage to the comparators 201 and 202.

The transistors 207 and 208 form a current mirror circuit. When current flows in the transistors 207 and 208, the signal VDDA is supplied to the latch circuit 210, and thus the signal AOUT is set at a high level. The latch circuit 210 is reset by being supplied with a high-level signal as the signal ARES.

Next, an example of the operation of the current correction circuit 62 is described.

In the case where there is a difference between imaging data of the reference frame and imaging data of the present frame, predetermined current flows in the terminal OUTM or the terminal OUTP in order to correct current flowing in the constant current circuits 100[0] to 100[M−1]. Note that in a period during which the current correction circuit 62 is operated, the signal VBIAS is supplied, so that the comparators 201 and 202 are operated.

First, a case where a difference between imaging data is negative and differential current flows in the terminal OUTM is described.

When a difference between imaging data of the reference frame and imaging data of the present frame is negative and the amount of current flowing in the transistor 102 is reduced from $I_0$ to $I_0-I_1$, the comparator 201 and the transistor 203 are operated to compensate the reduced current, i.e., the current $I_1$, so that the current $I_1$ flows in the terminal OUTM. In the case where the amount of current flowing in the terminal OUTM is smaller than that of the current $I_1$, the potential of the non-inverting input terminal of the comparator 201 is decreased, and thus the output of the comparator 201 is also decreased. Thus, the potential of the gate of the transistor 203 is decreased, and the amount of current flowing in the terminal OUTM is increased, so that the current $I_1$ can flow in the terminal OUTM. In contrast, in the case where the amount of current flowing in the terminal OUTM is larger than that of the current $I_1$, the potential of the non-inverting input terminal of the comparator 201 is increased, and thus the output of the comparator 201 is also increased. Thus, the potential of the gate of the transistor 203 is increased, and the amount of current flowing in the terminal OUTM is decreased, so that the current $I_1$ can flow in the terminal OUTM.

The output of the comparator 201 is also supplied to the gate of the transistor 205. When the current $I_1$ flows in the terminal OUTM, the potential of the gate of the transistor 205 is decreased, and the signal VDDA is supplied to the first terminal of the latch circuit 210 through the transistor 205. Thus, an output signal of the latch circuit 210 is set at a high level and output as the signal AOUT to the outside.

Next, a case where a difference between imaging data is positive and differential current flows in the terminal OUTP is described.

When a difference between imaging data of the reference frame and imaging data of the present frame is positive and the amount of current flowing in the transistor 102 is increased from $I_0$ to $I_0+I_2$, the comparator 202 and the transistor 204 are operated to reduce the increased current, i.e., the current $I_2$, so that the current $I_2$ flows in the terminal OUTP. In the case where the amount of current flowing in the terminal OUTP is smaller than that of the current $I_2$, the potential of the non-inverting input terminal of the comparator 202 is increased, and thus the output of the comparator 202 is also increased. Thus, the potential of the gate of the transistor 204 is increased, and the amount of current flowing in the terminal OUTP is increased, so that the current $I_2$ can flow in the terminal OUTP. In the case where the amount of current flowing in the terminal OUTP is larger than that of the current $I_2$, the potential of the non-inverting input terminal of the comparator 202 is decreased, and thus the output of the comparator 202 is also decreased. Thus, the potential of the gate of the transistor 204 is decreased, and the amount of current flowing in the terminal OUTP is decreased, so that the current $I_2$ can flow in the terminal OUTP.

The output of the comparator 202 is also supplied to the gate of the transistor 206. When the current $I_2$ flows in the terminal OUTP, the potential of the gate of the transistor 206 is increased, and thus the transistor 206 is turned on. Then, the transistor 208 is turned on, and the signal VDDA is supplied to the first terminal of the latch circuit 210 through the transistor 208. Thus, an output signal of the latch circuit 210 is set at a high level and output as the signal AOUT to the outside.

Through the above operation, difference data can be compared for every row of the pixels 21.

In order to stop the operation of the current correction circuit 62, the operation of the comparators 201 and 202 may be stopped by stop of supply of the signal VBIAS.

Figure 7A:
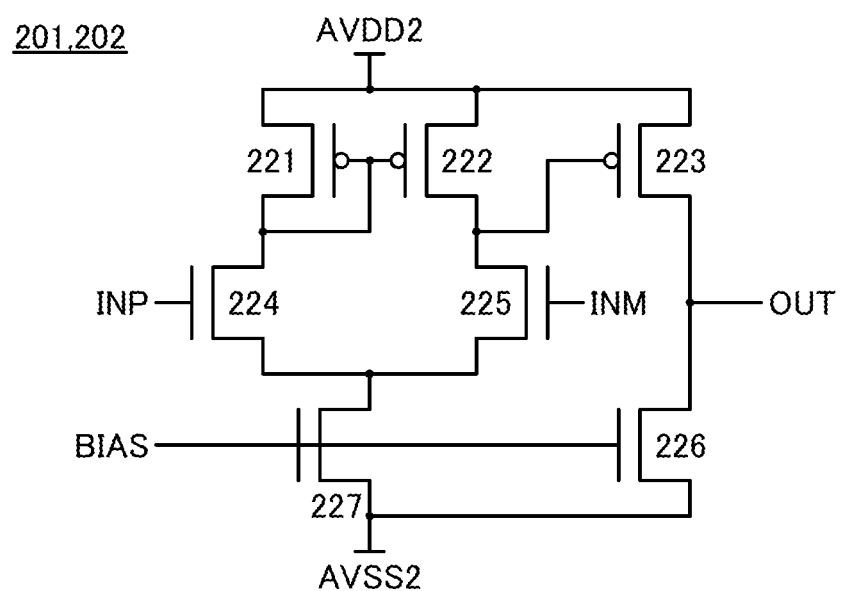
FIGS. 7A and 7B are circuit diagrams illustrating one embodiment of the present invention.

The comparators 201 and 202 can each be formed using a circuit illustrated in FIG. 7A, for example. The comparator illustrated in FIG. 7A includes transistors 221 to 227. Note that a terminal INP corresponds to a non-inverting input terminal of the comparator, and a terminal INM corresponds to an inverting input terminal of the comparator.

Figure 7B:
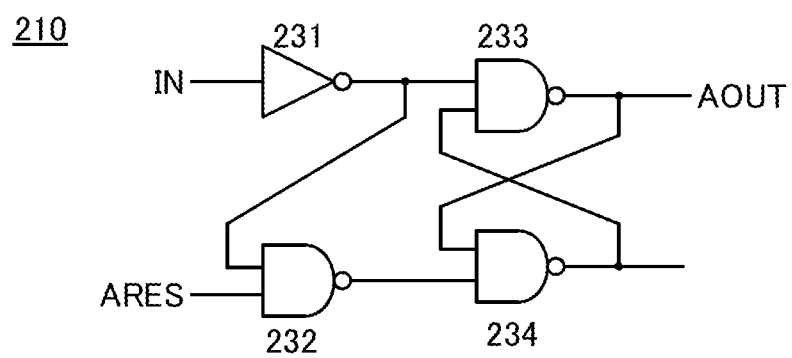

The latch circuit 210 can be formed using a circuit illustrated in FIG. 7B, for example. The latch circuit illustrated in FIG. 7B includes an inverter 231 and NANDs 232 to 234.

<Operation Example of Analog Processing Circuit>

Figure 8:
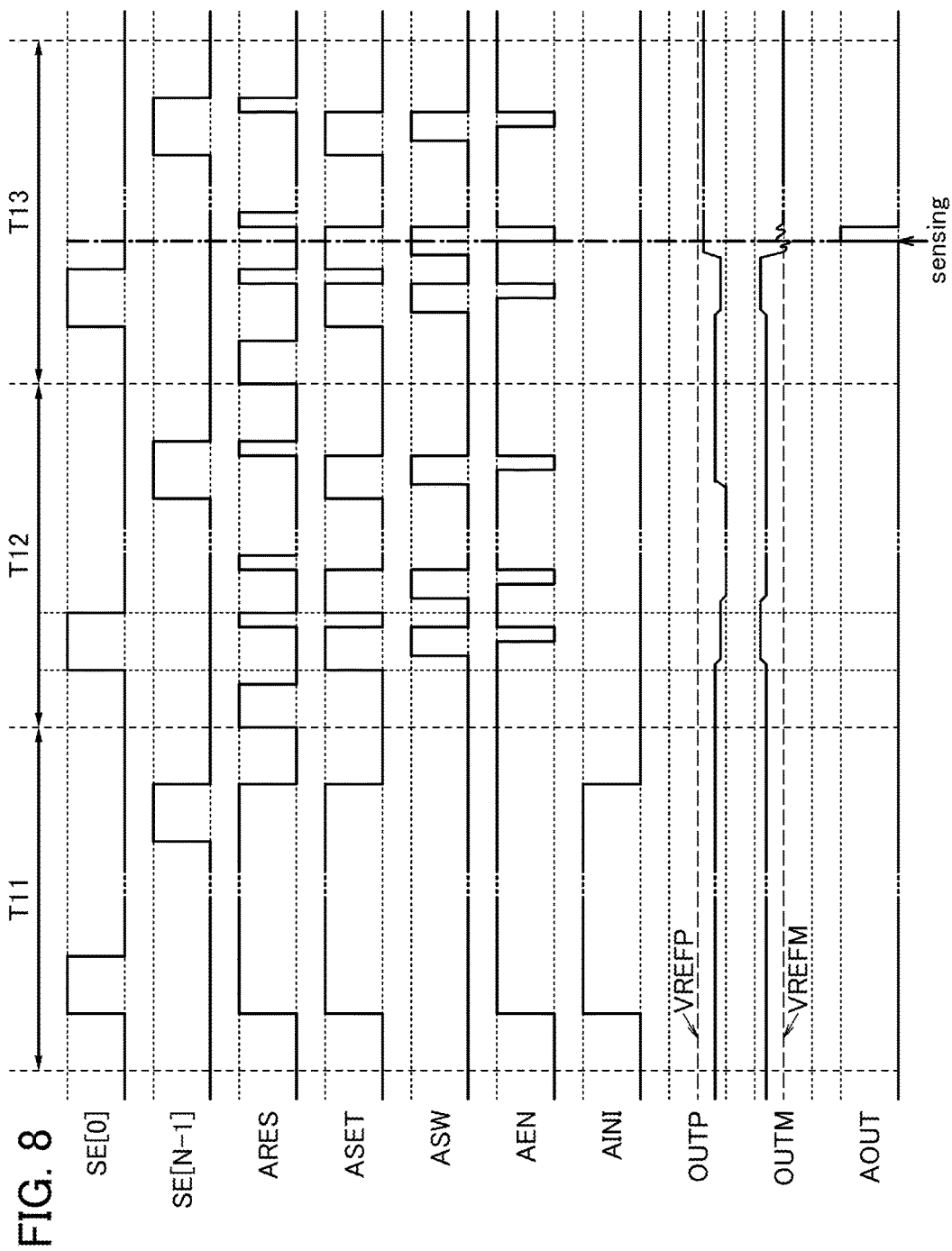
FIG. 8 is a timing chart.

Next, a specific example of operation of the analog processing circuit 60 is described with reference to a timing chart shown in FIG. 8. A period T11 in FIG. 8 corresponds to a reference frame in which reference current is obtained. A period T12 corresponds to a frame in which there is no change in imaging data. A period T13 corresponds to a frame in which there is a change in imaging data. A signal SE is a selection signal for selecting the pixels 21 in a specific row. The signals SE[0] to SE[N−1] correspond to selection signals supplied to the pixels 21 in a first row to an N-th row, respectively. Note that the signals SE[1] to SE[N−2] are omitted in FIG. 8.

First, in the period T11, imaging data and reference data are obtained in the pixels 21. Furthermore, the signal ARES is set at a high level, and thus the latch circuit 210 is reset. The signal AEN is set at a high level, and thus a low-level signal is input to the latch circuit 210. At this time, the signal AOUT is set at a low level. Then, the signal ASET and the signal AINI are set at a high level, and the signals SE[0] to SE[N−1] are sequentially set at a high level, whereby reference data is input from the pixels 21 to the constant current circuits 100[0] to 100[M−1], and reference current is obtained in the constant current circuits 100[0] to 100[M−1]. After that, the signal ARES, the signal ASET, and the signal AINI are set at a low level, and thus the reference frame period is terminated.

Next, imaging data is compared in the period T12. First, the signal SE[0] and the signal ASET are set at a high level, and difference data of the pixels 21 in the first row is input to the constant current circuits 100[0] to 100[M−1]. After that, the signal ASW is set at a high level, and operation for correcting current flowing in the constant current circuits 100[0] to 100[M−1] is performed. Then, the signal AEN is set at a low level, and whether or not current correction has been performed is output as the signal AOUT. Here, there is no change in imaging data in the pixels 21 in the first row, and accordingly, even when difference data is input from the pixels 21 to the constant current circuits 100[0] to 100[M−1], differential current is not generated, and thus the signal AOUT is kept at a low level. After that, the signal ARES is set at a high level, and the latch circuit 210 is reset.

The operation described above is also performed on the pixels 21 in a second row to an N-th row, and imaging data in the pixels 21 in all the rows is compared. Note that since the period T12 is a frame in which there is no change in imaging data, even when difference data is input from the pixels 21 in the second row to the N-th row to the constant current circuits 100[0] to 100[M−1], differential current is not generated, and the signal AOUT is kept at a low level.

Next, imaging data is compared in the period T13 as in the period T12. Here, when a change in imaging data is sensed in a row ("sensing" in FIG. 8), difference data input to the constant current circuit 100 is changed, and thus the current flowing in the constant current circuit 100 is changed from the reference current. Here, a case where difference data is input to the constant current circuit 100[0] and the amount of the current flowing in the constant current circuit 100[0] is decreased from the reference current $I_0$ to $I_0-I_1$ is described as an example.

When a difference between imaging data of the reference frame period and imaging data of the present frame period is negative and the amount of the current flowing in the constant current circuit 100[0] is $I_0-I_1$, the potential of the terminal OUTM is decreased, and the potential of the gate of the transistor 203 is decreased. Thus, the current $I_1$ corresponding to differential current is supplied to the terminal OUTM, and the current flowing in the constant current circuit 100[0] is corrected from $I_0-I_1$ to the reference current $I_0$. When the differential current is corrected, the signal VDDA is supplied to the first terminal of the latch circuit 210 through the transistor 205, and thus an output signal of the latch circuit 210 is set at a high level. The output signal corresponds to the signal AOUT. When the high-level signal AOUT is output, power is supplied to the driver circuit 30 or the A/D conversion circuit 40, and thus difference data is read from the pixels 21. The difference data corresponds to compressed data and is output as the signal DOUT to the outside.

Through the above operation, a change from the reference data can be sensed.

In one embodiment of the present invention, differential current can be sensed and corrected with the above-described analog processing circuit. Thus, power supply to the A/D conversion circuit 40 or the driver circuit 50 can be controlled by whether or not there is a change in imaging data, and power consumption in the semiconductor device 10 can be reduced.

This embodiment can be combined with any of the other embodiments as appropriate.

Embodiment 3

In this embodiment, another configuration example of the analog processing circuit 60 is described.

Figure 9:
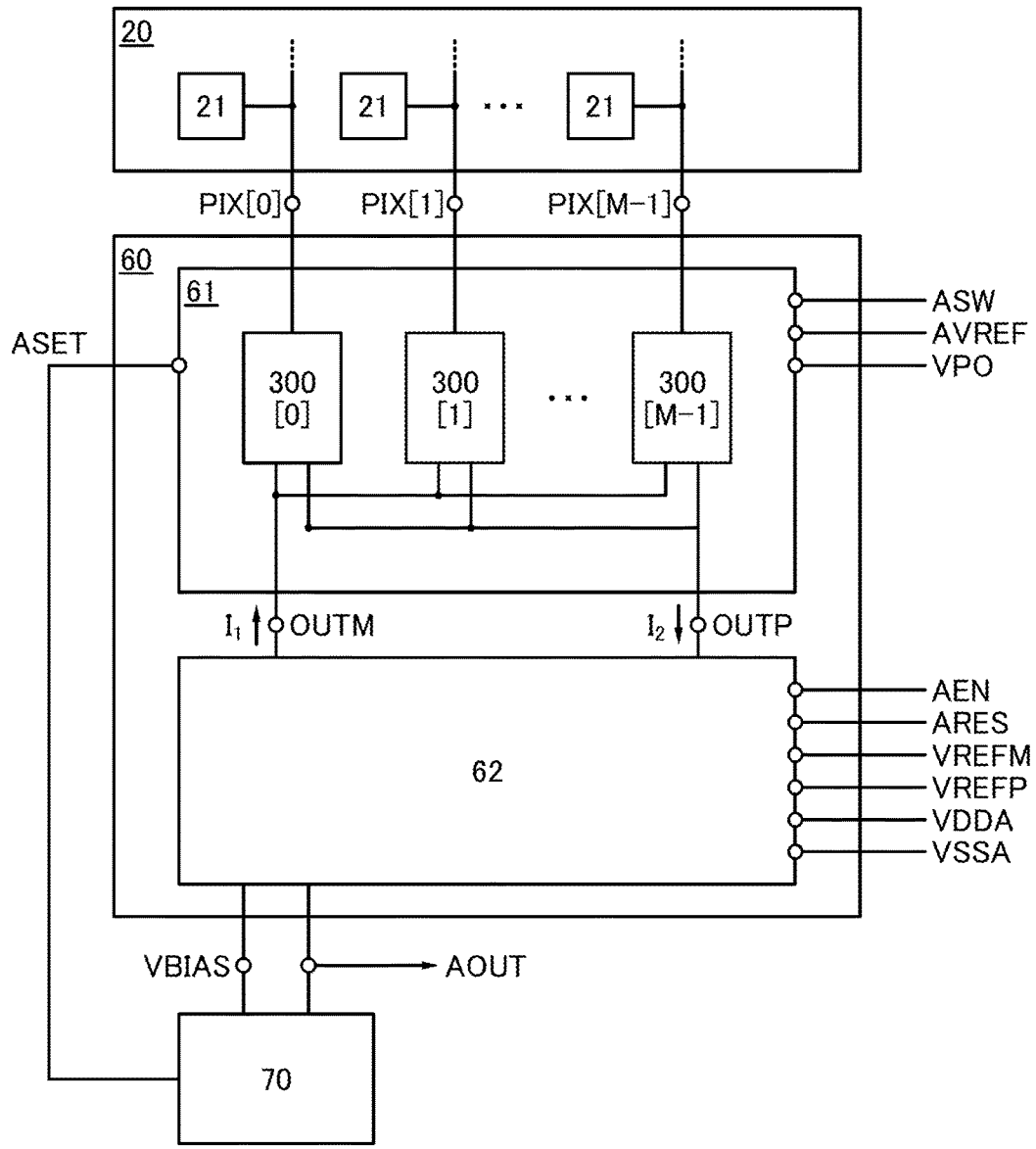
FIG. 9 is a diagram illustrating one embodiment of the present invention.

FIG. 9 illustrates a configuration example of the analog processing circuit 60, the pixel portion 20 connected to the analog processing circuit 60, and the control circuit 70 connected to the analog processing circuit 60. Note that components other than the components described below are the same as those in FIG. 4; therefore, detailed description thereof is omitted.

The analog processing circuit 60 illustrated in FIG. 9 is different from that in FIG. 4 in that a signal AVREF is supplied to the current adder-subtractor circuit 61 and in that constant current circuits 300 which are different from the constant current circuits 100 illustrated in FIG. 4 are provided. Note that the signal AVREF is a reference potential supplied to the current adder-subtractor circuit 61.

Figure 10:
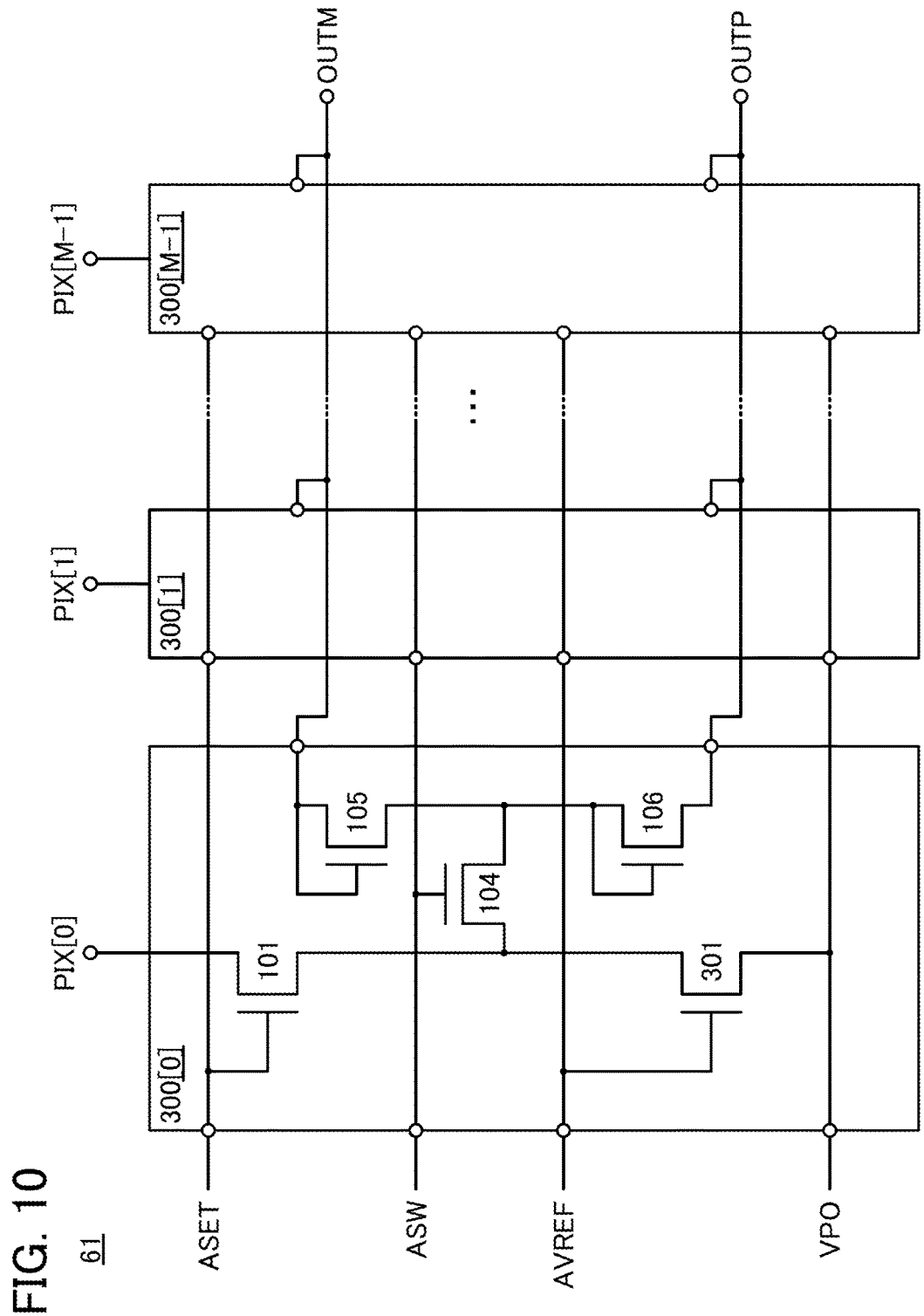
FIG. 10 is a circuit diagram illustrating one embodiment of the present invention.

FIG. 10 illustrates a configuration example of the constant current circuit 300. The constant current circuit 300 includes a transistor 301 instead of the transistors 102 and 103 and the capacitor 107 which are illustrated in FIG. 5. A gate of the transistor 301 is connected to a terminal supplied with the signal AVREF, one of a source and a drain of the transistor 301 is connected to the one of the source and the drain of the transistor 101, and the other of the source and the drain of the transistor 301 is connected to the terminal supplied with the signal VPO. With such a configuration, the number of transistors and capacitors can be reduced. Note that FIG. 5 and description thereof may be referred to for components other than the above components included in the constant current circuit 300.

Next, operation in which reference current is set in the constant current circuit 300 is described. The signal ASET is set at a high level, the signal ASW is set at a low level, and the signal AVREF is set at a predetermined potential. At this time, the value of current flowing in the constant current circuit 300 depends on the signal AVREF.

The amount of current flowing in the transistor 301 is equal to that in the transistor 101. Here, the signal AVREF supplied to the transistor 301 is set at a potential corresponding to a potential of the gate of the transistor 301 which is needed for making the reference current flow. The signal AVREF is preferably set at a potential at which current does not flow between the current adder-subtractor circuit 61 and the current correction circuit 62. Operation other than the above is the same as that of the constant current circuit 100 in FIG. 5, and therefore, detailed description thereof is omitted.

As described above, the constant current circuit 300 has a configuration in which the potential needed for making the reference current flow is supplied from the outside instead of a configuration in which the potential needed for making the reference current flow is retained inside. This simplifies the circuit configuration of the constant current circuit 300.

This embodiment can be combined with any of the other embodiments as appropriate.

Embodiment 4

In this embodiment, a configuration for controlling power supply to a circuit such as the A/D conversion circuit 40 or the driver circuit 50 is described.

<Configuration Example of Power Switch>

FIGS. 11A to 11C and FIGS. 12A to 12F each illustrate a configuration example of a circuit provided with a switch for controlling power supply (i.e., a power switch).

Figure 11A:
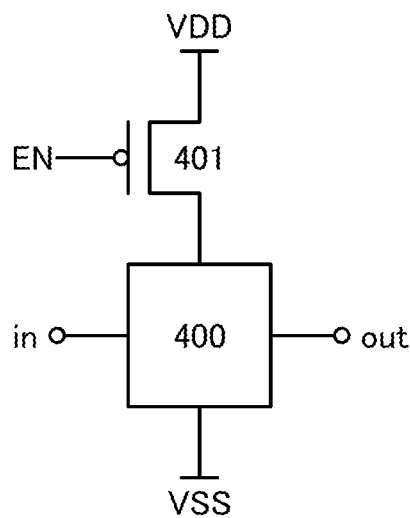
FIGS. 11A to 11C are circuit diagrams each illustrating one embodiment of the present invention.

In FIG. 11A, a circuit 400 is connected to a power switch which controls the power supply. Here, a transistor 401 is used as the power switch.

The circuit 400 is driven using a high power supply potential VDD and a low power supply potential VSS, and its configuration and function are not particularly limited. For example, the circuit 400 may be an arithmetic circuit or a memory circuit. In the case where the circuit 400 is used as an arithmetic circuit, a circuit including a combinational circuit such as an inverter circuit, an AND circuit, a NAND circuit, an OR circuit, or a NOR circuit can be used. Alternatively, the circuit 400 may include a sequential circuit such as a flip-flop circuit or a latch circuit.

The circuit 400 is connected to a wiring supplied with the low power supply potential VSS and to one of a source and a drain of the transistor 401. The other of the source and the drain of the transistor 401 is connected to a wiring supplied with the high power supply potential VDD. A gate of the transistor 401 is connected to a wiring supplied with a signal EN. Note that the signal EN is a signal for controlling power supply to the circuit 400.

When a low-level signal is input as the signal EN, the transistor 401 is turned on, the high power supply potential VDD is supplied to the circuit 400, and thus, the circuit 400 operates. On the other hand, when a high-level signal is input as the signal EN, the transistor 401 is turned off and the supply of the high power supply potential VDD to the circuit 400 is stopped.

The A/D conversion circuit 40 or the driver circuit 50 illustrated in FIG. 1 can be used as the circuit 400. Thus, power supply to the A/D conversion circuit 40 or the driver circuit 50 can be controlled. In this case, a high power supply potential VDD in each of FIGS. 11A to 11C corresponds to the high power supply potential VDD1, the high power supply potential VDD2, or the like in FIG. 1. In the case where the A/D conversion circuit 40 is used as the circuit 400, an input terminal "in" corresponds to a terminal or the like connected to the pixels 21, and an output terminal "out" corresponds to a terminal or the like connected to the driver circuit 50. In the case where the driver circuit 50 is used as the circuit 400, an input terminal "in" corresponds to a terminal or the like connected to the A/D conversion circuit 40, and an output terminal "out" corresponds to a terminal or the like from which the signal DOUT is output.

The signal EN can be controlled on the basis of the signal AOUT shown in FIG. 1 or the like. Therefore, when there is a difference between imaging data obtained in the pixels 21 and the signal AOUT is output, the signal EN at a high level or the signal EN at a low level is output, and power can be supplied to the A/D conversion circuit 40 and the driver circuit 50.

Figure 11B:
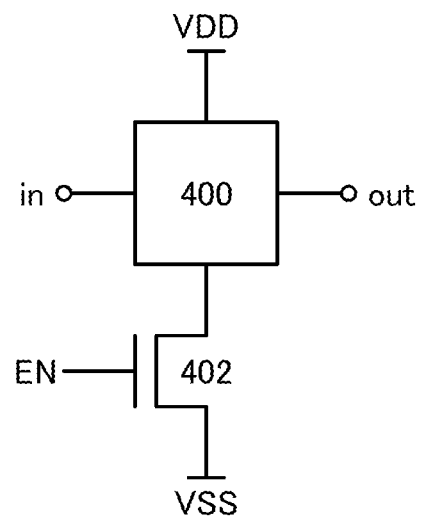

As illustrated in FIG. 11B, a switch may be provided between the circuit 400 and the wiring supplied with the low power supply potential VSS. Here, a transistor 402 is used as the switch. When a high-level signal is input as the signal EN, the transistor 402 is turned on, the low power supply potential VSS is supplied to the circuit 400, and thus, the circuit 400 operates. On the other hand, when a low-level signal is input as the signal EN, the transistor 402 is turned off and the supply of the low power supply potential VSS to the circuit 400 is stopped.

Figure 11C:
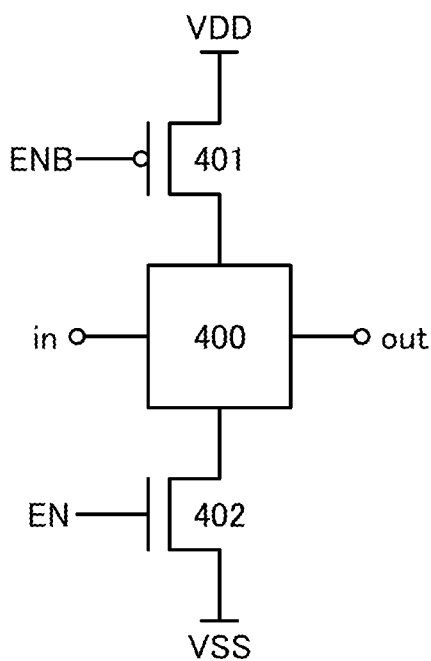

As illustrated in FIG. 11C, switches may be provided between the circuit 400 and the wiring supplied with the high power supply potential VDD and between the circuit 400 and the wiring supplied with the low power supply potential VSS. Here, a signal ENB is an inverted signal of the signal EN. When a high-level signal is input as the signal EN, the high power supply potential VDD and the low power supply potential VSS are supplied to the circuit 400.

Figure 12A:
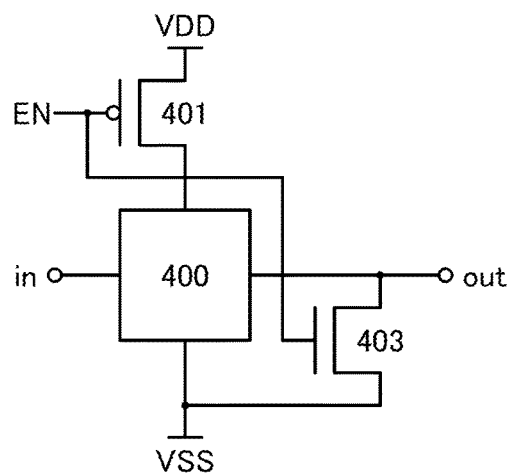
FIGS. 12A to 12F are circuit diagrams each illustrating one embodiment of the present invention.

As illustrated in FIG. 12A, a transistor 403 can be added to the configuration in FIG. 11A. A gate of the transistor 403 is connected to the wiring supplied with the signal EN. One of a source and a drain of the transistor 403 is connected to an output terminal "out". The other of the source and the drain of the transistor 403 is connected to the wiring supplied with the low power supply potential VSS.

The transistor 403 is in an on state in a period where a high-level signal is input as the signal EN. Thus, the potential of the output terminal "out" can be kept at a low level in a period where power supply to the circuit 400 is stopped. This can prevent the output of the circuit 400 from having an undefined value.

Figure 12B:
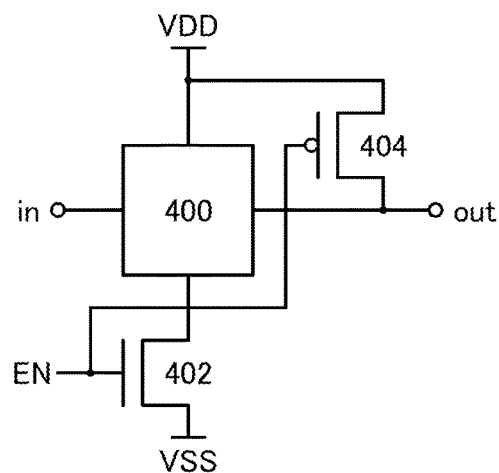

As illustrated in FIG. 12B, a transistor 404 can be added to the configuration in FIG. 11B. A gate of the transistor 404 is connected to the wiring supplied with the signal EN. One of a source and a drain of the transistor 404 is connected to the output terminal "out". The other of the source and the drain of the transistor 404 is connected to the wiring supplied with the high power supply potential VDD.

The transistor 404 is in an on state in a period where a low-level signal is input as the signal EN. Thus, the potential of the output terminal "out" can be kept at a high level in a period where power supply to the circuit 400 is stopped. This can prevent the output of the circuit 400 from having an undefined value.

Figure 12C:
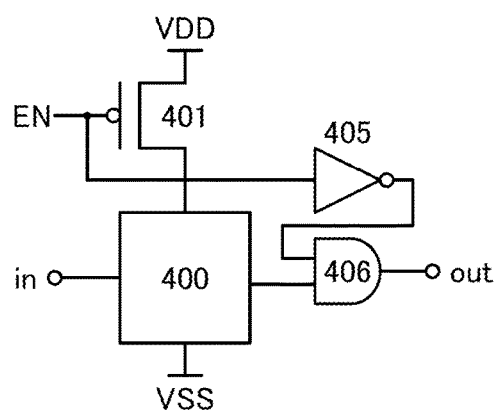
Figure 12D:
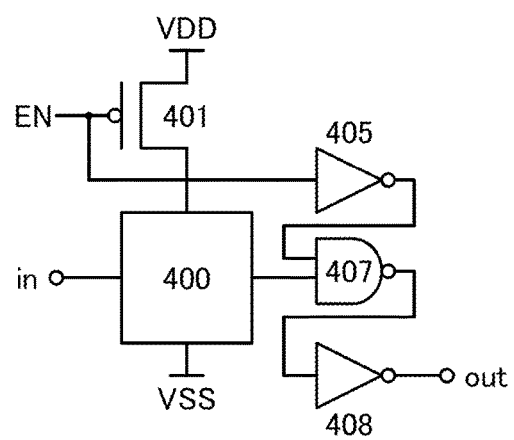

Note that a logic circuit may be provided instead of the transistor 403 in FIG. 12A. FIG. 12C illustrates a configuration in which an inverter 405 and an AND circuit 406 are provided instead of the transistor 403. FIG. 12D illustrates a configuration in which the inverter 405, a NAND circuit 407, and an inverter 408 are provided instead of the transistor 403.

Figure 12E:
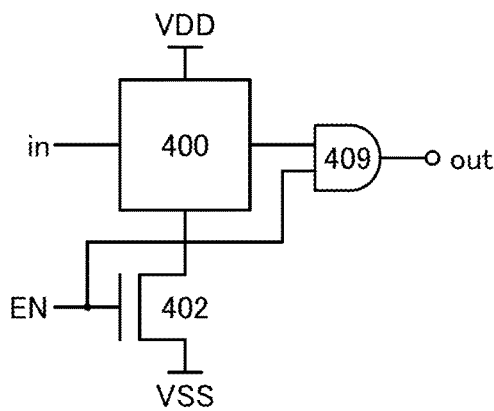
Figure 12F:
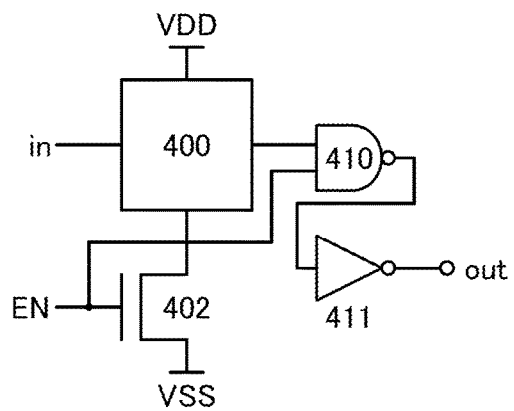

A logic circuit may be provided instead of the transistor 404 in FIG. 12B. FIG. 12E illustrates a configuration in which an AND circuit 409 is provided instead of the transistor 404. FIG. 12F illustrates a configuration in which a NAND circuit 410 and an inverter 411 are provided instead of the transistor 404.

In FIGS. 12C to 12F, the potential of the output terminal "out" can be kept at a low level in a period where power supply to the circuit 400 is stopped. This can prevent the output of the circuit 400 from having an undefined value.

In FIGS. 11A to 11C and FIGS. 12A to 12F, power supply may be stopped by changing the high power supply potential VDD to the low power supply potential VSS. In that case, the circuit 400 is connected to the two wirings supplied with the low power supply potential VSS, and current does not flow to the circuit 400. Similarly, in FIGS. 11A to 11C and FIGS. 12A to 12F, power supply may be stopped by changing the low power supply potential VSS to the high power supply potential VDD.

A material of the transistors in FIGS. 11A to 11C and FIGS. 12A to 12F (such as the transistors 401 to 404 and transistors included in the inverter, the AND circuit, and the NAND circuit) is not particularly limited, and for example, OS transistors can be used. In particular, when OS transistors are used as the transistors 401 and 402, power consumption can be extremely low in a period where the transistors 401 and 402 are turned off and power supply is stopped.

OS transistors can be stacked over other transistors. Thus, the transistors in FIGS. 11A to 11C and FIGS. 12A to 12F can be stacked over transistors included in the circuit 400, so that an increase in area due to the presence of the power switch can be suppressed.

Note that the transistors in FIGS. 11A to 11C and FIGS. 12A to 12F are not limited to OS transistors and can be single crystal transistors, transistors in each of which a channel formation region is formed in a film including a semiconductor other than an oxide semiconductor, or the like (see Embodiment 1).

<Configuration Example of Circuit 400>

FIGS. 13A and 13B and FIGS. 14A and 14B illustrate examples of a specific configuration of the circuit 400.

Figure 13A:
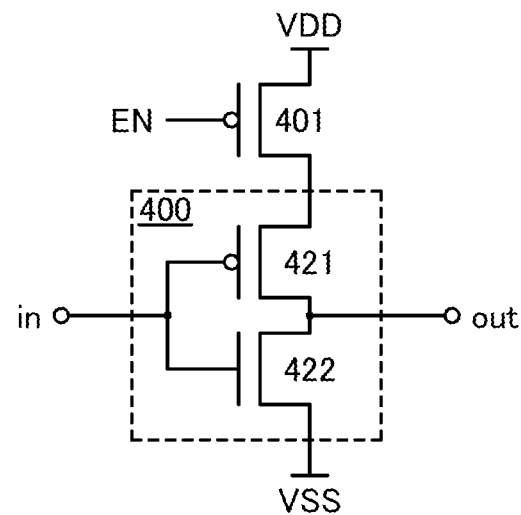
FIGS. 13A and 13B are circuit diagrams each illustrating one embodiment of the present invention.

FIG. 13A illustrates a configuration in which the circuit 400 in FIG. 11A is an inverter. The circuit 400 includes a transistor 421 and a transistor 422.

A gate of the transistor 421 is connected to the input terminal "in", one of a source and a drain of the transistor 421 is connected to the one of the source and the drain of the transistor 401, the other of the source and the drain of the transistor 421 is connected to one of a source and a drain of the transistor 422. A gate of the transistor 422 is connected to the input terminal "in". The other of the source and the drain of the transistor 422 is connected to the wiring supplied with the low power supply potential VSS. Although the configuration in which the circuit 400 in FIG. 11A is the inverter is described here, any of the circuits 400 in FIGS. 11B and 11C and FIGS. 12A to 12F may be an inverter.

Figure 13B:
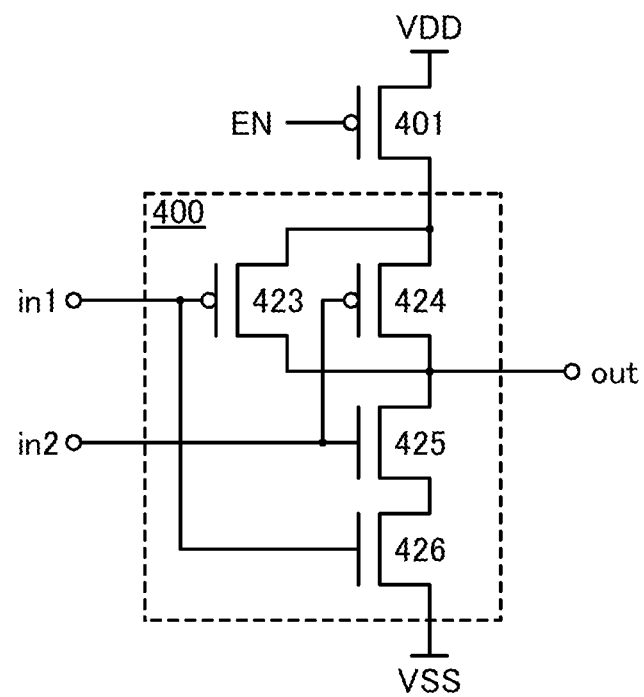

FIG. 13B illustrates a configuration in which the circuit 400 in FIG. 11A is a NAND circuit. The circuit 400 includes transistors 423, 424, 425, and 426.

A gate of the transistor 423 is connected to an input terminal IN1. One of a source and a drain of the transistor 423 is connected to one of a source and a drain of the transistor 424 and the one of the source and the drain of the transistor 401. The other of the source and the drain of the transistor 423 is connected to the other of the source and the drain of the transistor 424 and one of a source and a drain of the transistor 425. A gate of the transistor 424 is connected to an input terminal IN2. A gate of the transistor 425 is connected to the input terminal IN2. The other of the source and the drain of the transistor 425 is connected to one of a source and a drain of the transistor 426. A gate of the transistor 426 is connected to the input terminal IN1. The other of the source and the drain of the transistor 426 is connected to the wiring supplied with the low power supply potential VSS. Although the configuration in which the circuit 400 in FIG. 11A is the NAND circuit is described here, any of the circuits 400 in FIGS. 11B and 11C and FIGS. 12A to 12F can be a NAND circuit. In addition, an AND circuit can be formed by combining the inverter in FIG. 13A with the NAND circuit in FIG. 13B.

The circuits 400 illustrated in FIGS. 13A and 13B can be each used as the A/D conversion circuit 40 or the driver circuit 50. Therefore, power supply can be controlled in each logic element included in the A/D conversion circuit 40 or the driver circuit 50.

Figure 14A:
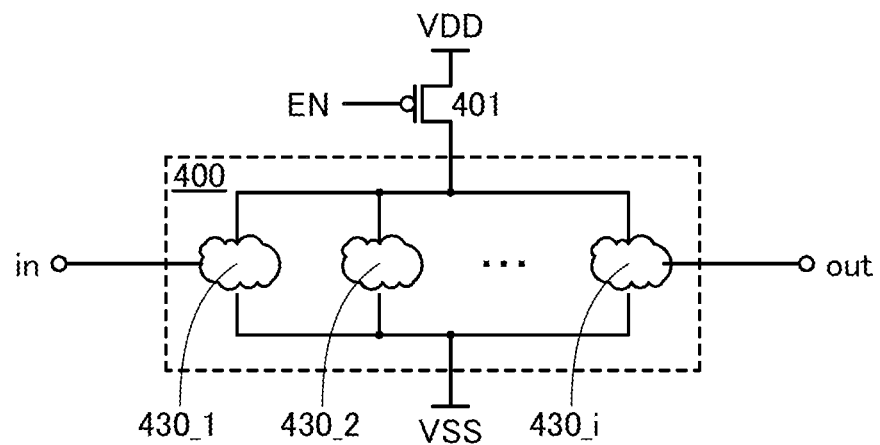
FIGS. 14A and 14B are circuit diagrams each illustrating one embodiment of the present invention.
Figure 14B:
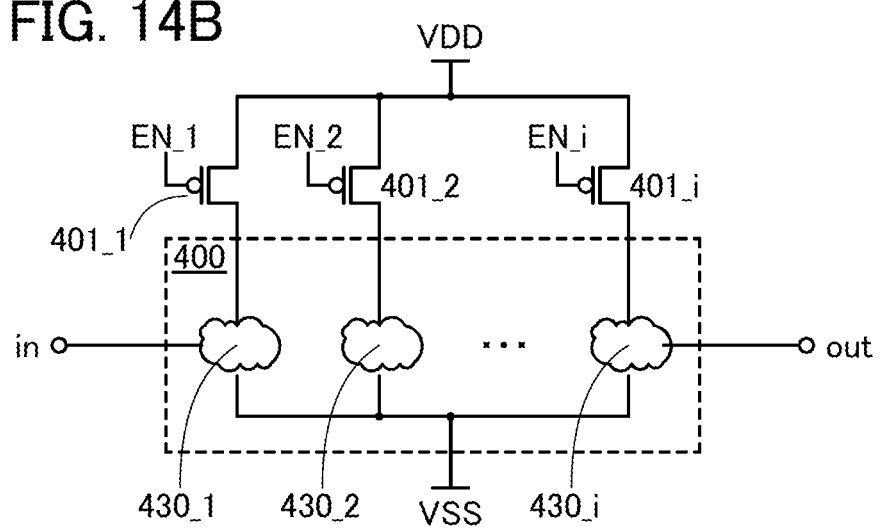

Note that any of the circuits 400 in FIGS. 11A to 11C and FIGS. 12A to 12F may be formed using a plurality of logic elements. FIGS. 14A and 14B each illustrate a configuration in which the circuit 400 in FIG. 11A includes a plurality of logic circuits 430.

The circuit 400 in FIG. 14A includes i logic circuits 430 (logic circuits 430_1 to 430_i) (i is an integer of two or more). Each of the logic circuits 430 is connected to the wiring supplied with the high power supply potential VDD through the transistor 401. Each of the logic circuits 430 is also connected to the wiring supplied with the low power supply potential VSS. When a low-level signal is supplied as the signal EN, the high power supply potential VDD is supplied to the logic circuits 430_1 to 430_i. Accordingly, power supply to the logic circuits 430_1 to 430_i can be collectively controlled.

The logic circuit 430 may include a combinational circuit such as an inverter circuit, an AND circuit, a NAND circuit, an OR circuit, or a NOR circuit or a sequential circuit such as a flip-flop circuit or a latch circuit.

As illustrated in FIG. 14B, the logic circuits 430 may be provided with respective transistors 401. In that case, power supply to each of the logic circuits 430 can be controlled separately.

Note that in each of the circuits 400 in FIGS. 14A and 14B, the output terminal of one logic circuit 430 may be connected to the input terminal of another logic circuit 430. This allows the logic circuits 430 to be combined to form a logic circuit.

Each of the circuits 400 in FIGS. 14A and 14B can be used as any of the circuits 400 in FIGS. 11B and 11C and FIGS. 12A to 12F.

The circuits 400 illustrated in FIGS. 14A and 14B can be each used as the A/D conversion circuit 40 or the driver circuit 50. Thus, power supply to the A/D conversion circuit 40 or the driver circuit 50 including a plurality of logic elements can be controlled. Furthermore, the control of power supply to the plurality of logic elements can be performed on the plurality of logic elements collectively or individually.

The signal EN in each of FIGS. 13A and 13B and FIGS. 14A and 14B can be controlled on the basis of the signal AOUT shown in FIG. 1 or the like. Therefore, when there is a difference between imaging data obtained in the pixels 21 and the signal AOUT is output, the signal EN at a high level or the signal EN at a low level is output, and power can be supplied to the A/D conversion circuit 40 and the driver circuit 50.

This embodiment can be combined with any of the other embodiments as appropriate.

Embodiment 5

In this embodiment, a specific example of a configuration of the pixel 21 which has been described in the above embodiments and is capable of obtaining and retaining imaging data, reference data, and difference data is described.

<Configuration Example of Pixel>

Figure 15A:
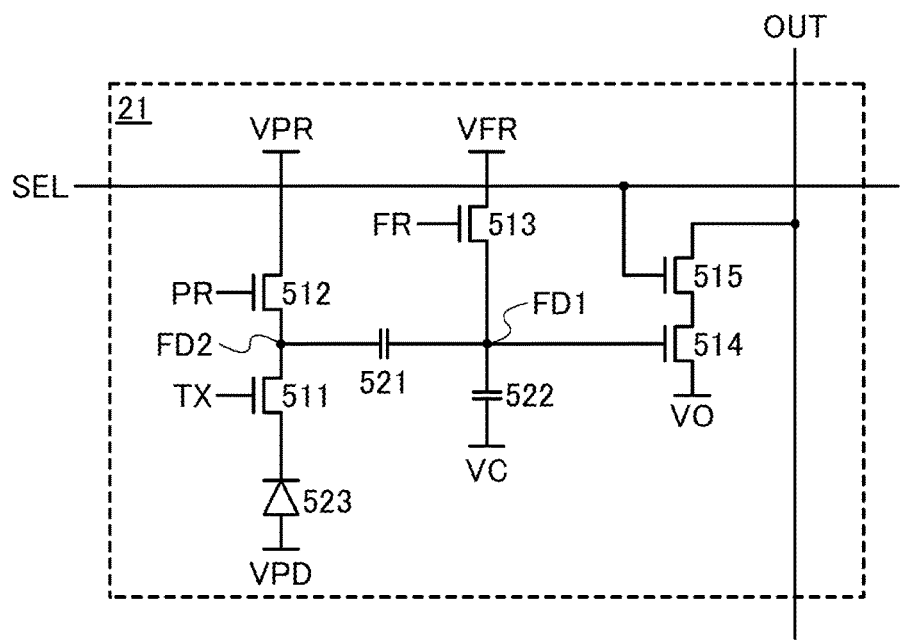
FIGS. 15A and 15B are a circuit diagram and a timing chart illustrating one embodiment of the present invention.

FIG. 15A illustrates a configuration example of the pixel 21. The pixel 21 illustrated in FIG. 15A includes a transistor 511, a transistor 512, a transistor 513, a transistor 514, a transistor 515, a capacitor 521, a capacitor 522, and a photoelectric conversion element 523. Here, a photodiode is used as the photoelectric conversion element 523. The pixel 21 is supplied with potentials from a wiring VPD, a wiring VPR, a wiring VC, a wiring VFR, and a wiring VO and supplied with control signals from a wiring TX, a wiring PR, a wiring FR, and a wiring SEL. Imaging data or difference data obtained in the pixel 21 is output to a wiring OUT. Electric charge corresponding to imaging data or difference data is accumulated in a node FD1. Here, the capacitance value of the capacitor 521 is preferably larger than the total capacitance value of the capacitor 522 and the gate capacitance of the transistor 514.

A gate of the transistor 511 is connected to the wiring TX. One of a source and a drain of the transistor 511 is connected to one terminal of the photoelectric conversion element 523. The other of the source and the drain of the transistor 511 is connected to one of a source and a drain of the transistor 512. A gate of the transistor 512 is connected to the wiring PR, and the other of the source and the drain of the transistor 512 is connected to the wiring VPR. A gate of the transistor 513 is connected to the wiring FR, one of a source and a drain of the transistor 513 is connected to one electrode of the capacitor 522, and the other of the source and the drain of the transistor 513 is connected to the wiring VFR. A gate of the transistor 514 is connected to the one electrode of the capacitor 522, one of a source and a drain of the transistor 514 is connected to the wiring VO, the other of the source and the drain of the transistor 514 is connected to one of a source and a drain of the transistor 515. A gate of the transistor 515 is connected to the wiring SEL, and the other of the source and the drain of the transistor 515 is connected to the wiring OUT. One electrode of the capacitor 521 is connected to the other of the source and the drain of the transistor 511 and the one of the source and the drain of the transistor 512, and the other electrode of the capacitor 521 is connected to one electrode of the capacitor 522 and the one of the source and the drain of the transistor 513. The other electrode of the capacitor 522 is connected to the wiring VC. The other terminal of the photoelectric conversion element 523 is connected to the wiring VPD.

Note that the transistors 511 to 515 are n-channel transistors here but each may be a p-channel transistor.

<Operation Example of Pixel>

Figure 15B:
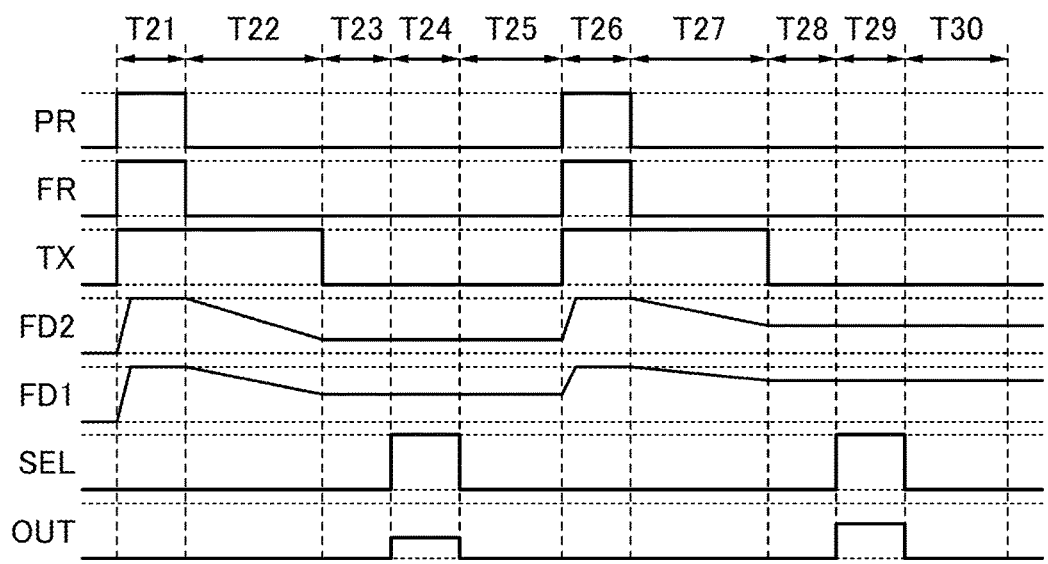
Figure 16:
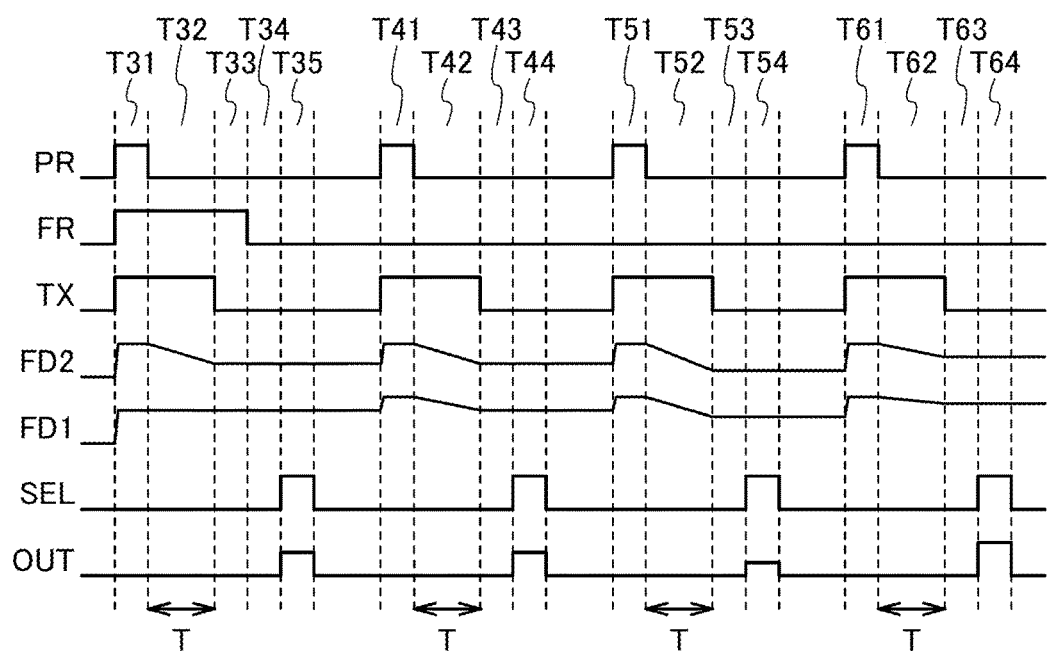
FIG. 16 is a timing diagram.

An operation example of the pixel 21 illustrated in FIG. 15A is described with reference to FIG. 15B and FIG. 16. Here, a case where the potential of the wiring VPD is at a low level, the potential of the wiring VPR is at a high level, the potential of the wiring VC is at a low level, the potential of the wiring VFR is at a high level, and the potential of the wiring VO is at a high level is described.

[Obtaining Imaging Data]

First, operation in obtaining imaging data in the pixel 21 is described with reference to FIG. 15B.

First, the potentials of the wiring PR, the wiring FR, and the wiring TX are set at a high level in a period T21. In this period, the potential of the node FD1 is set at the potential (V1) of the wiring VFR, and the potential of the node FD2 is set at the potential (V2) of the wiring VPR.

Next, in a period T22, the potentials of the wiring PR and the wiring FR are set at a low level. In this period, the potential of the node FD2 decreases in accordance with the intensity of light with which the photoelectric conversion element 523 is irradiated. Here, when a decreased amount of the potential of the node FD2 is represented as ΔV2, the potential of the node FD2 is represented as V2−ΔV2. The potential of the node FD1 also decreases owing to capacitive coupling between the capacitor 521 (capacitance value C1) and the combined capacitance of the capacitor 522 (capacitance value C2) and the gate capacitance of the transistor 514 (capacitance value Cg). Here, when a decreased amount of the potential of the node FD1 is represented as ΔV1, ΔV1=ΔV2−C1/(C1+C2+Cg)=ΔV2×a, and the potential of the node FD1 is represented as V1−ΔV1. As the intensity of light with which the photoelectric conversion element 523 is irradiated becomes higher, the potential of the node FD2 decreases, and the potential of the node FD1 also decreases.

Next, in a period T23, the potential of the wiring TX is set at a low level. Thus, the photoelectric conversion element 523 and the node FD2 are electrically disconnected to each other, and the decrease in the potential of the node FD2 is stopped.

Next, in a period T24, the potential of the wiring SEL is set at a high level. In this period, a potential corresponding to imaging data is output to the wiring OUT depending on the potential of the node FD1. Note that a decrease in the potential of the node FD1 reduces the potential of the wiring OUT. That is, as the intensity of light with which the photoelectric conversion element 523 is irradiated becomes higher, the potential of the wiring OUT decreases.

Then, in a period T25, the potential of the wiring SEL is set at a low level. Thus, output of a potential corresponding to imaging data to the wiring OUT is stopped.

After that, the same operation is performed in a period T26, a period T27, a period T28, a period T29, and a period T30 as in the periods T21 to T25. Note that FIG. 15B shows a case where the intensity of light with which the photoelectric conversion element 523 is irradiated in the period T27 is lower than that in the period T22 and a potential output to the wiring OUT in the period T29 is higher than that in the period T24.

[Obtaining Reference Data and Difference Data]

Next, operation in obtaining reference data and difference data in the pixels 21 is described with reference to FIG. 16.

First, operation in the first frame period (periods T31 to T35) in which reference data is obtained is described.

In the period T31, the potentials of the wiring PR, the wiring FR, and the wiring TX are set at a high level. In this period, the potential of the node FD1 is set at the potential (V1) of the wiring VFR, and the potential of a node FD2 is set at the potential (V2) of the wiring VPR.

Next, in the period T32, the potential of the wiring PR is set at a low level. In this period, the potential of the node FD2 decreases in accordance with the intensity of light with which the photoelectric conversion element 523 is irradiated. Here, when a decreased amount of the potential of the node FD2 is represented as ΔV2, the potential of the node FD2 is represented as V2−ΔV2. Note that as the intensity of light with which the photoelectric conversion element 523 is irradiated becomes higher, the potential of the node FD2 decreases. Note that in the period T32, the potential of the node FD1 is not changed from V1.

Next, in the period T33, the potential of the wiring TX is set at a low level. Thus, the photoelectric conversion element 523 and the node FD2 are electrically disconnected to each other, and the decrease in the potential of the node FD2 is stopped.

Next, in the period T34, the potential of the wiring FR is set at a low level. Accordingly, the transistor 513 is turned off, and the node FD1 is brought into a floating state.

Next, in the period T35, the potential of the wiring SEL is set at a high level. In this period, a potential corresponding to reference data is output to the wiring OUT depending on the potential of the node FD1. Here, a potential corresponding to the potential (V1) of the node FD1 is output to the wiring OUT.

The potential of the wiring OUT in the period T35 corresponds to reference data obtained in the reference frame period. Then, the reference data is output to the analog processing circuit 60 in FIG. 1 or the like, and reference current is set in the analog processing circuit 60.

Next, operation in the second frame period (periods 41 to 44) in which difference data is obtained is described. Here, a case where a difference between imaging data of the first frame and imaging data of the second frame is zero is described.

In the period T41, the potential of the wiring PR is set at a high level, the potential of the wiring FR is set at a low level, and the potential of the wiring TX is set at a high level. In this period, the potential of the node FD2 is set at the potential (V2) of the wiring VPR. That is, the potential is increased by a decreased amount of voltage (ΔV2) in the period T32. The potential of the node FD1 also increases owing to capacitive coupling between the capacitor 521 and the combined capacitance of the capacitor 522 and the gate capacitance of the transistor 514. Here, when an increased amount of potential of the node FD1 is represented as ΔV1, ΔV1=ΔV2×α, and the potential of the node FD1 is represented as V1+ΔV1.

Next, in the period T42, the potential of the wiring PR is set at a low level. In this period, the potential of the node FD2 decreases in accordance with the intensity of light with which the photoelectric conversion element 523 is irradiated. The potential of the node FD1 also decreases owing to capacitive coupling between the capacitor 521 and the combined capacitance of the capacitor 522 and the gate capacitance of the transistor 514. As the intensity of light with which the photoelectric conversion element 523 is irradiated becomes higher, the potential of the node FD2 decreases, and the potential of the node FD1 also decreases.

Here, assuming that the lengths of the periods T42 and T32 are each represented as T and in the period T42, the photoelectric conversion element 523 is irradiated with light having the same intensity as the light in the period T32, the decreased amount of voltage of the node FD2 in the period T42 is equal to ΔV2 which is the decreased amount of voltage of the node FD2 in the period T32. The potential of the node FD1 also decreases owing to capacitive coupling between the capacitor 521 and the combined capacitance of the capacitor 522 and the gate capacitance of the transistor 514. Here, the decreased amount of the potential of the node FD1 is ΔV1=ΔV2×α, and the potential of the node FD1 is decreased to V1.

Next, in a period T43, the potential of the wiring TX is set at a low level. Thus, the photoelectric conversion element 523 and the node FD2 are electrically disconnected to each other, and the decrease in the potential of the node FD2 is stopped.

Next, in the period T44, the potential of the wiring SEL is set at a high level. In this period, a potential corresponding to the potential of the node FD1 is output to the wiring OUT. The potential output to the wiring OUT corresponds to difference data. Note that a decrease in the potential of the node FD1 reduces the potential of the wiring OUT. That is, as the intensity of light with which the photoelectric conversion element 523 is irradiated becomes higher, the potential of the wiring OUT decreases.

Here, a potential output to the wiring OUT in the period T44 is equal to the potential of the wiring OUT in the period T35. In this case, the potentials input from the pixels 21 to the constant current circuit 100 in the periods T35 and T44 are equal to each other, and current flowing in the constant current circuit 100 is not changed from the reference current. This means that a difference between imaging data of the first frame and imaging data of the second frame is zero.

Next, operation in the third frame period (periods 51 to 54) in which difference data is obtained is described. Here, a case where a difference between imaging data of the first frame and imaging data of the third frame is negative is described.

In the period T51, the potential of the wiring PR is set at a high level, and the potential of the wiring FR is set at a low level, and the potential of the wiring TX is set at a high level. In this period, the potential of the node FD2 is set to the potential (V2) of the wiring VPR. That is, the potential is increased by a decreased amount of voltage (ΔV2) in the period T42. The potential of the node FD1 also increases owing to capacitive coupling between the capacitor 521 and the combined capacitance of the capacitor 522 and the gate capacitance of the transistor 514. Here, when an increased amount of potential of the node FD1 is represented as ΔV1, ΔV1=ΔV2×α, and the potential of the node FD1 is represented as V1+ΔV1.

Next, in the period T52, the potential of the wiring PR is set at a low level. In this period, the potential of the node FD2 decreases in accordance with the intensity of light with which the photoelectric conversion element 523 is irradiated. The potential of the node FD1 also decreases owing to capacitive coupling between the capacitor 521 and the combined capacitance of the capacitor 522 and the gate capacitance of the transistor 514. Note that the intensity of light with which the photoelectric conversion element 523 is irradiated in the period T52 is higher than that in the period T42.

Here, assuming that the lengths of the periods T52 and T42 are each represented as T, a decreased amount of voltage (ΔV2') of the node FD2 in the period T52 is larger than that (ΔV2) in the period T42 (ΔV2'>ΔV2). Furthermore, a decreased amount of voltage in the node FD1 in the period T52 (ΔV1'=ΔV2'×α) is larger than the decreased amount of voltage (ΔV1) in the period T42 (ΔV1'>ΔV1). Accordingly, the potential (V1+ΔV1−ΔV1') of the node FD1 is lower than the potential (V1) of the wiring VFR.

Next, in a period T53, the potential of the wiring TX is set at a low level. Thus, the photoelectric conversion element 523 and the node FD2 are electrically disconnected to each other, and the decrease in the potential of the node FD2 is stopped.

Next, in the period T54, the potential of the wiring SEL is set at a high level. In this period, a potential corresponding to the potential of the node FD1 is output to the wiring OUT. The potential output to the wiring OUT corresponds to difference data. Here, a potential output to the wiring OUT in the period T54 is lower than the potential of the wiring OUT in the period T44. In this case, potentials input from the pixels 21 to the constant current circuit 100 in the periods T35, T44, and T54 are different from one another, and the current flowing in the constant current circuit 100 is changed from the reference current. This means that a difference between imaging data of the first frame and imaging data of the third frame is negative.

Next, operation in a fourth frame period (periods T61 to T64) in which difference data is obtained is described. Here, a case where a difference between imaging data of the first frame and imaging data of the third frame is positive is described.

In the period T61, the potential of the wiring PR is set at a high level, the potential of the wiring FR is set at a low level, and the potential of the wiring TX is set at a high level. In this period, the potential of the node FD2 is set at the potential (V2) of the wiring VPR. That is, the potential is increased by a decreased amount of voltage (ΔV2') in the period T52. The potential of the node FD1 is increased by the decreased amount of voltage ($\Delta V1'$) in the period T52 owing to capacitive coupling between the capacitor 521 and the combined capacitance of the capacitor 522 and the gate capacitance of the transistor 514. Thus, the potential of the node FD1 in the period T61 becomes $V1+\Delta V1$.

Next, in the period T62, the potential of the wiring PR is set at a low level. In this period, the potential of the node FD2 decreases in accordance with the intensity of light with which the photoelectric conversion element 523 is irradiated, and the potential of the node FD1 also decreases owing to capacitive coupling between the capacitor 521 and the combined capacitance of the capacitor 522 and the gate capacitance of the transistor 514. Note that the intensity of the light with which the photoelectric conversion element 523 is irradiated in the period T62 is lower than that in the period T42.

Here, assuming that the lengths of the periods T62 and T42 are each represented as T, a decreased amount of voltage ($\Delta V2''$) of the node FD2 in the period T62 is smaller than that ($\Delta V2$) in the period T42 ($\Delta V2'' < \Delta V2$). Furthermore a decreased amount of voltage of the node FD1 in the period T62 ($\Delta V1'' = \Delta V2'' \times \alpha$) is smaller than the decreased amount ($\Delta V1$) of voltage in the period T42 ($\Delta V1'' < \Delta V1$). Accordingly, the potential ($V1+\Delta V1-\Delta V1''$) of the node FD1 is higher than the potential (V1) of the wiring VFR.

Next, in a period T63, the potential of the wiring TX is set at a low level. Thus, the photoelectric conversion element 523 and the node FD2 are electrically disconnected to each other, and the decrease in the potential of the node FD2 is stopped.

Next, in a period T64, the potential of the wiring SEL is set at a high level. In this period, a potential corresponding to the potential of the node FD1 is output to the wiring OUT. The potential output to the wiring OUT corresponds to difference data. Here, a potential output to the wiring OUT in the period T64 is higher than the potential of the wiring OUT in the period T44. In this case, the potentials input from the pixels 21 to the constant current circuit 100 in the periods T35, T44, and T64 are different from one another, and current flowing in the constant current circuit 100 is changed from the reference current. This means that a difference between imaging data of the first frame and imaging data of the fourth frame is positive.

When the pixel 21 has the configuration illustrated in FIG. 15A as mentioned above, difference data can be obtained and retained.

<Modification Example of Pixel>

The pixel 21 can have a configuration different from that illustrated in FIG. 15A. Modification examples of the pixel 21 are described below.

Modification Example 1

Figure 17A:
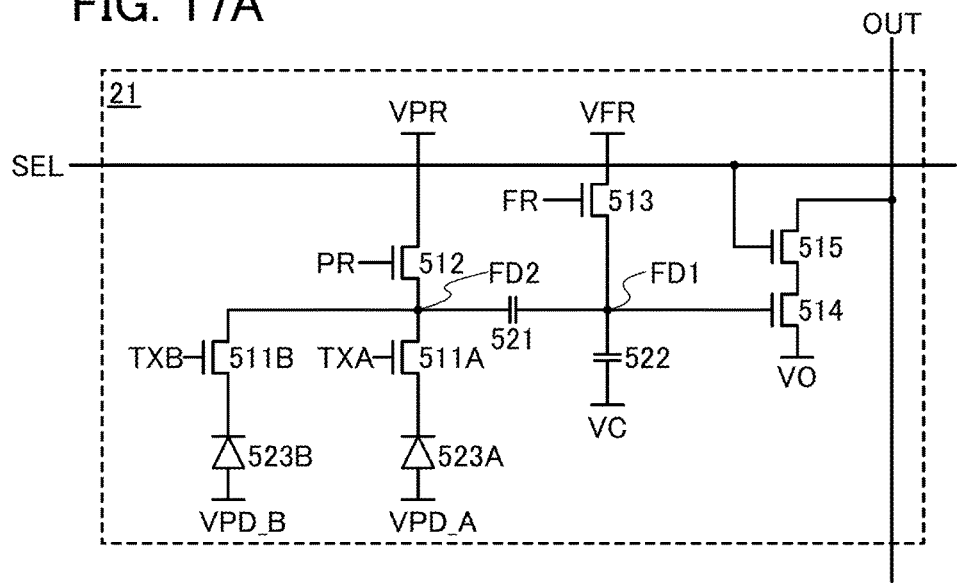
FIGS. 17A and 17B are circuit diagrams each illustrating one embodiment of the present invention.

The pixel 21 may include the plurality of transistors 511 and a plurality of photoelectric conversion elements 523. For example, as illustrated in FIG. 17A, the pixel 21 may include a photoelectric conversion element 523A and a photoelectric conversion element 523B and the transistors 511A and 511B. A gate of the transistor 511A and a gate of the transistor 511B are connected to a wiring TXA and a wiring TXB, respectively.

Figure 17B:
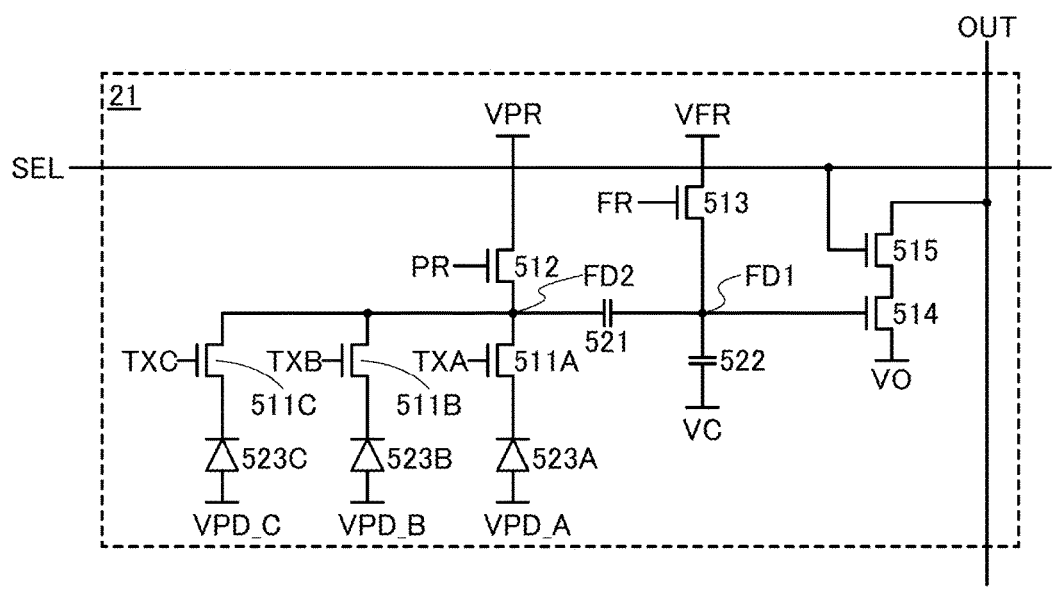

Alternatively, for example, as illustrated in FIG. 17B, the pixel 21 may include the photoelectric conversion elements 523A and 523B and a photoelectric conversion element 523C and the transistors 511A and 511B and a transistor 511C. The gate of the transistor 511A, the gate of the transistor 511B, and a gate of the transistor 511C are connected to the wiring TXA, the wiring TXB, and a wiring TXC, respectively.

Figure 18A:
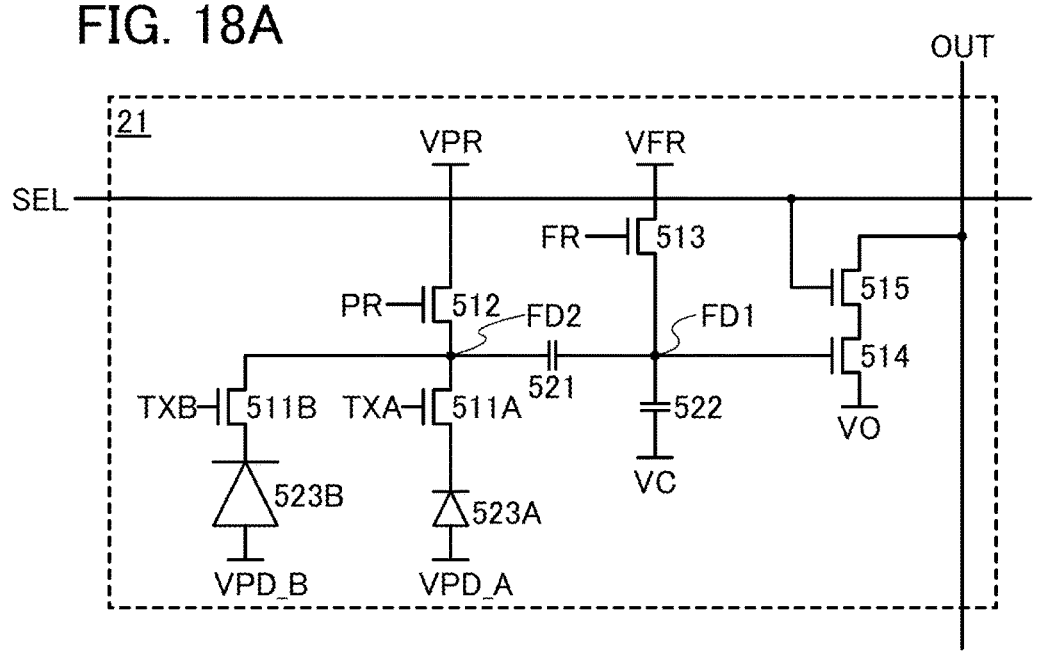
FIGS. 18A and 18B are circuit diagrams each illustrating one embodiment of the present invention.

In the case where a plurality of photodiodes is provided as in FIGS. 17A and 17B, light receiving surface areas of the photodiodes may be different from each other. For example, as illustrated in FIG. 18A, the photoelectric conversion element 523A and the photoelectric conversion element 523B having different light receiving surface areas may be provided. The photoelectric conversion element 523A and the photoelectric conversion element 523B are connected to a wiring VPD_A and a wiring VPD_B, respectively. The potentials of the wirings VPD_A and VPD_B may be the same or different.

Figure 18B:
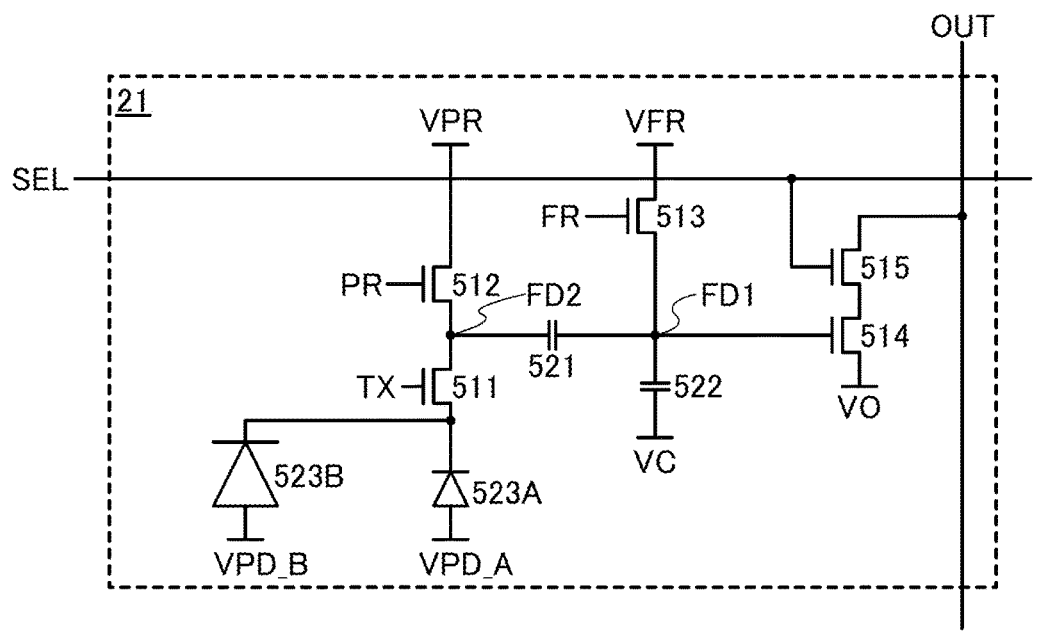

Alternatively, as illustrated in FIG. 18B, for example, the photoelectric conversion elements 523A and 523B having different light receiving surface areas may be connected to one transistor 511. With the configurations illustrated in FIGS. 18A and 18B, imaging can be performed using photodiodes having different spectral sensitivities, and thus imaging in accordance with brightness and darkness in an area for imaging can be performed. Note that to obtain different spectral sensitivities of the photodiodes, the light-receiving surface areas of the photodiodes may be made different from each other, or different kinds of semiconductor materials may be provided on the light-receiving surfaces, for example.

Figure 19:
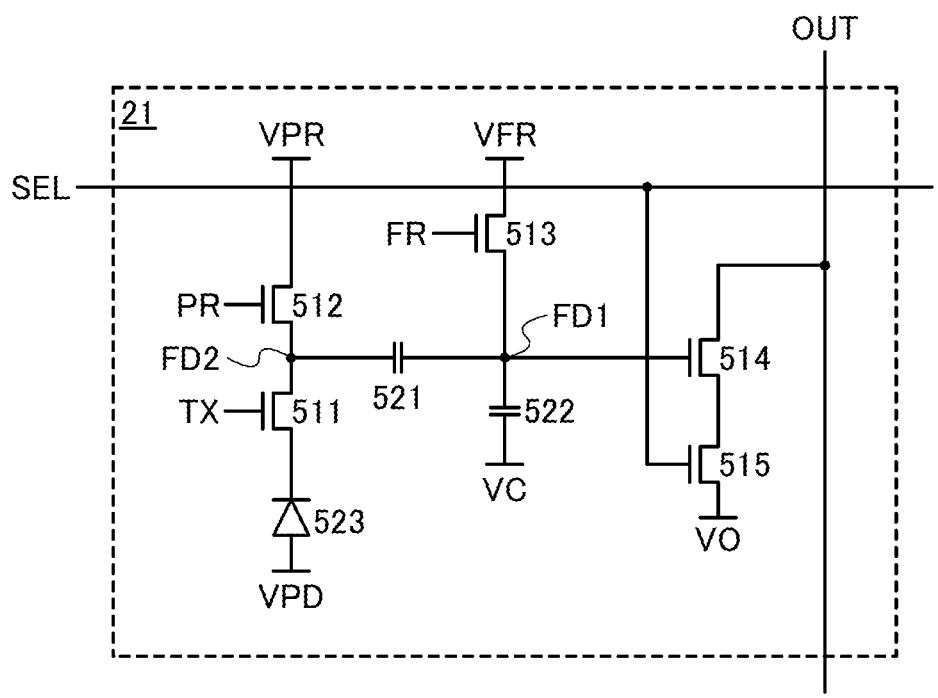
FIG. 19 is a circuit diagram illustrating one embodiment of the present invention.

Note that although operation in the case where current flowing in the transistor 514 flows in a direction from the wiring VO to the wiring OUT is described in FIG. 15A, the current may flow in the opposite direction. That is, the pixel 21 may have a configuration in which the current flowing in the transistor 514 flows in a direction from the wiring OUT to the wiring VO. In this case, the pixel 21 may have a configuration illustrated in FIG. 19, for example. Note that the pixel 21 in FIG. 19 may have a configuration in which the wiring VO is supplied with a low potential and the wiring OUT is supplied with a high potential.

Note that even the wirings supplied with the same potential are illustrated as different wirings in FIG. 15A but may be one wiring.

Modification Example 2

Figure 20A:
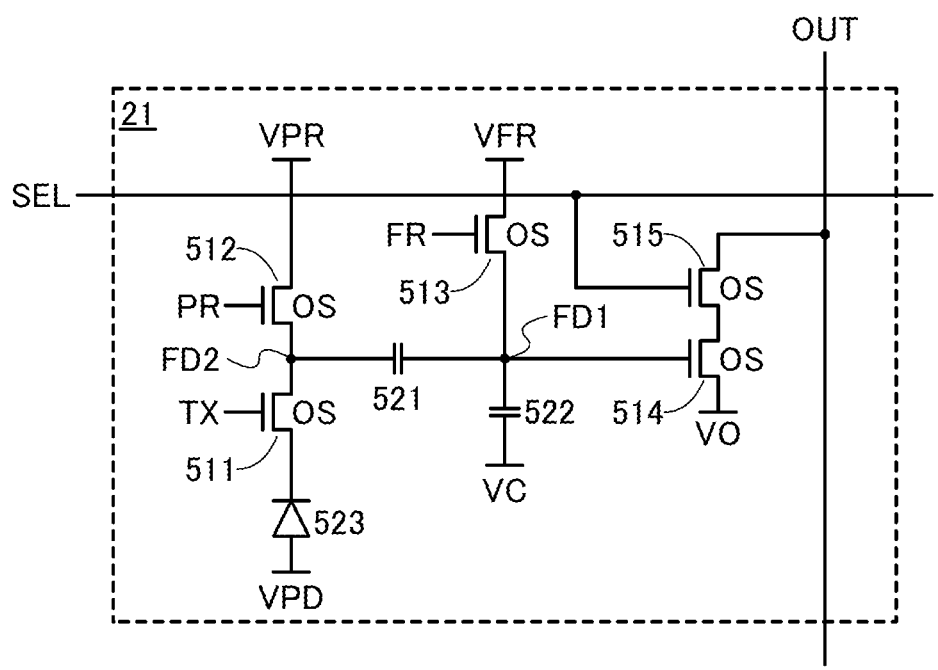
FIGS. 20A and 20B are circuit diagrams each illustrating one embodiment of the present invention.

FIG. 20A illustrates an example of a configuration of the pixel 21 in which OS transistors are used as the transistors in FIG. 15A. In the pixel 21 illustrated in FIG. 20A, OS transistors are used as the transistors 511 to 515. Note that the transistor marked with a symbol "OS" in the drawing is an OS transistor.

An OS transistor has a characteristic of extremely low off-state current. Therefore, the use of the OS transistor in the pixel 21 can broaden the dynamic range of imaging. In the pixel 21 illustrated in FIG. 20A, when the intensity of light with which the photoelectric conversion element 523 is irradiated is high, the potential of the node FD1 decreased. Since the OS transistor has an extremely low off-state current, current corresponding to the potential can be accurately output even when the potential of the gate of the transistor 514 is extremely low. Thus, it is possible to broaden the detection range of illuminance, i.e., the dynamic range.

Since the OS transistor has an extremely low off-state current, a period during which electric charge is retained in the node FD1 can be made extremely long. Thus, a global shutter system can be employed without making the circuit configuration or the operation method complicated. Therefore, an image with little distortion can be easily obtained even in the case of a moving object. Furthermore, for the same reason, exposure time (a period for conducting charge accumulation operation) can be long; thus, the imaging device is suitable for imaging even in a low illuminance environment.

Furthermore, the OS transistor has less variation in electrical characteristics due to a change in temperature than another transistor such as a transistor including silicon in a channel formation region (hereinafter also referred to as a Si transistor). Accordingly, the pixel 21 can be operated at an extremely wide range of temperature. Therefore, an imaging device and a semiconductor device which include OS transistors are suitable for use in automobiles, aircrafts, and spacecrafts.

The pixel 21 illustrated in FIG. 20A can include a photodiode formed using silicon and OS transistors. Such a configuration facilitates an increase in the effective area of the photodiode because a Si transistor need not be formed in the pixel. Thus, the imaging sensitivity can be improved.

Not only the pixel 21 but also peripheral circuits such as the driver circuit 30, the A/D conversion circuit 40, the driver circuit 50, the analog processing circuit 60, and the control circuit 70 in FIG. 1 can be formed using OS transistors. A configuration in which the peripheral circuits are formed using only OS transistors does not need a process for forming Si transistors; therefore, the configuration is effective in reducing the cost of the semiconductor device. The peripheral circuits may be formed using n-channel OS transistors and p-channel Si transistors. In this case, an n-channel Si transistor does not need to be formed, and thus the number of steps can be reduced. Accordingly, the cost of the semiconductor device can be reduced. Furthermore, the peripheral circuits can be complementary metal oxide semiconductor (CMOS) circuits, which is effective in reducing power consumption of the peripheral circuits.

Modification Example 3

Figure 20B:
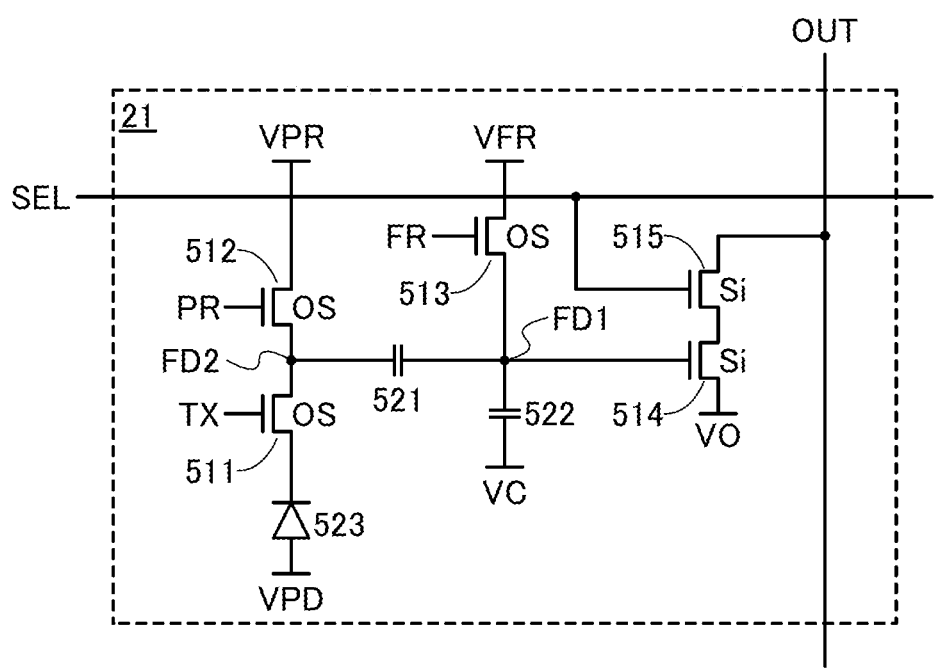

FIG. 20B illustrates an example of a configuration of the pixel 21 which is a modification example of the pixel 21 in FIG. 20A. In the pixel 21 illustrated in FIG. 20B, the transistors 514 and 515 are Si transistors. The transistor marked with a symbol "Si" in the drawing is a Si transistor. The transistors 514 and 515 are preferably single crystal transistors.

The Si transistor has excellent field-effect mobility as compared to the OS transistor. Therefore, the amount of current flowing in a transistor 514 functioning as an amplifier transistor can be increased. For example, in FIG. 20B, the amount of current flowing in the transistors 514 and 515 can be increased depending on charge accumulated in the node FD1.

Modification Example 4

Figure 21:
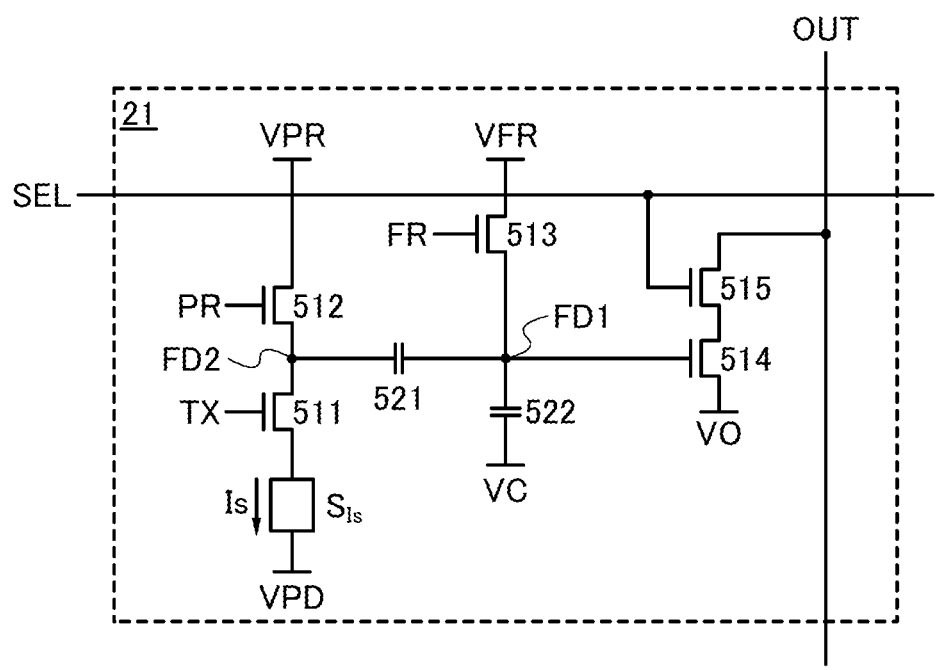
FIG. 21 is a circuit diagram illustrating one embodiment of the present invention.

FIG. 21 illustrates a configuration of the pixel 21 in which a sensor $S_{IS}$ is used instead of the photoelectric conversion element 523 in FIG. 15A.

An element which is capable of converting a given physical amount into the amount of current Is is preferable as the sensor $S_{IS}$. Alternatively, an element which is capable of converting a given physical amount into another physical amount and then converting it into the amount of current is preferable.

For the sensor $S_{IS}$, a variety of sensors can be used. For example, the sensor $S_{IS}$ can be a temperature sensor, an optical sensor, a gas sensor, a frame sensor, a smoke sensor, a humidity sensor, a pressure sensor, a flow sensor, a vibration sensor, a voice sensor, a magnetic sensor, a radiation sensor, a smell sensor, a pollen sensor, an acceleration sensor, an inclination sensor, a gyro sensor, a direction sensor, or a power sensor.

For example, when an optical sensor is used as the sensor $S_{IS}$, the above-described photodiode or a phototransistor can be used.

When a gas sensor is used as the sensor $S_{IS}$, it is possible to use a semiconductor gas sensor that detects a change in resistance due to adsorption of a gas on a metal oxide semiconductor such as tin oxide, a catalytic combustion-type gas sensor, or a solid electrolyte-type gas sensor.

Modification Example 4

Figure 22A:
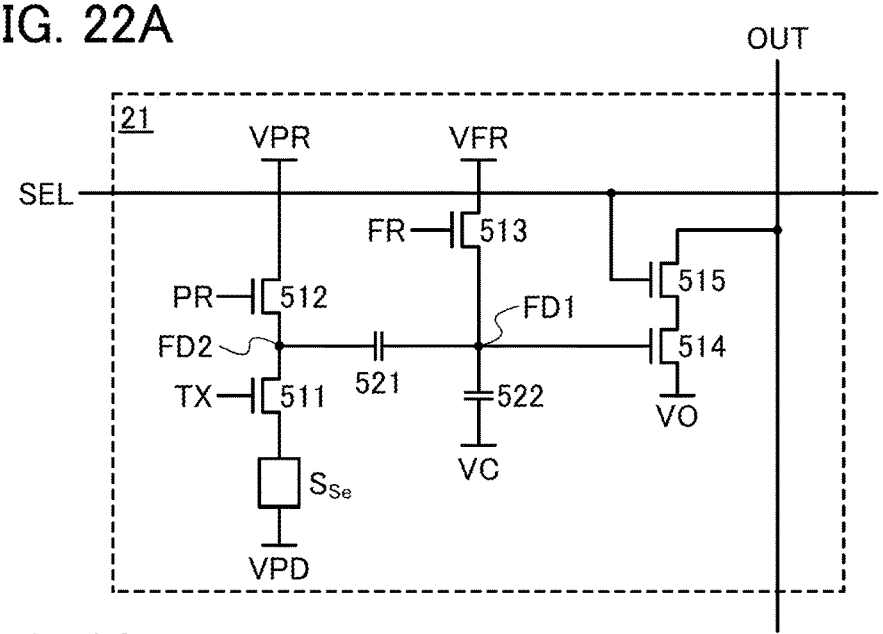
FIGS. 22A to 22C are views illustrating embodiments of the present invention.

FIG. 22A illustrates a configuration of the pixel 21 in which a sensor including a selenium-based semiconductor $S_{Se}$ is used instead of the photoelectric conversion element 523 in FIG. 15A or the sensor $S_{IS}$ in FIG. 21.

The selenium-based semiconductor element $S_{Se}$ is an element which is capable of conducting photoelectric conversion utilizing a phenomenon called avalanche multiplication, in which a plurality of electrons can be taken from one incident phonon by application of voltage. Thus, in the pixel 21 including a selenium-based semiconductor $S_{Se}$, a large amount of electrons can be extracted with respect to the amount of incident light, and thus the sensitivity of imaging in the pixel 21 can be improved.

For the selenium-based semiconductor $S_{Se}$, a selenium-based semiconductor including an amorphous structure or a selenium-based semiconductor including a crystalline structure can be used. For example, the selenium-based semiconductor with a crystalline structure may be obtained in such a manner that a selenium-based semiconductor with an amorphous structure is deposited and subjected to heat treatment. Note that it is preferable that the crystal grain diameter of the selenium-based semiconductor including a crystalline structure be smaller than a pixel pitch because variation in characteristics of the pixels is reduced and the image quality of an image to be obtained becomes uniform.

A selenium-based semiconductor including a crystalline structure among the selenium-based semiconductors $S_{Se}$ has a characteristic of having a light absorption coefficient in a wide wavelength range. Therefore, the element using a crystalline selenium-based semiconductor can be used for imaging for light in a wide wavelength range (e.g., visible light, ultraviolet light, X-rays, and gamma rays), and can be used for a direct conversion element, which is capable of directly converting light in a short wavelength range (e.g., X-rays and gamma rays) into charge.

Figure 22B:
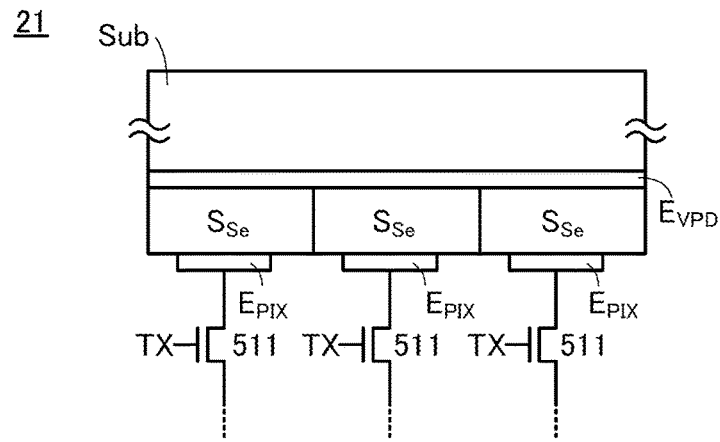

FIG. 22B is a schematic view illustrating a cross-sectional structure of part of the pixel 21 illustrated in FIG. 22A. FIG. 22B illustrates the transistors 511, electrodes $E_{PIX}$ connected to the transistors 511, the selenium-based semiconductors $S_{Se}$, an electrode $E_{VPD}$, and a substrate Sub.

Light is emitted from the side where the electrode $E_{VPD}$ and the substrate Sub are formed toward the selenium-based semiconductors $S_{Se}$. Therefore, the electrode $E_{VPD}$ and the substrate Sub preferably transmit light. Indium tin oxide (ITO) or the like can be used for the electrode $E_{VPD}$, and a glass substrate or the like can be used as the substrate Sub.

The selenium-based semiconductors $S_{Se}$ and the electrode $E_{VPD}$ stacked over the selenium-based semiconductors $S_{Se}$ can be used without processing their shapes in accordance with each pixel. Therefore, a step for processing the shape can be omitted, which leads to a reduction in the manufacturing cost and improvement in the manufacturing yield.

For example, a chalcopyrite-based semiconductor can be used for the selenium-based semiconductor $S_{Se}$. Specifically, $CuIn_{1-x}Ga_xSe_2$ ($0 \leq x \leq 1$, abbreviated to CIGS) can be used, for example. CIGS can be formed by an evaporation method, a sputtering method, or the like.

The selenium-based semiconductor $S_{Se}$ that is a chalcopyrite-based semiconductor can perform avalanche multiplication by being applied with a voltage of from 5 V to 20 V. Therefore, when the above voltage is applied to a selenium-based semiconductor $S_{Se}$, the photosensitivity can be improved. Note that when the thickness of a selenium-based semiconductor $S_{Se}$ is as thin as less than or equal to 1 µm, voltage applied to a selenium-based semiconductor $S_{Se}$ can be reduced.

Note that in the case where the thickness of the selenium-based semiconductor $S_{Se}$ is small, dark current flows at the time of application of voltage in some cases; however, providing a layer for inhibiting dark current from flowing in the CIGS that is a chalcopyrite-based semiconductor (hole-injection barrier layer) can prevent the dark current from flowing. An oxide semiconductor such as gallium oxide can be used for the hole-injection barrier layer. The thickness of the hole-injection barrier layer is preferably smaller than that of the selenium-based semiconductor $S_{Se}$.

Figure 22C:
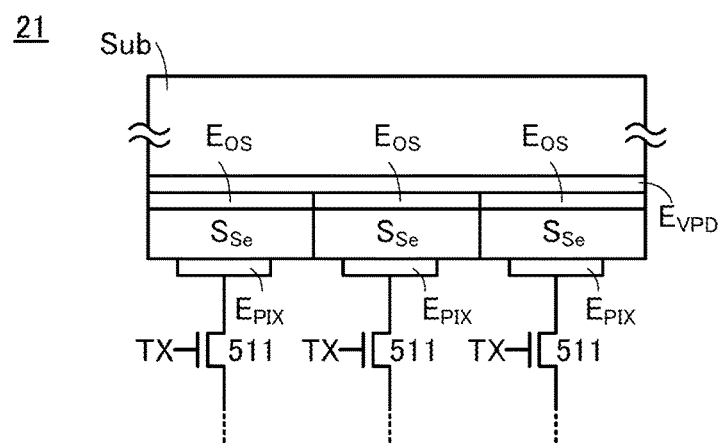

FIG. 22C is a schematic cross-sectional view different from that of FIG. 22B. The pixel 21 illustrated in FIG. 22C includes hole-injection barrier layers $E_{OS}$ in addition to the transistors 511, the electrodes $E_{PIX}$ connected to the transistors 511, the selenium-based semiconductors $S_{Se}$, the electrode $E_{VPD}$, and the substrate Sub.

As described above, the use of the selenium-based semiconductor $S_{Se}$ as a sensor can reduce the manufacturing cost and characteristic variation among pixels and increase the manufacturing yield; as a result, a highly sensitive sensor is obtained.

This embodiment can be combined with any of the other embodiments as appropriate.

Embodiment 6

In this embodiment, an imaging system including a semiconductor device of one embodiment of the present invention is described.

Figure 23:
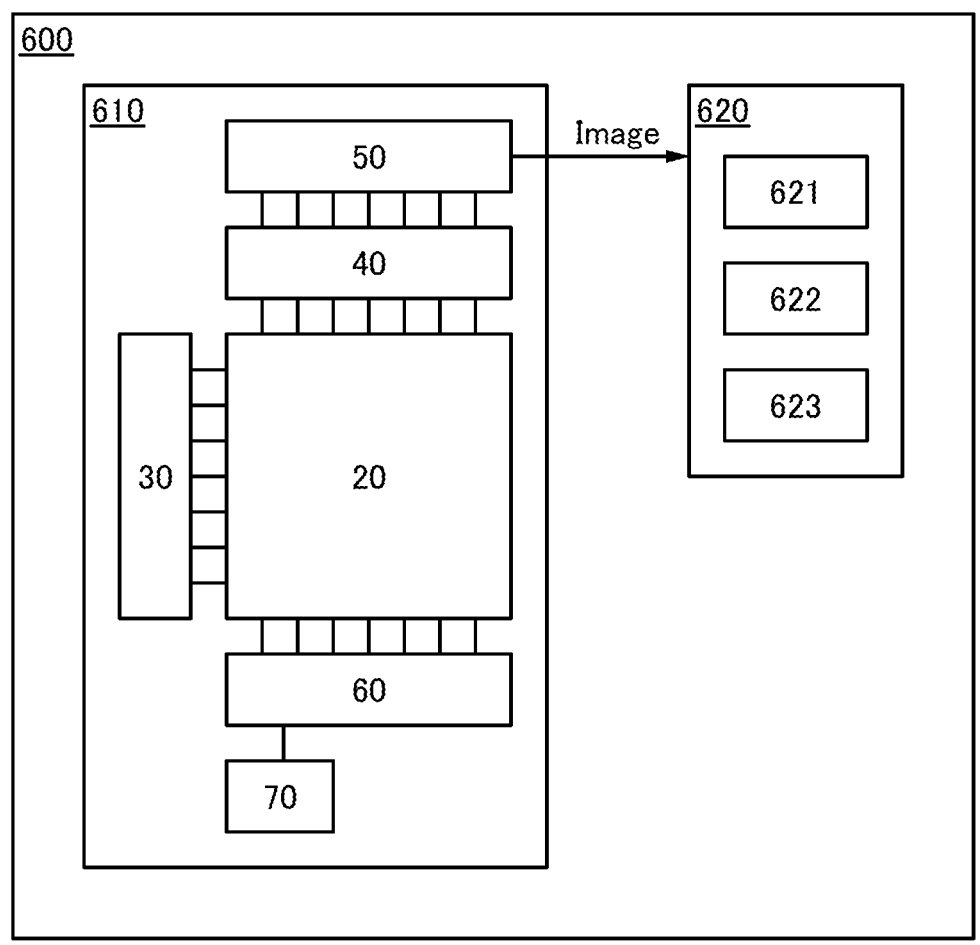
FIG. 23 is a view illustrating one embodiment of the present invention.

FIG. 23 illustrates an example of a structure of an imaging system 600. The imaging system 600 includes a photodetector portion 610 and a data processing portion 620.

The photodetector portion 610 includes the pixel portion 20, the driver circuit 30, the A/D conversion circuit 40, the driver circuit 50, the analog processing circuit 60, and the control circuit 70. The photodetector portion 610 has the same structure as the semiconductor device 10 illustrated in FIG. 1. Image data obtained in the pixel portion 20 is output as a signal Image to the data processing portion 620 through the driver circuit 50.

In the imaging system 600, difference data obtained in the pixel portion 20 is used as imaging data on which interframe compression has been performed. Therefore, the amount of imaging data transmitted and received between the photodetector portion 610 and the data processing portion 620 can be reduced, leading to higher speed of transmission and reception. Furthermore, in the photodetector portion 610, imaging data can be compressed in the pixel portion 20, and thus a circuit for performing compression of image data output from the driver circuit 50 can be omitted, leading to a reduction in area and power consumption of the imaging system 600.

The data processing portion 620 includes a processor 621, a decoder 622, and a memory circuit 623. The processor 621 has a function of controlling the decoder 622 and the memory circuit 623. Specifically, the processor 621 has a function of controlling decompression of compressed data by the decoder 622 or reading/writing data by the memory circuit 623. As the processor 621, a central processing unit (CPU), a graphics processing unit (GPU), a digital signal processor (DSP), or the like can be used.

The decoder 622 has a function of generating image data on the basis of the difference data input from the photodetector portion 610. Specifically, the decoder 622 has a function of extracting the signal Image corresponding to the compressed data.

The memory circuit 623 has a function of storing the difference data input from the photodetector portion 610 or data obtained by processing in the processor 621 or the decoder 622. Note that an OS transistor with extremely low off-state current is preferably used for a memory cell included in the memory circuit 623. Thus, data can be stored in the memory cell for a long period even in a period during which power supply to the memory circuit 623 is stopped. In the case where both the pixel portion 20 and the memory circuit 623 include OS transistors, these OS transistors can be formed in the same step.

The pixel portion 20 may include a circuit having a function of displaying an image. Thus, the imaging system 600 can have a function of a touch panel.

This embodiment can be combined with any of the other embodiments as appropriate.

Embodiment 7

In this embodiment, structure examples of a semiconductor device of one embodiment of the present invention are described. Note that a semiconductor device described below can be used as an imaging device.

Figure 24A:
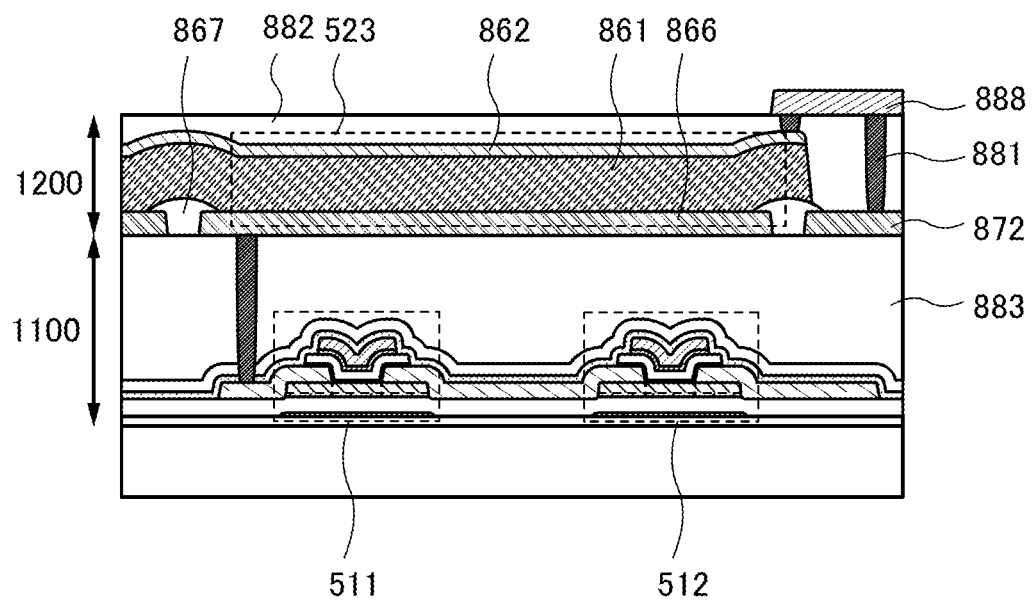
FIGS. 24A to 24C are cross-sectional views illustrating one embodiment of the present invention.

FIG. 24A is an example of a cross-sectional view of a semiconductor device of one embodiment of the present invention and illustrates an example of specific connection between the photoelectric conversion element 523 and the transistors 511 and 512 which are included in the pixel 21 in FIG. 15A. The semiconductor device illustrated in FIG. 24A includes a layer 1100 including the transistors 511 to 515 and a layer 1200 including the photoelectric conversion element 523.

Although the wirings, the electrodes, and conductors 881 are illustrated as independent components in cross-sectional views in this embodiment, some of them are provided as one component in some cases when they are electrically connected to each other. In addition, a structure in which a gate electrode, a source electrode, or a drain electrode of the transistor is connected to the wirings through the conductor 881 is only an example, and the gate electrode, the source electrode, and the drain electrode of the transistor might each function as a wiring.

In addition, insulating layers 882 and 883 and the like that function as protective films, interlayer insulating films, or planarization films are provided over the components. For example, an inorganic insulating film such as a silicon oxide film or a silicon oxynitride film can be used as each of the insulating layers 882 and 883 and the like. Alternatively, an organic insulating film such as an acrylic resin film or a polyimide resin film may be used. Top surfaces of the insulating layers 882 and 883 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In addition, a layer that is not illustrated in the drawing might be included. Furthermore, one or more of the layers illustrated in the drawing are not included in some cases.

It is particularly preferable to use OS transistors as the transistors 511 and 512.

Extremely low off-state current of the OS transistor can widen the dynamic range of imaging. In the configuration of the pixel 21, a decrease in the intensity of light entering the photoelectric conversion element 523 reduces the potential of the charge accumulation portion (the node FD2). Since the transistor including an oxide semiconductor has extremely low off-state current, a current based on a gate potential can be accurately output even when the gate potential is extremely low. Thus, it is possible to widen the detection range of illuminance, i.e., the dynamic range.

A period during which charge can be held in the charge accumulation portion (the node FD1) and the charge accumulation portion (the node FD2) can be extremely long owing to the low off-state current of the transistors 511 and 512. Therefore, a global shutter system in which accumulation operation is performed in all the pixels at the same time can be used without a complicated circuit structure and operation method.

Figure 25A:
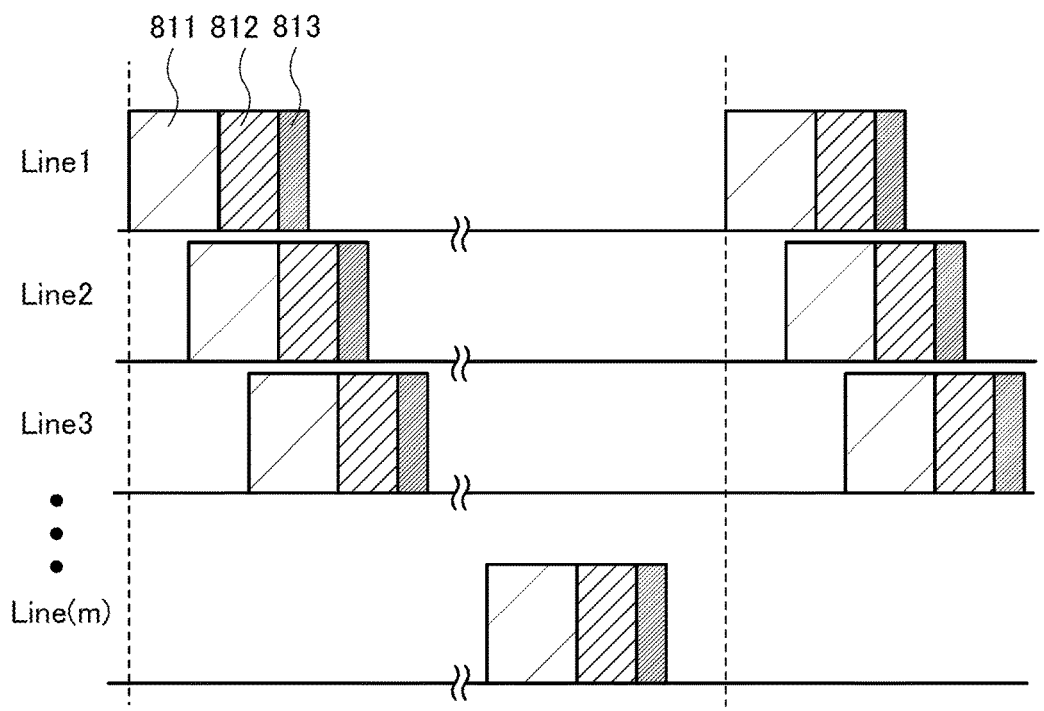
FIGS. 25A and 25B are views illustrating operations of a rolling shutter system and a global shutter system, respectively.

In general, in an imaging device where pixels are arranged in a matrix, a rolling shutter system is employed in which imaging operation 811, retention operation 812, and read operation 813 are performed row by row as illustrated in FIG. 25A. In the case of employing the rolling shutter system, simultaneousness of imaging is lost. Therefore, when an object moves, an image is distorted in some cases.

Figure 25B:
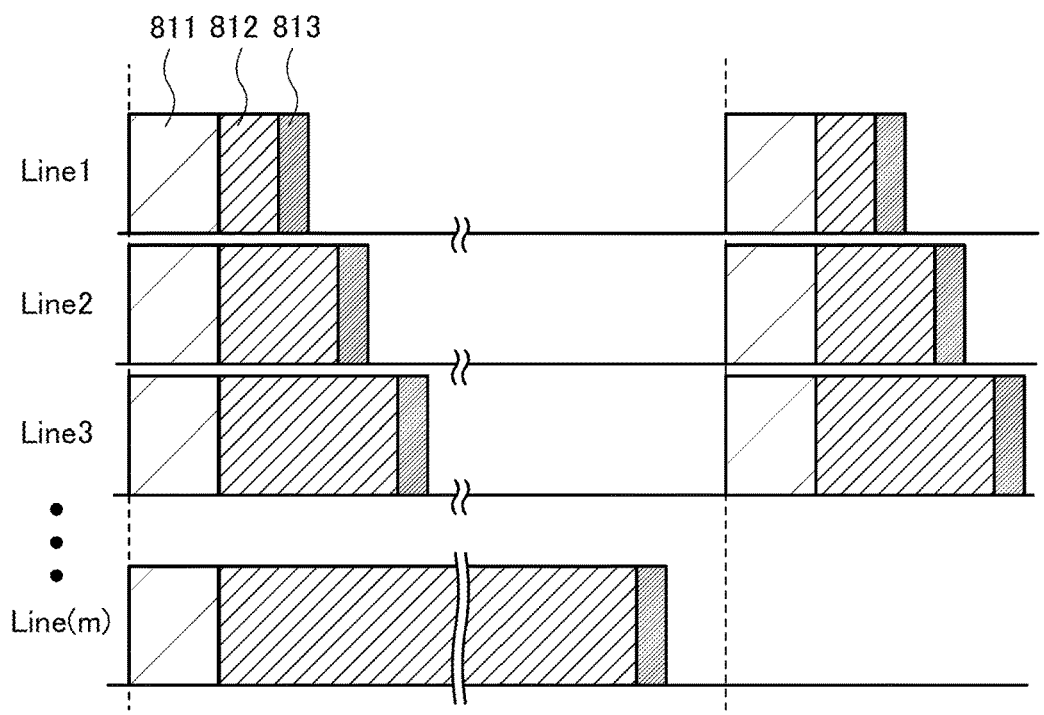

As a result, in one embodiment of the present invention, it is preferable to employ a global shutter system in which the imaging operation 811 can be performed simultaneously in all the rows and the read operation 813 can be sequentially performed row by row as illustrated in FIG. 25B. By employing the global shutter system, simultaneousness of imaging in all the pixels in the imaging device can be secured, and an image with little distortion can be easily obtained even when an object moves. Furthermore, exposure time (a period for conducting charge accumulation operation) can be long in a global shutter system; thus, the imaging device is suitable for imaging even in a low illuminance environment.

In addition, the OS transistor has lower temperature dependence of change in electrical characteristics than a Si transistor, and thus can be used in an extremely wide range of temperatures. Moreover, the OS transistor has higher drain breakdown voltage than the Si transistor. In a photoelectric conversion element including a selenium-based material in a photoelectric conversion layer, a relatively high voltage (e.g., 10 V or more) is preferably applied to easily cause an avalanche phenomenon. Therefore, by combination of the OS transistor and the photoelectric conversion element including a selenium-based material in the photoelectric conversion layer, a highly reliable imaging device can be obtained.

Figure 24B:
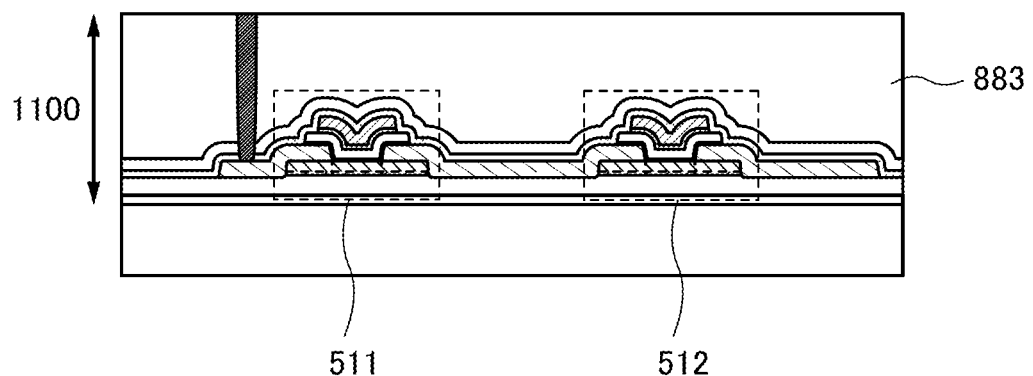
Figure 24C:
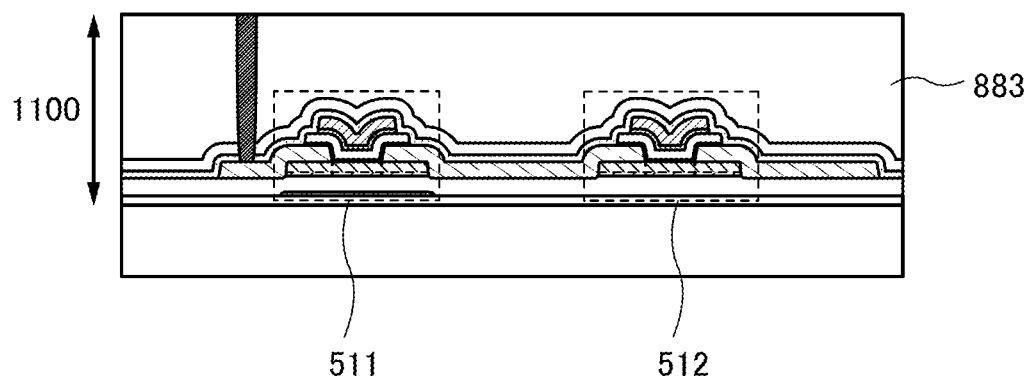

Note that although each transistor includes a back gate in FIG. 24A, each transistor does not necessarily include a back gate as illustrated in FIG. 24B. Alternatively, as illustrated in FIG. 24C, one or more transistors, for example, only the transistor 511 may include a back gate. The back gate might be electrically connected to a front gate of the transistor, which is provided to face the back gate. Alternatively, different fixed potentials might be supplied to the back gate and the front gate. Note that the presence or absence of the back gate can also be applied to another imaging device described in this embodiment.

A variety of elements can be used as the photoelectric conversion element 523 provided in the layer 1200. FIG. 24A illustrates the photoelectric conversion element 523 including a selenium-based material in a photoelectric conversion layer 861. The photoelectric conversion element 523 including a selenium-based material has high external quantum efficiency with respect to visible light. Such a photoelectric conversion element can be a highly sensitive sensor in which the amount of amplification of electrons with respect to the amount of incident light is large because of an avalanche phenomenon. Furthermore, the selenium-based material has a high light-absorption coefficient, making the photoelectric conversion layer 861 thin easily.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to and a higher absorption coefficient for visible light than amorphous selenium.

Furthermore, the photoelectric conversion layer 861 may be a layer including a compound of copper, indium, and selenium (CIS). Alternatively, a layer including a compound of copper, indium, gallium, and selenium (CIGS) may be used. A photoelectric conversion element including the CIS layer or the CIGS layer can also utilize an avalanche phenomenon like the photoelectric conversion element including selenium alone.

In the photoelectric conversion element 523 using the selenium-based material, for example, the photoelectric conversion layer 861 can be provided between a light-transmitting conductive layer 862 and the electrode 866 formed using a metal material or the like. Furthermore, CIS and CIGS are p-type semiconductors, and an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain breakdown voltage than the Si transistor, the application of a relatively high voltage to the photoelectric conversion element is easy. Thus, by combination of the OS transistor having high drain breakdown voltage and the photoelectric conversion element including the selenium-based material in the photoelectric conversion layer, a highly sensitive and highly reliable imaging device can be obtained.

Figure 26A:
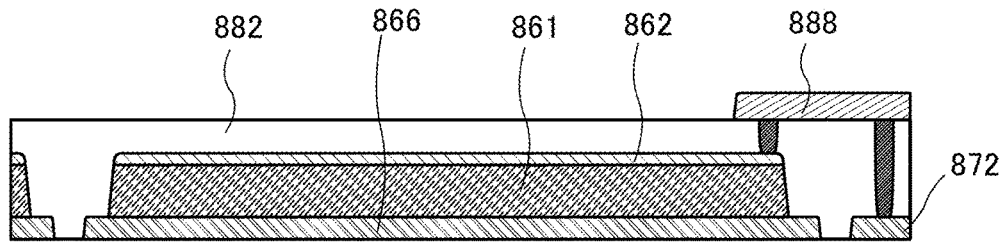
FIGS. 26A to 26D are cross-sectional views each illustrating one embodiment of a photoelectric conversion element.
Figure 26B:
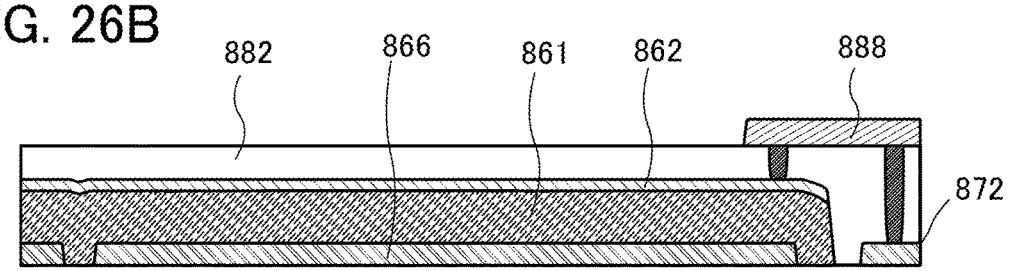
Figure 26C:
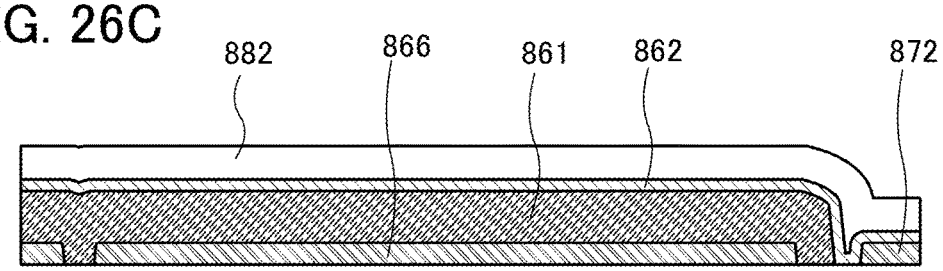
Figure 26D:
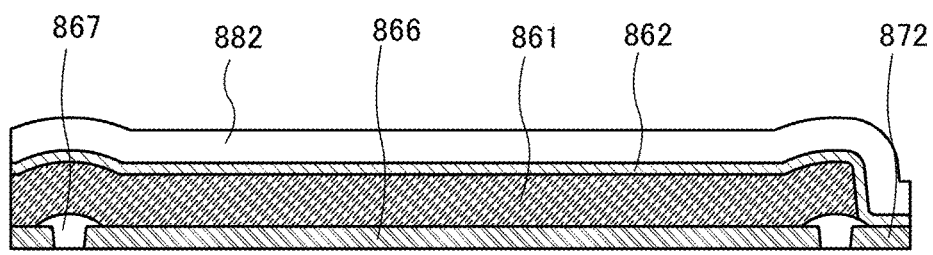

Although the photoelectric conversion layer 861 and the light-transmitting conductive layer 862 are not divided between circuits in FIG. 24A, they may be divided between circuits as illustrated in FIG. 26A. In a region between pixels where the electrode 866 is not provided, a partition wall 867 formed of an insulator is preferably provided, thereby preventing generation of a crack in the photoelectric conversion layer 861 and the light-transmitting conductive layer 862. However, the partition wall 867 is not necessarily provided as illustrated in FIG. 26B. Although the light-transmitting conductive layer 862 and the wiring 872 are connected to each other through a wiring 888 and the conductor 881 in FIG. 24A, the light-transmitting conductive layer 862 and the wiring 872 may be in direct contact with each other as in FIGS. 26C and 26D.

Figure 27A:
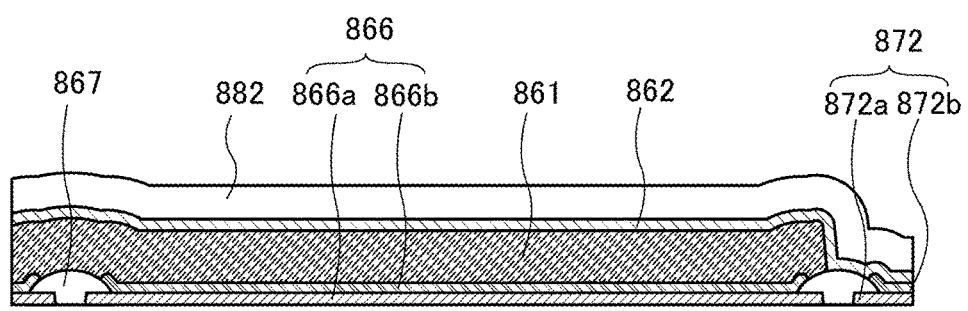
FIGS. 27A and 27B are cross-sectional views each illustrating one embodiment of a photoelectric conversion element.

The electrode 866, the wiring 872, and the like may each be a multilayer. For example, as illustrated in FIG. 27A, the electrode 866 can include two conductive layers 866a and 866b and the wiring 872 can include two conductive layers 872a and 872b. In the structure in FIG. 27A, for example, the conductive layers 866a and 872a may be made of a low-resistance metal or the like, and the conductive layers 866b and 872b may be made of a metal or the like that exhibits an excellent contact property with the photoelectric conversion layer 861. Such a structure improves the electrical properties of the photoelectric conversion element. Furthermore, even when the conductive layer 872a contains a metal that causes electrolytic corrosion, which occurs when some kinds of metal are in contact with the light-transmitting conductive layer 862, the electrolytic corrosion can be prevented because the conductive layer 872b is between the conductive layer 872a and the light-transmitting conductive layer 862.

The conductive layers 866b and 872b can be formed using, for example, molybdenum, tungsten, or the like. The conductive layers 866a and 872a can be formed using, for example, aluminum, titanium, or a stack of titanium, aluminum, and titanium that are layered in that order.

Figure 27B:
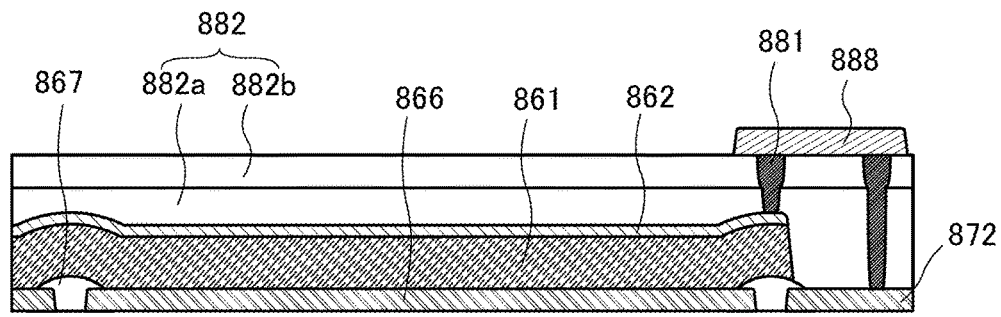

The insulating layer 882 and the like may each be a multilayer. For example, as illustrated in FIG. 27B, the conductor 881 has a difference in level in the case where the insulating layer 882 includes insulating layers 882a and 882b that have different etching rates. In the case where another insulating layer used as an interlayer insulating film or a planarization film is a multilayer, the conductor 881 also has a difference in level. Although the insulating layer 882 is formed using two layers here, the insulating layer 882 and another insulating layer may each be formed using three or more layers.

Note that the electrode 866 illustrated in FIG. 24A, FIGS. 26A to 26D, and FIG. 27B and the conductive layer 866b illustrated in FIG. 27A preferably have high planarity in order to prevent a short circuit with the light-transmitting conductive layer 862 caused by, for example, poor coverage with the photoelectric conversion layer 861. When the electrode 866 and the conductive layer 866b described above have high planarity, adhesion to the photoelectric conversion layer 861 is improved in some cases.

As an example of a conductive film having high planarity, an indium tin oxide film containing silicon at 1% to 20% can be given. The high planarity of an indium tin oxide film containing silicon has been confirmed by the measurement using an atomic force microscope. A region of 2 μm×2 μm in an indium tin oxide film which has been subjected to heat treatment at 350° C. for 1 hour and a region of 2 μm×2 μm in an indium tin oxide film containing silicon at 10% which has been subjected to the same heat treatment were observed by an atomic force microscope; the peak-to-valley height (P-V) of the former was 23.3 nm, and that of the latter was 7.9 nm.

Since the indium tin oxide film is crystallized at a relatively low temperature even when it is amorphous at the time of its deposition, surface roughness due to the growth of crystal grains is easily caused. In contrast, when the indium tin oxide film containing silicon is analyzed by an X-ray diffraction, a peak does not appear even in the case where the film has been subjected to heat treatment at a temperature higher than 400° C. In other words, the indium tin oxide film containing silicon keeps its amorphous state even after heat treatment at a relatively high temperature. Therefore, the surface roughness of the indium tin oxide film containing silicon is less likely to occur.

Note that the partition wall 867 can be formed using an inorganic insulator, an insulating organic resin, or the like. The partition wall 867 may be colored black or the like in order to shield the transistors and the like from light and/or to determine the area of a light-receiving portion in each pixel.

Alternatively, a PIN diode element formed using an amorphous silicon film, a microcrystalline silicon film, or the like may be used as the photoelectric conversion element 523.

Figure 28:
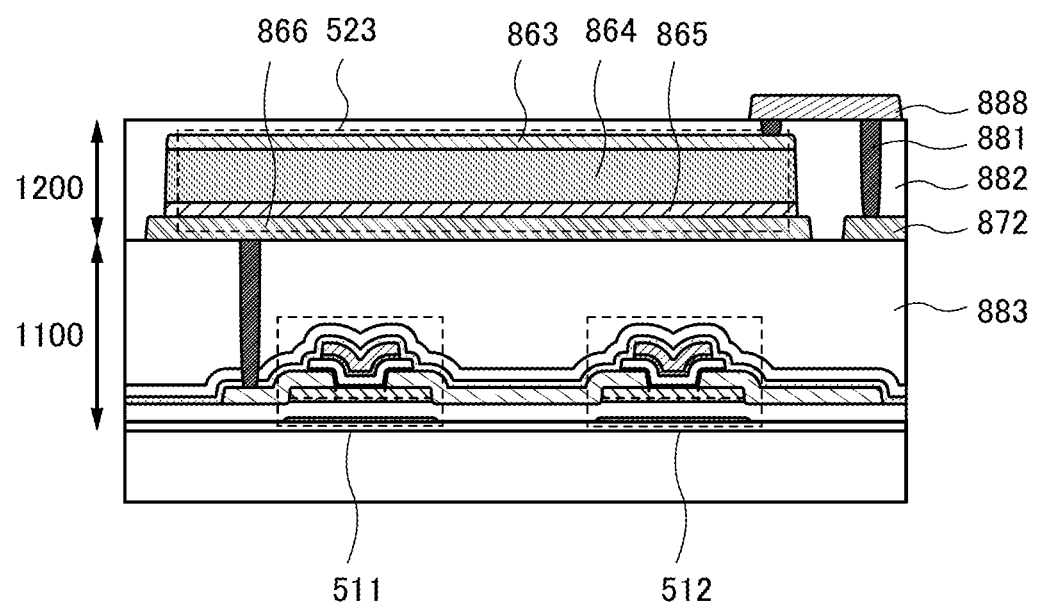
FIG. 28 is a cross-sectional view illustrating one embodiment of the present invention.

FIG. 28 illustrates an example in which a thin film PIN photodiode is used as the photoelectric conversion element 523. In the photodiode, a p-type semiconductor layer 865, an i-type semiconductor layer 864, and an n-type semiconductor layer 863 are stacked in that order. The i-type semiconductor layer 864 is preferably formed using amorphous silicon. The n-type semiconductor layer 863 and the p-type semiconductor layer 865 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element 523 in FIG. 28, the p-type semiconductor layer 865 is electrically connected to the electrode 866 that is electrically connected to the transistor 511. Furthermore, the n-type semiconductor layer 863 is electrically connected to the wiring 872 through the conductor 881.

FIGS. 29A to 29F show other examples of the structure of the photoelectric conversion element 523 having a configuration of a PIN thin film photodiode and the connection between the photoelectric conversion element 523 and the wirings. Note that the structure of the photoelectric conversion element 523 and the connection between the photoelectric conversion element 523 and the wirings are not limited thereto, and other configurations may be applied.

Figure 29A:
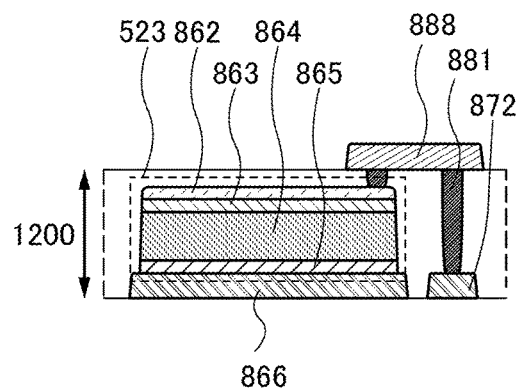
FIGS. 29A to 29F are cross-sectional views each illustrating one embodiment of a photoelectric conversion element.

FIG. 29A illustrates a structure of the photoelectric conversion element 523 that includes the light-transmitting conductive layer 862 in contact with the p-type semiconductor layer 863. The light-transmitting conductive layer 862 serves as an electrode and can increase the output current of the photoelectric conversion element 523.

For the light-transmitting conductive layer 862, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 862 is not limited to a single layer, and may be a stacked layer of different films.

Figure 29B:
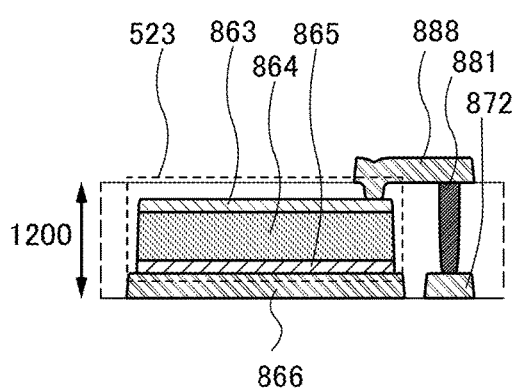

FIG. 29B illustrates a structure of the photoelectric conversion element 523 in which the n-type semiconductor layer 863 is electrically connected directly to the wiring 888.

Figure 29C:
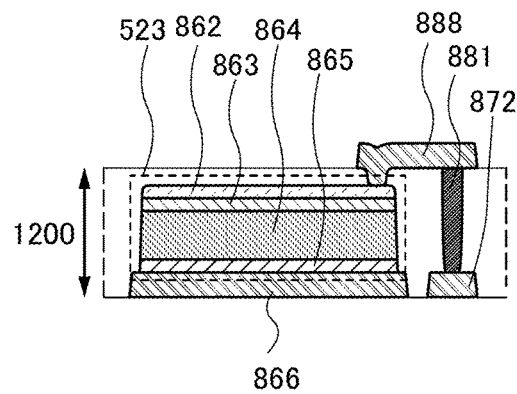

FIG. 29C illustrates a structure of the photoelectric conversion element 523 which includes the light-transmitting conductive layer 862 in contact with the n-type semiconductor layer 863 and in which the wiring 888 is electrically connected to the light-transmitting conductive layer 862.

Figure 29D:
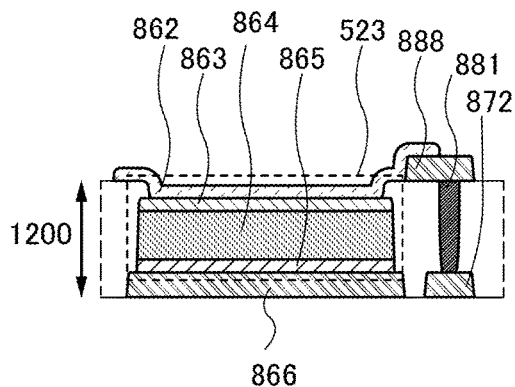

FIG. 29D illustrates a structure in which an opening exposing the n-type semiconductor layer 863 is provided in an insulating layer covering the photoelectric conversion element 523, and the light-transmitting conductive layer 862 that covers the opening is electrically connected to the wiring 888.

Figure 29E:
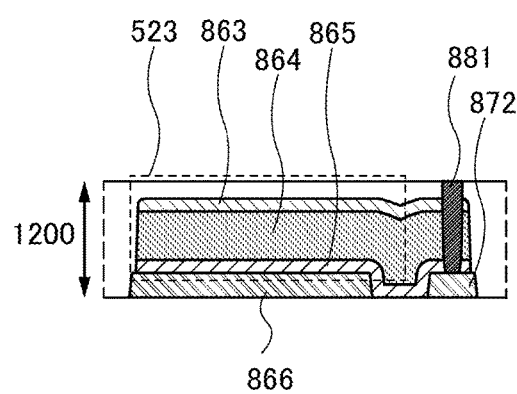

FIG. 29E illustrates a structure including the conductor 881 which penetrates the photoelectric conversion element 523. In the structure, the wiring 872 is electrically connected to the n-type semiconductor layer 863 through the conductor 81. Note that in the drawing, the wiring 872 appears to be electrically connected to the electrode 866 through the p-type semiconductor layer 865. However, because of a high resistance in the lateral direction of the p-type semiconductor layer 865, the resistance between the wiring 872 and the electrode 866 is extremely high when there is an appropriate distance therebetween. Thus, the photoelectric conversion element 523 can have diode characteristics without a short circuit between the anode and the cathode. Note that two or more conductors 881 that are electrically connected to the n-type semiconductor layer 863 may be provided.

Figure 29F:
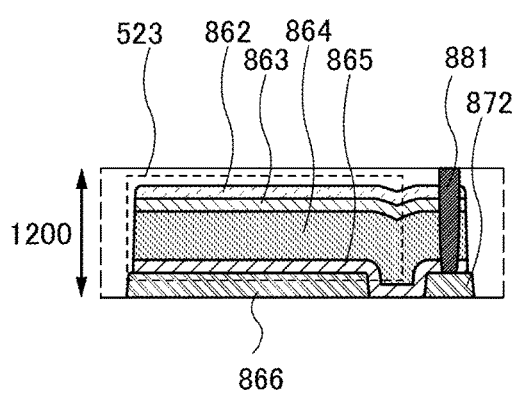

FIG. 29F illustrates a structure in which the photoelectric conversion element 523 in FIG. 29E is provided with the light-transmitting conductive layer 862 in contact with the n-type semiconductor layer 863.

Note that each of the photoelectric conversion elements 523 illustrated in FIGS. 29D to 29F has an advantage of having a large light-receiving area because wirings and the like do not overlap with a light-receiving region.

Figure 30:
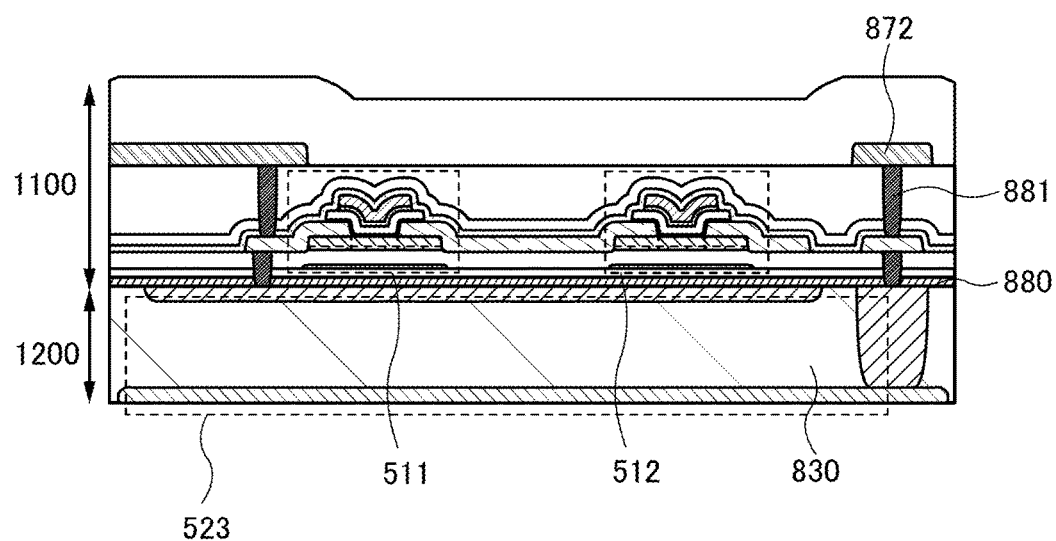
FIG. 30 is a cross-sectional view illustrating one embodiment of the present invention.

Alternatively, as illustrated in FIG. 30, the photoelectric conversion element 523 may be a photodiode including a silicon substrate 830 as a photoelectric conversion layer.

The photoelectric conversion element 523 formed using the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 861 does not need to be divided between circuits as illustrated in FIG. 24A. Therefore, the imaging device of one embodiment of the present invention can be manufactured with a high yield at low cost. In contrast, a photodiode including the silicon substrate 830 as the photoelectric conversion layer requires difficult processes such as a polishing process and a bonding process.

Figure 31A:
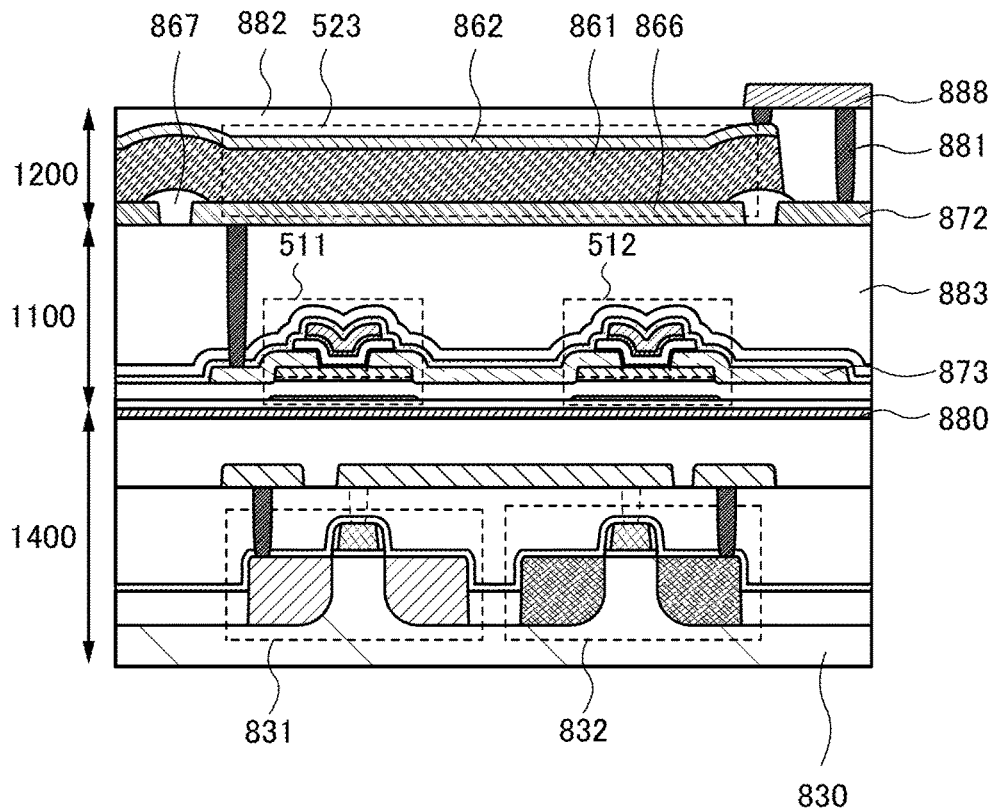
FIGS. 31A and 31B are cross-sectional views illustrating one embodiment of the present invention.
Figure 31B:
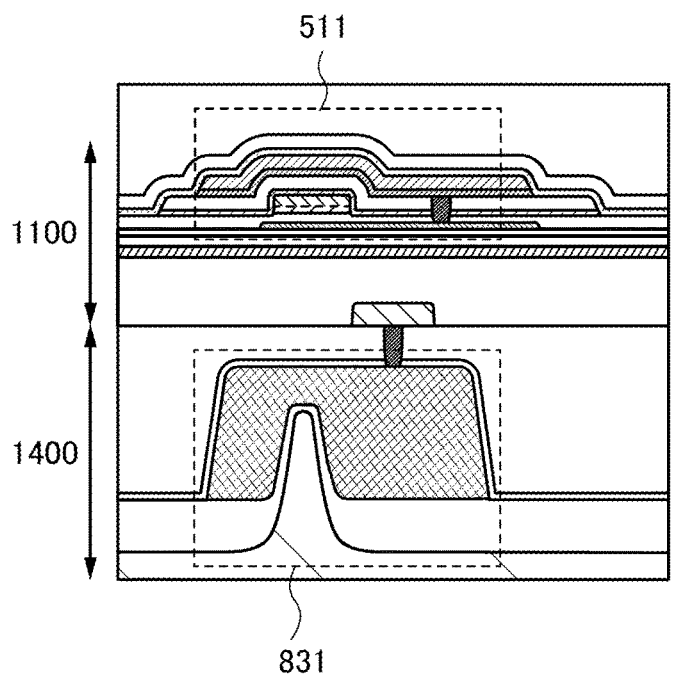

Furthermore, in the imaging device of one embodiment of the present invention, a stack including the silicon substrate 830 in which a circuit is formed may be used. For example, as illustrated in FIG. 31A, the pixel circuit may overlap with a layer 1400 that includes transistors 831 and 832 whose active regions are formed in the silicon substrate 830. FIG. 31B is a cross-sectional view illustrating the transistors in the channel width direction.

Figure 32A:
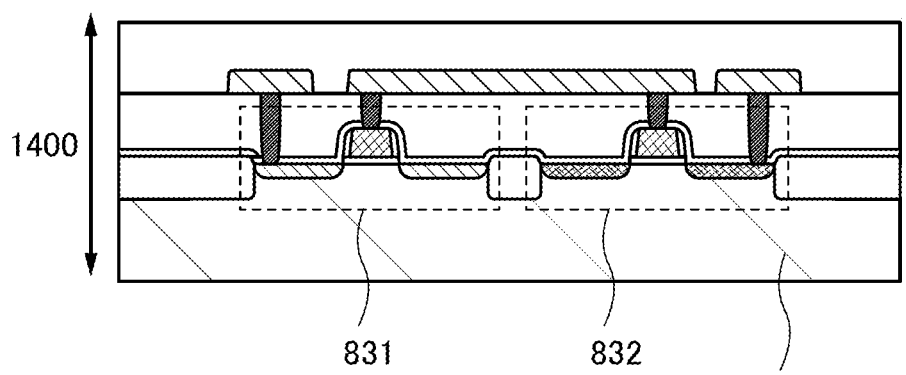
FIGS. 32A to 32C are cross-sectional views and a circuit diagram illustrating embodiments of the present invention.
Figure 32B:
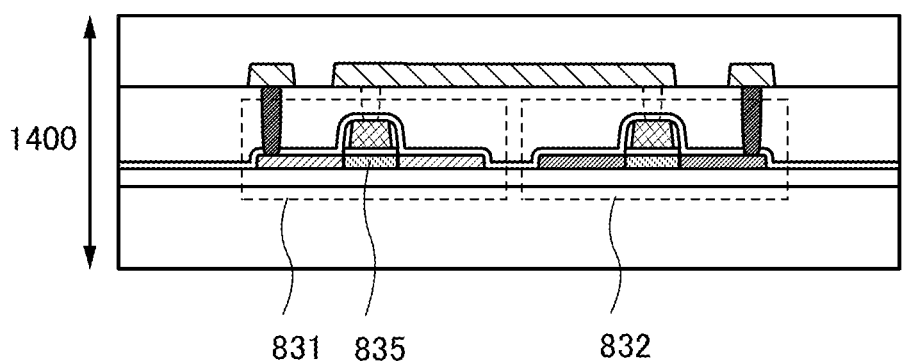

Although FIGS. 31A and 31B show the Si transistors of a fin type, the transistors may be of a planar type as illustrated in FIG. 32A. Alternatively, as illustrated in FIG. 32B, they may be transistors each including an active layer 835 formed using a silicon thin film. The active layer 835 can be formed using polycrystalline silicon or single crystal silicon of a silicon-on-insulator (SOI) structure.

Figure 32C:
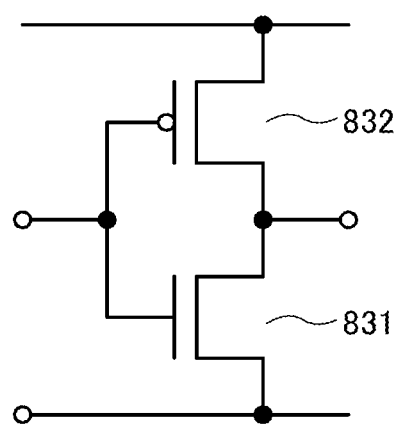

The circuit formed on the silicon substrate 830 is capable of reading a signal output from the pixel circuit and converting the signal; for example, the circuit may include a CMOS inverter as illustrated in the circuit diagram in FIG. 32C. A gate of the transistor 831 (n-channel transistor) is electrically connected to a gate of the transistor 832 (p-channel transistor). One of a source and a drain of one of the transistors 831 and 832 is electrically connected to one of a source and a drain of the other transistor. The other of the source and the drain of the one transistor is electrically connected to a wiring and the other of the source and the drain of the other transistor is electrically connected to another wiring.

The silicon substrate 830 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 30 and FIG. 31A, an insulating layer 880 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 831 and 832. Therefore, hydrogen has an effect of improving the reliability of the transistors 831 and 832. Meanwhile, hydrogen in insulating layers provided in the vicinity of the oxide semiconductor layer that is the active layer of the transistor 511 or the like causes generation of carriers in the oxide semiconductor layer, and therefore may reduce the reliability of the transistor 511 or the like. Thus, the insulating layer 880 having a function of preventing diffusion of hydrogen is preferably provided between one layer including the transistor using a silicon-based semiconductor material and another layer stacked thereon that includes the transistor using an oxide semiconductor. Hydrogen is confined in the one layer by the insulating layer 880, so that the reliability of the transistors 831 and 832 can be improved. Furthermore, diffusion of hydrogen from the one layer to the other layer is inhibited, so that the reliability of the transistor 511 or the like can also be improved.

The insulating layer 880 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 31A, a circuit (e.g., a driver circuit) formed on the silicon substrate 830, the transistor 511 or the like, and the photoelectric conversion element 523 can overlap with each other; thus, the integration degree of pixels can be increased. In other words, the resolution of the imaging device can be increased. Such a structure is suitable for an imaging device with, for example, 4K2K, 8K4K, or 16K8K pixels. Note that a structure may be employed in which Si transistors are formed as the transistor 514, the transistor 515, and the like included in the pixel 21 so as to overlap with the transistor 511 or the like and the photoelectric conversion element 523.

In the imaging device in FIG. 31A, the silicon substrate 830 is not provided with a photoelectric conversion element. Therefore, an optical path for the photoelectric conversion element 523 can be secured without being influenced by the transistors or wirings, and a pixel with a high aperture ratio can be formed.

Figure 33:
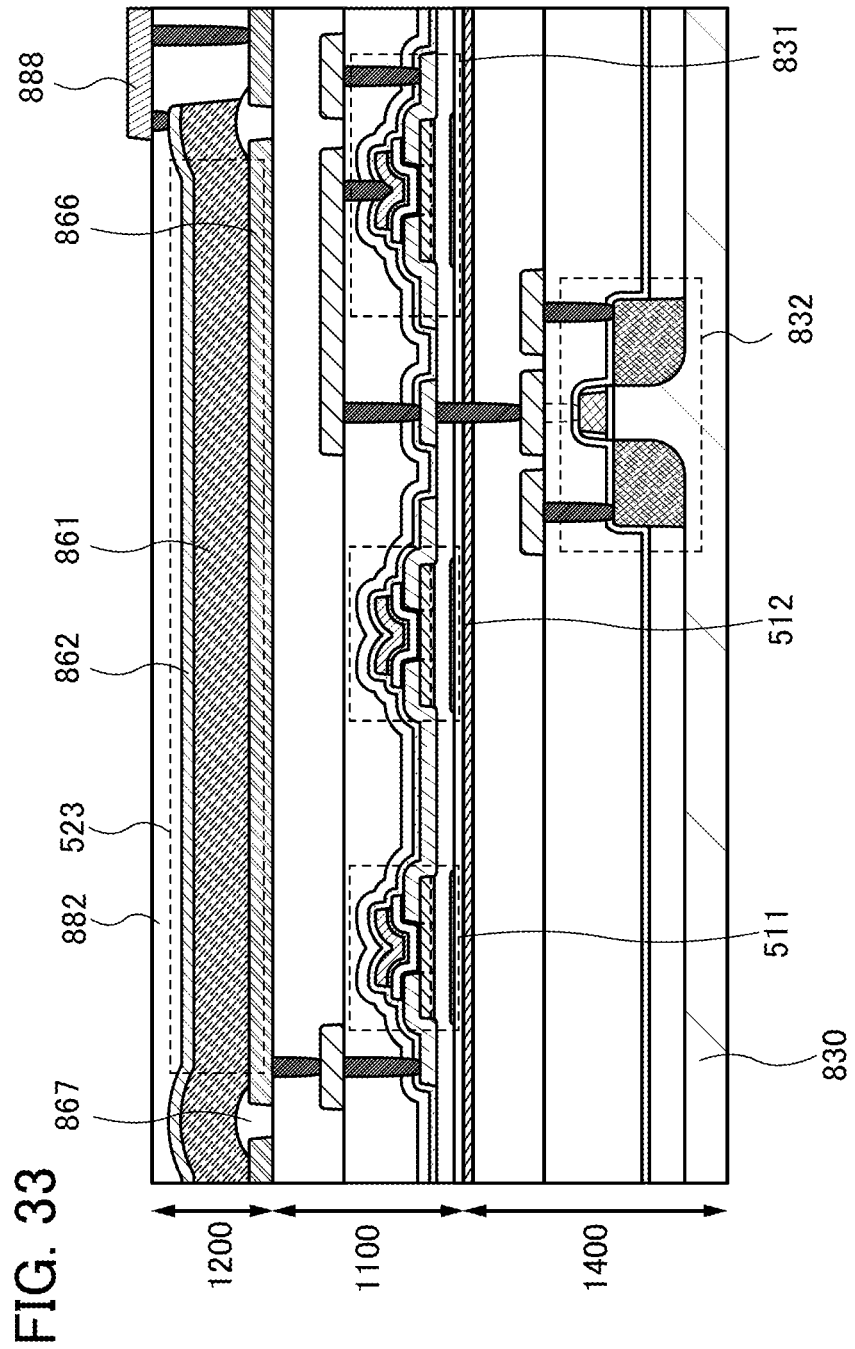
FIG. 33 is a cross-sectional view illustrating one embodiment of the present invention.

A semiconductor device of one embodiment of the present invention can also have a structure in FIG. 33.

The imaging device in FIG. 33 is a modification example of the semiconductor device in FIG. 31A. A CMOS inverter is formed using an OS transistor and a Si transistor.

Here, the transistor 832 is a p-channel Si transistor provided in the layer 1400, and the transistor 831 is an n-channel OS transistor provided in the layer 1100. When only the p-channel transistor is provided on the silicon substrate 830, a step of forming a well, an n-type impurity layer, or the like can be skipped.

Although selenium is used for the photoelectric conversion element 523 in the semiconductor device in FIG. 33, a PIN thin film photodiode may be used as in FIG. 28.

In the semiconductor device in FIG. 33, the transistor 831 can be formed through the same process as the transistors 511 and 512 formed in the layer 1100. Thus, the manufacturing process of the imaging device can be simplified.

Figure 34:
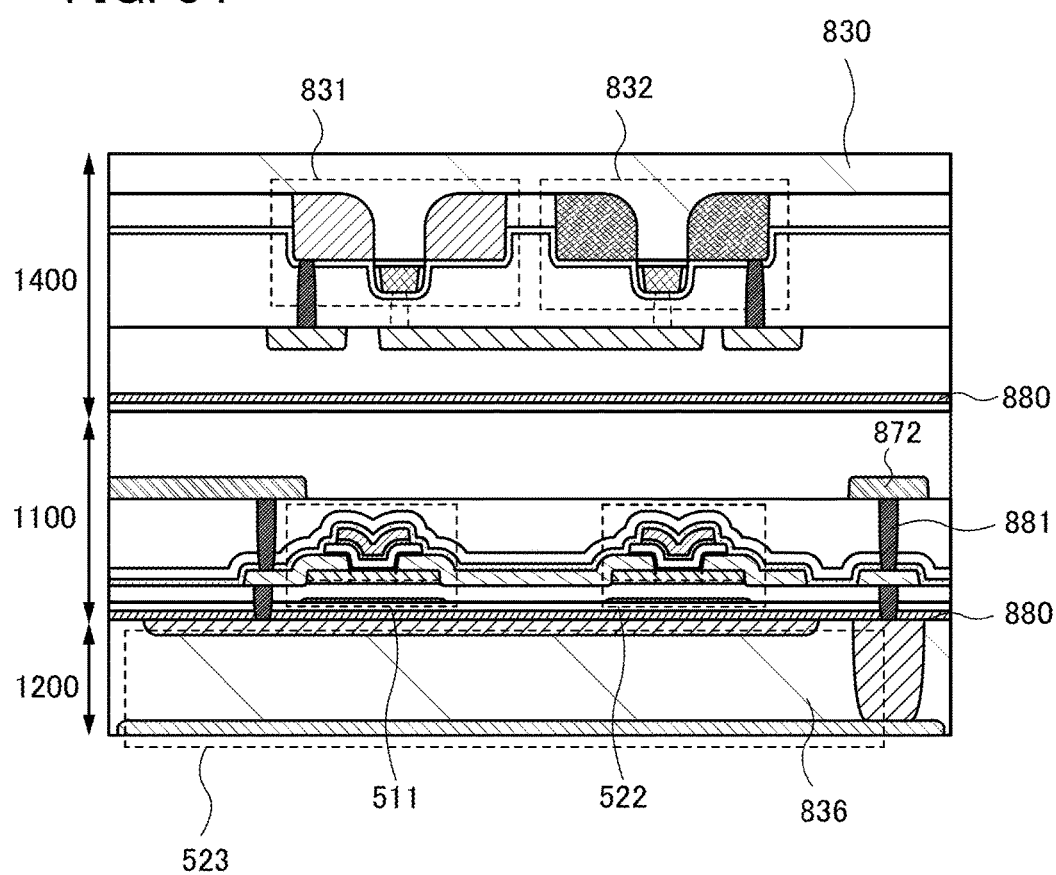
FIG. 34 is a cross-sectional view illustrating one embodiment of the present invention.

As illustrated in FIG. 34, a semiconductor device of one embodiment of the present invention may have a structure where a pixel includes a photodiode formed on a silicon substrate 836 and OS transistors formed over the photodiode and the pixel and the silicon substrate 830 on which the circuit is formed are attached to each other. Such a structure is suitable for increasing the effective area of the photodiode formed on the silicon substrate 836. Furthermore, the integration degree of the circuit formed on the silicon substrate 830 can be improved using miniaturized Si transistors; thus, a high-performance semiconductor device can be provided.

Figure 35:
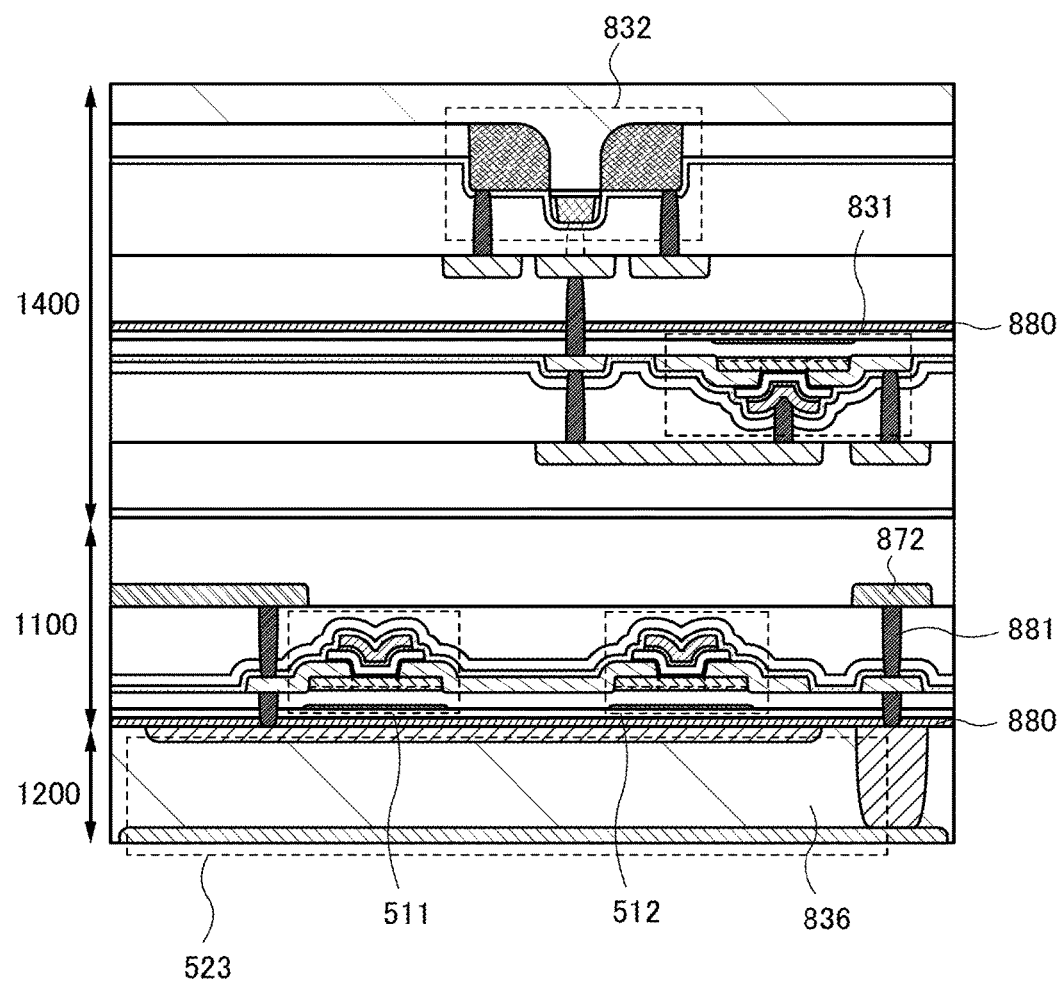
FIG. 35 is a cross-sectional view illustrating one embodiment of the present invention.

FIG. 35 and FIG. 36 each show a modification example of FIG. 34, in which a circuit includes an OS transistor and a Si transistor. Such a structure is suitable for increasing the effective area of the photodiode formed on the silicon substrate 836. Furthermore, the integration degree of the circuit formed on the silicon substrate 830 can be improved using miniaturized Si transistors; thus, a high-performance semiconductor device can be provided.

The structure illustrated in FIG. 35 is effective in the case where an image processing circuit or the like is formed because a nonvolatile memory can be formed using an OS transistor and a Si transistor on the silicon substrate 830. In the case of the structure illustrated in FIG. 35, a CMOS circuit can be formed using the OS transistor and the Si transistor on the silicon substrate 830. Since the off-state current of the OS transistor is extremely low, the static leakage current of the CMOS circuit can be extremely low.

The structure illustrated in FIG. 36 is effective in the case where an image processing circuit or the like is formed because a nonvolatile memory can be formed using an OS transistor over the silicon substrate 836 and a Si transistor on the silicon substrate 830. In the case of the structure illustrated in FIG. 36, a CMOS circuit can be formed using the OS transistor over the silicon substrate 836 and the Si transistor on the silicon substrate 830.

Note that the structure of the transistor and the photoelectric conversion element included in each of the semiconductor devices described in this embodiment is only an example. Therefore, for example, one or more of the transistors 511 to 515 may include silicon or the like in an active region or an active layer. Furthermore, one of or both the transistors 831 and 832 may include an oxide semiconductor layer as an active layer.

Figure 37A:
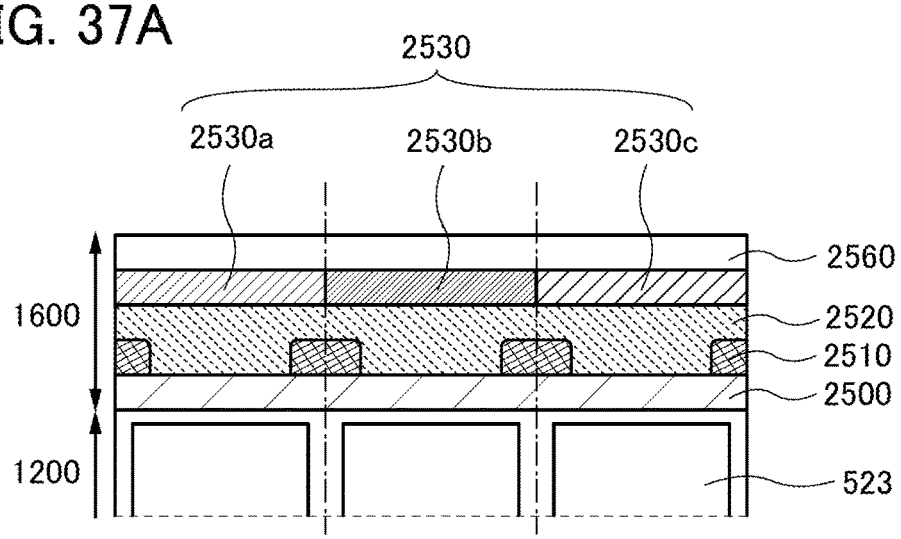
FIGS. 37A to 37C are cross-sectional views each illustrating one embodiment of the present invention.

FIG. 37A is a cross-sectional view of an example of a mode in which a color filter and the like are added to the semiconductor device. The cross-sectional view illustrates part of a region including pixel circuits for three pixels. An insulating layer 2500 is formed over the layer 1200 where the photoelectric conversion element 523 is formed. As the insulating layer 2500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed of a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (a color filter 2530a, a color filter 2530b, and a color filter 2530c) is formed in each pixel. For example, the color filter 2530a, the color filter 2530b, and the color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 37B:
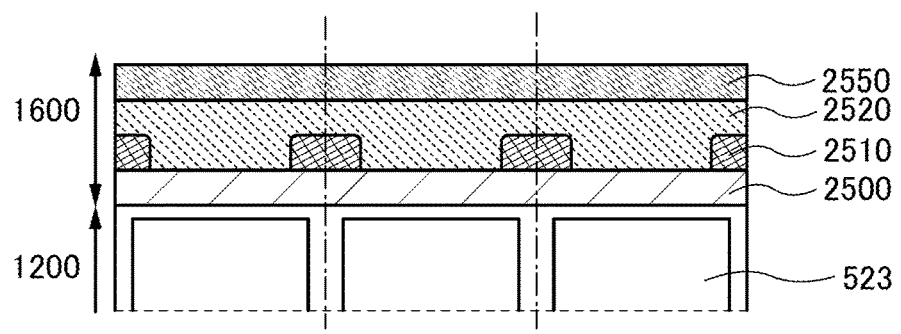

As illustrated in FIG. 37B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that takes an image visualizing the intensity of radiation and is used for an X-ray imaging device or the like can be obtained. Radiation such as X-rays passes through a subject to enter a scintillator, and then is converted into light (fluorescence) such as visible light or ultraviolet light owing to a phenomenon known as photoluminescence. Then, the photoelectric conversion element 523 detects the light to obtain image data. Furthermore, the imaging device having the structure may be used in a radiation detector or the like.

A scintillator is formed of a substance that, when irradiated with radiation such as X-rays or gamma-rays, absorbs energy of the radiation to emit visible light or ultraviolet light or a material containing the substance. Examples of the known materials include $Gd_2O_2S$:Tb, $Gd_2O_2S$:Pr, $Gd_2O_2S$:Eu, $BaFC_1$:Eu, NaI, CsI, $CaF_2$, $BaF_2$, $CeF_3$, LiF, LiI, and ZnO, and a resin or ceramics in which any of the materials is dispersed.

In the photoelectric conversion element 523 using a selenium-based material, radiation such as X-rays can be directly converted into charge; thus, the scintillator is not necessarily used.

A microlens array 2540 may be provided over the color filters 2530a, 2530b, and 2530c. Light penetrating lenses included in the microlens array 2540 goes through the color filters positioned thereunder to reach the photoelectric conversion element 523. Note that a region other than the layer 1200 in FIGS. 37A to 37C is referred to as a layer 1600.

Figure 37C:
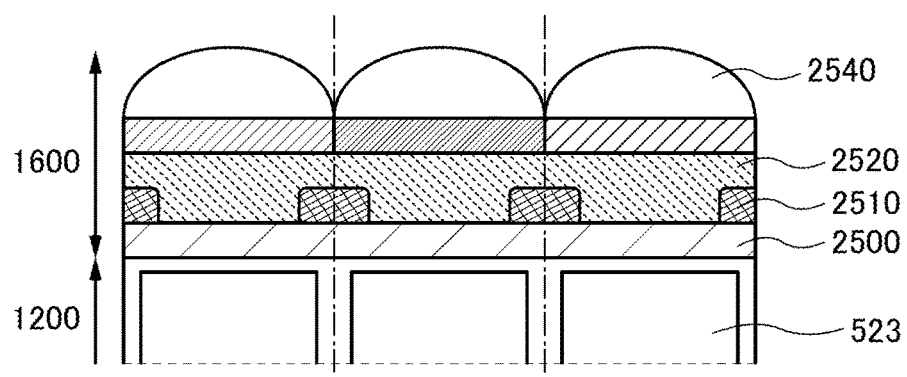
Figure 38:
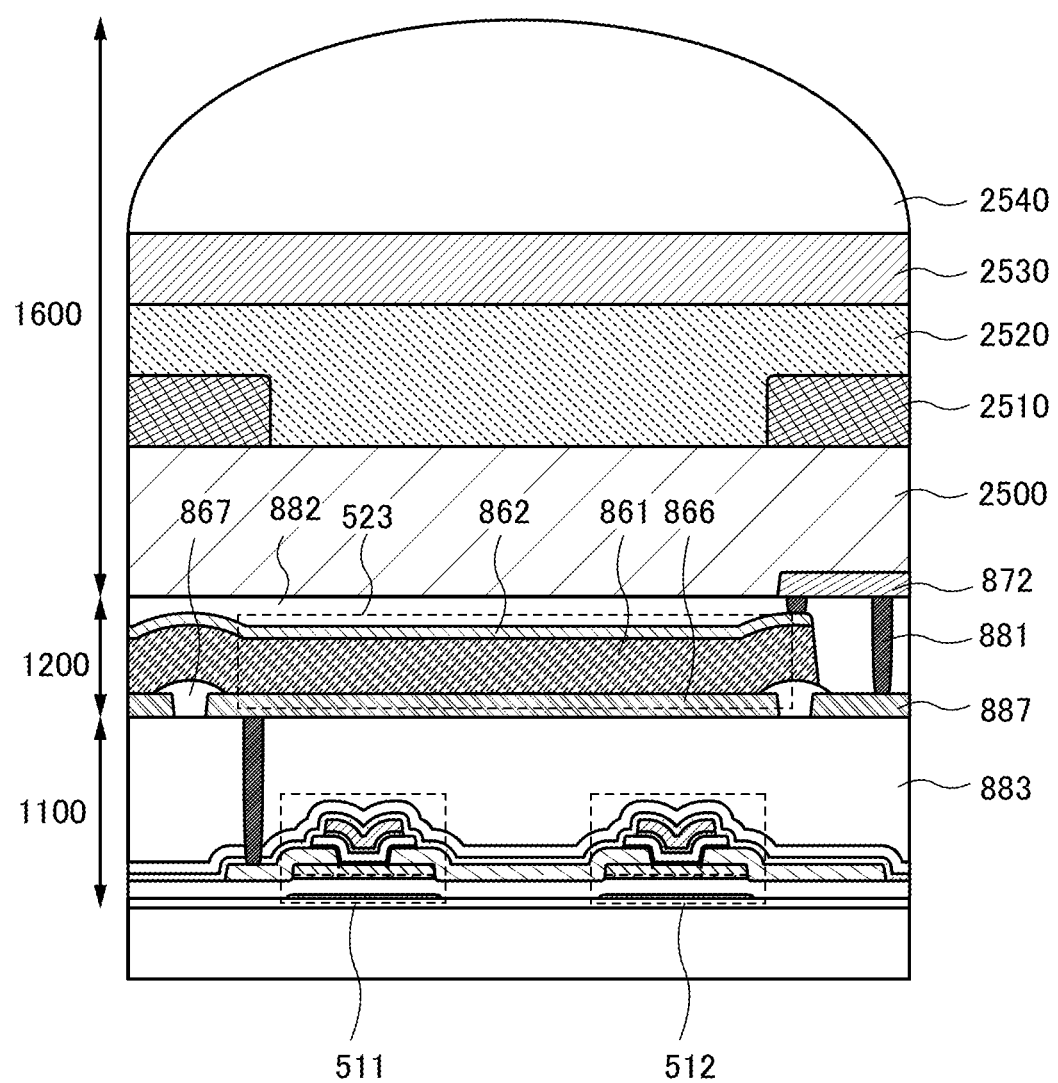
FIG. 38 is a cross-sectional view illustrating one embodiment of the present invention.
Figure 39:
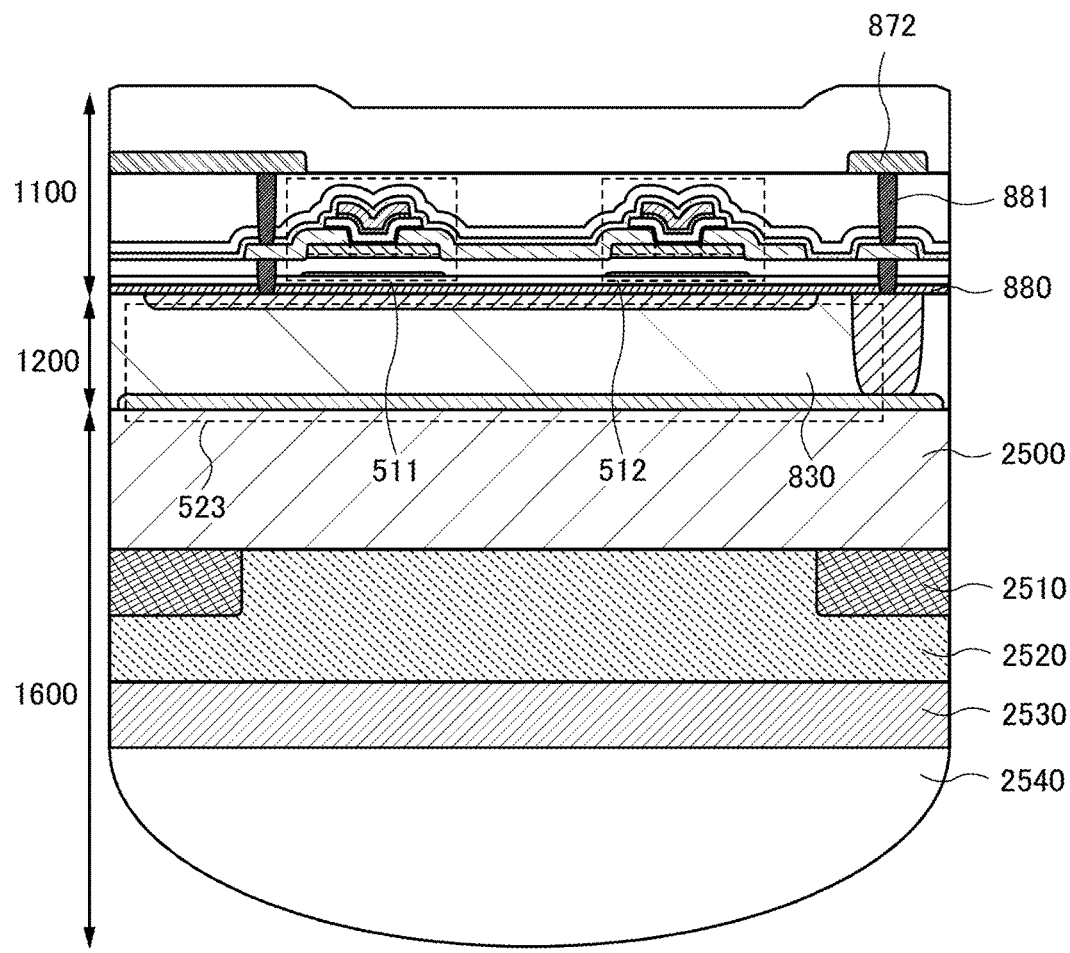
FIG. 39 is a cross-sectional view illustrating one embodiment of the present invention.

The specific structure of the imaging device in FIG. 37C is illustrated in FIG. 38 by taking an example of the semiconductor device in FIG. 24A. In addition, the specific structure of the imaging device in FIG. 37C is illustrated in FIG. 39 by taking an example of the semiconductor device in FIG. 30.

Figure 40:
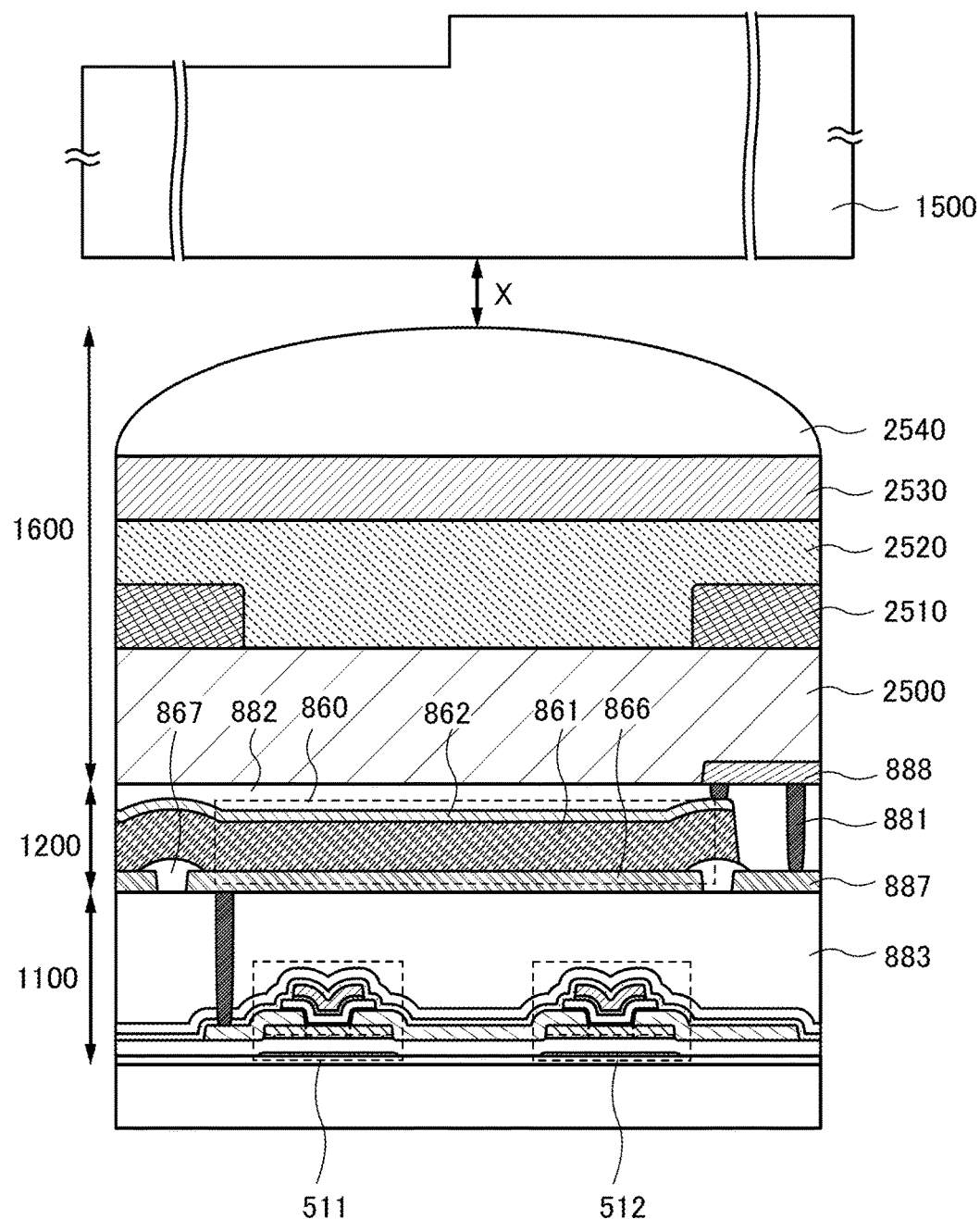
FIG. 40 is a cross-sectional view illustrating one embodiment of the present invention.
Figure 41:
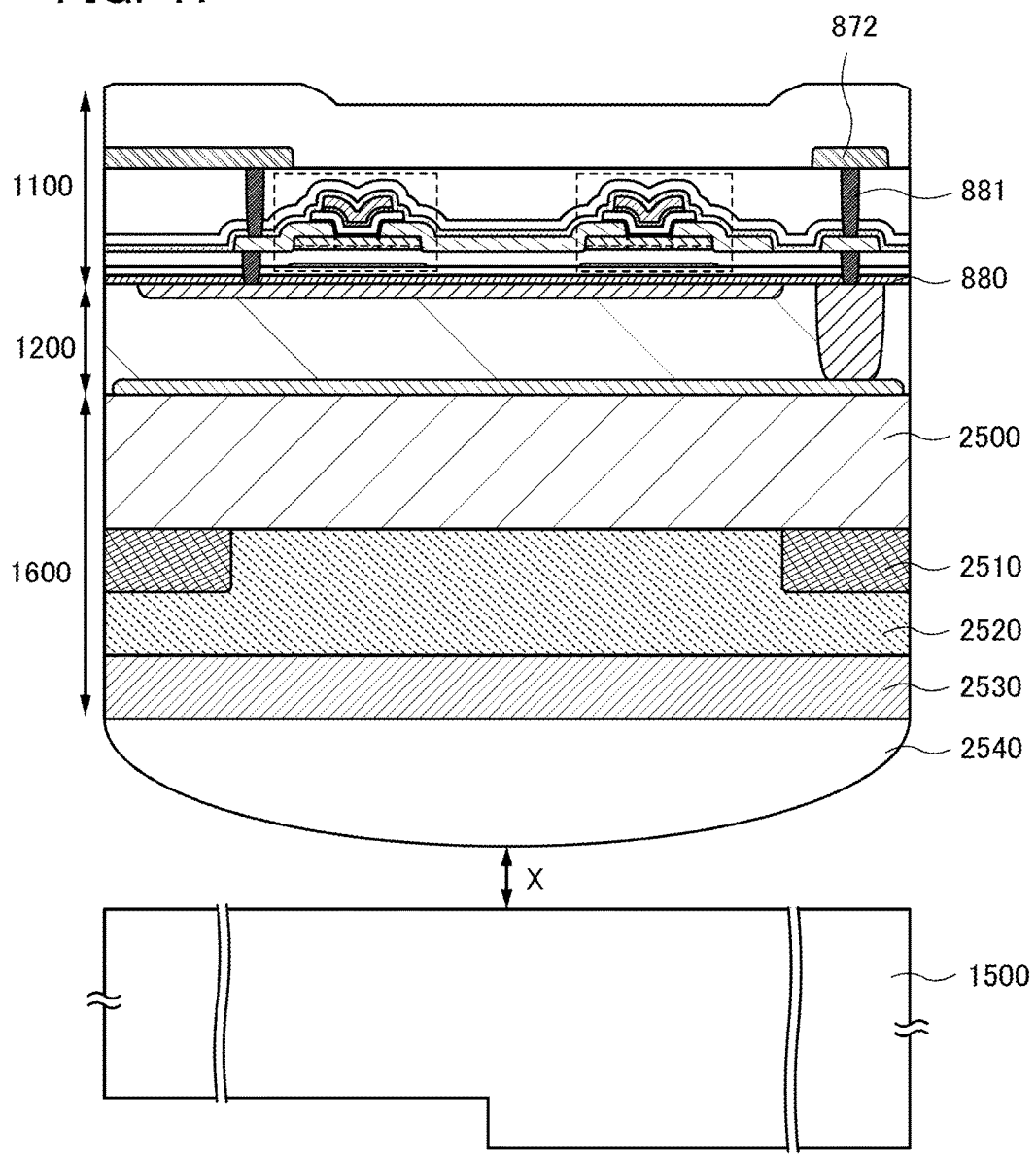
FIG. 41 is a cross-sectional view illustrating one embodiment of the present invention.

The semiconductor device of one embodiment of the present invention may be combined with a diffraction grating 1500 as illustrated in FIG. 40 and FIG. 41. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the semiconductor device.

The diffraction grating 1500 can be formed using a light-transmitting material. An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

As illustrated in FIGS. 42A1 and 42B1, the semiconductor device may be bent. FIG. 42A1 illustrates a state in which the semiconductor device is bent in the direction of dashed-two dotted line X1-X2. FIG. 42A2 is a cross-sectional view illustrating a portion indicated by dashed-two dotted line X1-X2 in FIG. 42A1. FIG. 42A3 is a cross-sectional view illustrating a portion indicated by dashed-two dotted line Y1-Y2 in FIG. 42A1.

FIG. 42B1 illustrates a state where the semiconductor device is bent in the direction of dashed-two dotted line X3-X4 and the direction of dashed-two dotted line Y3-Y4. FIG. 42B2 is a cross-sectional view illustrating a portion indicated by dashed-two dotted line X3-X4 in FIG. 42B1. FIG. 42B3 is a cross-sectional view illustrating a portion indicated by dashed-two dotted line Y3-Y4 in FIG. 42B1.

Bending the semiconductor device can reduce field curvature and astigmatism. Thus, the optical design of lens and the like, which is used in combination of the semiconductor device, can be facilitated. For example, the number of lenses used for aberration correction can be reduced; accordingly, the size or weight of semiconductor devices can be easily reduced. In addition, the quality of a captured image can be improved.

This embodiment can be combined with any of the other embodiments as appropriate.

Embodiment 8

In this embodiment, an OS transistor that can be used in one embodiment of the present invention will be described with reference to drawings. In the drawings in this embodiment, some components are enlarged, reduced in size, or omitted for easy understanding.

Figure 43A:
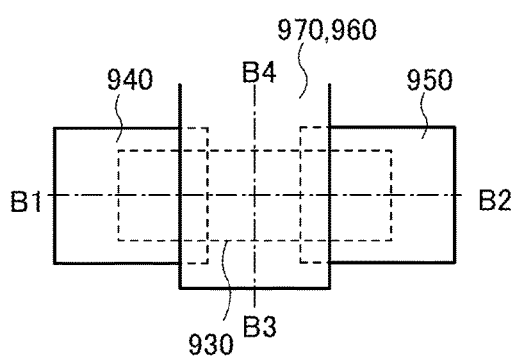
FIGS. 43A to 43F are top views and cross-sectional views illustrating transistors.
Figure 43B:
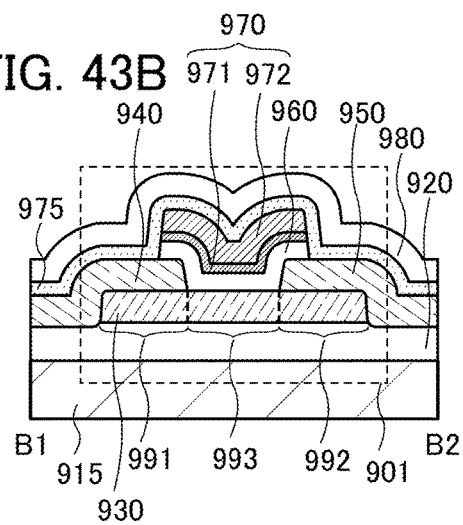
Figure 45A:
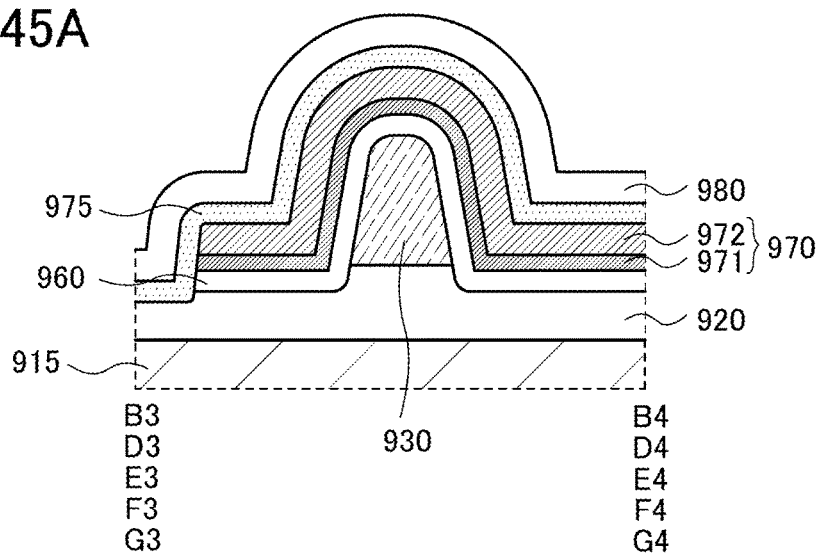
FIGS. 45A to 45D illustrates cross sections of transistors in a channel width direction.

FIGS. 43A and 43B are a top view and a cross-sectional view illustrating a transistor 901 of one embodiment of the present invention. FIG. 43A is the top view, and FIG. 43B illustrates a cross section taken along dashed-dotted line B1-B2 in FIG. 43A. A cross section in the direction of dashed-dotted line B3-B4 in FIG. 43A is illustrated in FIG. 45A. The direction of dashed-dotted line B1-B2 is referred to as a channel length direction, and the direction of dashed-dotted line B3-B4 is referred to as a channel width direction in some cases.

The transistor 901 includes an insulating layer 920 in contact with a substrate 915; an oxide semiconductor layer 930 in contact with the insulating layer 920; conductive layers 940 and 950 electrically connected to the oxide semiconductor layer 930; an insulating layer 960 in contact with the oxide semiconductor layer 930 and the conductive layers 940 and 950; a conductive layer 970 in contact with the insulating layer 960; an insulating layer 975 in contact with the conductive layers 940 and 950, the insulating layer 960, and the conductive layer 970; and an insulating layer 980 in contact with the insulating layer 975. The insulating layer 980 may function as a planarization film as necessary.

The conductive layer 940, the conductive layer 950, the insulating layer 960, and the conductive layer 970 can function as a source electrode layer, a drain electrode layer, a gate insulating film, and a gate electrode layer, respectively.

A region 991, a region 992, and a region 993 in FIG. 43B can function as a source region, a drain region, and a channel formation region, respectively. The region 991 and the region 992 are in contact with the conductive layer 940 and the conductive layer 950, respectively. When a conductive material that is easily bonded to oxygen is used for the conductive layers 940 and 950, the resistance of the regions 991 and 992 can be reduced.

Specifically, since the oxide semiconductor layer 930 is in contact with the conductive layers 940 and 950, an oxygen vacancy is generated in the oxide semiconductor layer 930, and interaction between the oxygen vacancy and hydrogen that remains in the oxide semiconductor layer 930 or diffuses into the oxide semiconductor layer 930 from the outside changes the regions 991 and 992 to n-type regions with low resistance.

The conductive layer 970 includes two layers, a conductive layer 971 and a conductive layer 972, in the drawing, but also may be a single layer or a stack of three or more layers. The same applies to other transistors described in this embodiment.

Each of the conductive layers 940 and 950 is a single layer in the drawing, but also may be a stack of two or more layers. The same applies to other transistors described in this embodiment.

Figure 43C:
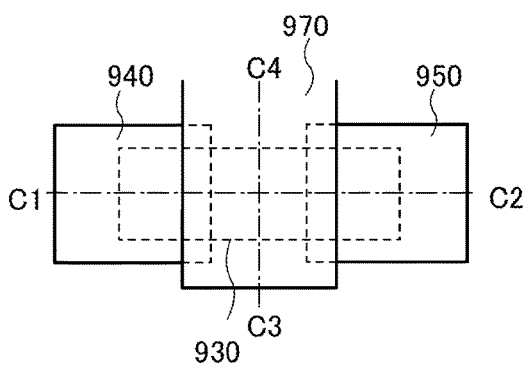
Figure 43D:
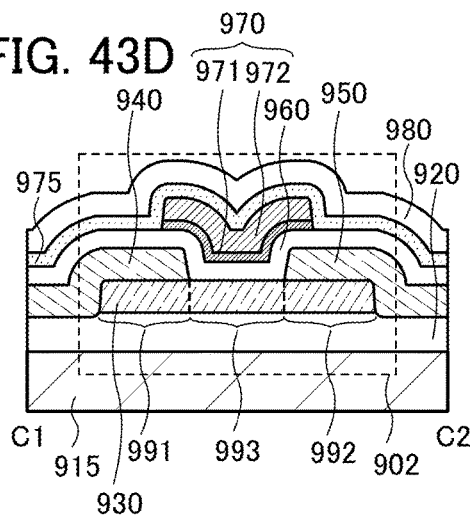
Figure 45B:
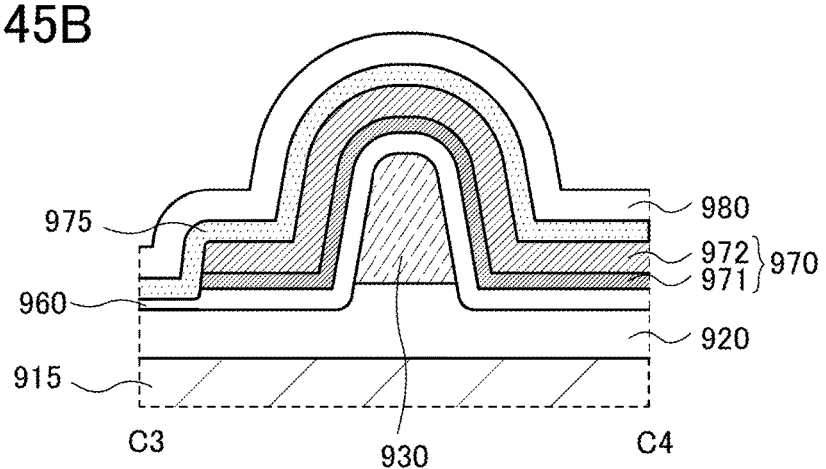

The transistor in one embodiment of the present invention may have a structure illustrated in FIGS. 43C and 43D. FIG. 43C is a top view of a transistor 102. A cross section in the direction of dashed-dotted line C1-C2 in FIG. 43C is illustrated in FIG. 43D. A cross section in the direction of dashed-dotted line C3-C4 in FIG. 43C is illustrated in FIG. 45B. The direction of dashed-dotted line C1-C2 is referred to as a channel length direction, and the direction of dashed-dotted line C3-C4 is referred to as a channel width direction in some cases.

The transistor 902 has the same structure as the transistor 901 except that an end portion of the insulating layer 960 functioning as a gate insulating film is not aligned with an end portion of the conductive layer 970 functioning as a gate electrode layer. In the transistor 902, wide areas of the conductive layers 940 and 950 are covered with the insulating layer 960 and accordingly the resistance between the conductive layer 970 and the conductive layers 940 and 950 is high; therefore, the transistor 902 has a feature of low gate leakage current.

The transistors 901 and 902 each have a top-gate structure including a region where the conductive layer 970 overlaps with the conductive layers 940 and 950. To reduce parasitic capacitance, the width of the region in the channel length direction is preferably greater than or equal to 3 nm and less than 300 nm. Since an offset region is not formed in the oxide semiconductor layer 930 in this structure, a transistor with a high on-state current can be easily formed.

Figure 43E:
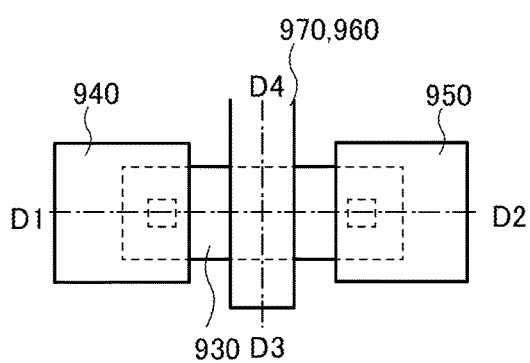
Figure 43F:
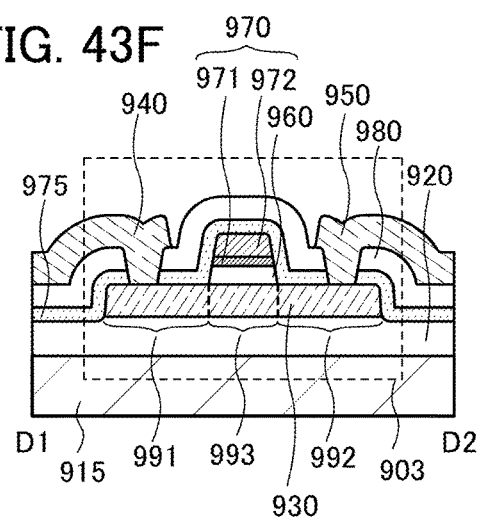

The transistor in one embodiment of the present invention may have a structure illustrated in FIGS. 43E and 43F. FIG. 43E is a top view of a transistor 903. A cross section in the direction of dashed-dotted line D1-D2 in FIG. 43E is illustrated in FIG. 43F. A cross section in the direction of dashed-dotted line D3-D4 in FIG. 43E is illustrated in FIG. 45A. The direction of dashed-dotted line D1-D2 is referred to as a channel length direction, and the direction of dashed-dotted line D3-D4 is referred to as a channel width direction in some cases.

The transistor 903 includes the insulating layer 920 in contact with the substrate 915; the oxide semiconductor layer 930 in contact with the insulating layer 920; the insulating layer 960 in contact with the oxide semiconductor layer 930; the conductive layer 970 in contact with the insulating layer 960; the insulating layer 975 covering the oxide semiconductor layer 930, the insulating layer 960, and the conductive layer 970; the insulating layer 980 in contact with the insulating layer 975; and the conductive layers 940 and 950 electrically connected to the oxide semiconductor layer 930 through openings provided in the insulating layers 975 and 980. The transistor 903 may further include, for example, an insulating layer (planarization film) in contact with the insulating layer 980 and the conductive layers 940 and 950 as necessary.

The conductive layer 940, the conductive layer 950, the insulating layer 960, and the conductive layer 970 can function as a source electrode layer, a drain electrode layer, a gate insulating film, and a gate electrode layer, respectively.

The region 991, the region 992, and the region 993 in FIG. 43F can function as a source region, a drain region, and a channel formation region, respectively. The regions 991 and 992 are in contact with the insulating layer 975. When an insulating material containing hydrogen is used for the insulating layer 975, for example, the resistance of the regions 991 and 992 can be reduced.

Specifically, interaction between an oxygen vacancy generated in the regions 991 and 992 by the steps up to formation of the insulating layer 975 and hydrogen that diffuses into the regions 991 and 992 from the insulating layer 975 changes the regions 991 and 992 to n-type regions with low resistance. As the insulating material containing hydrogen, for example, silicon nitride, aluminum nitride, or the like can be used.

Figure 44A:
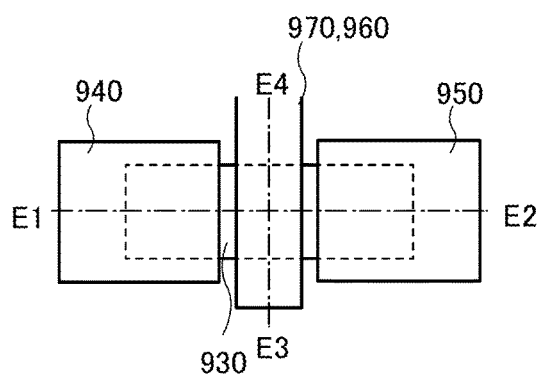
FIGS. 44A to 44F are top views and cross-sectional views illustrating transistors.
Figure 44B:
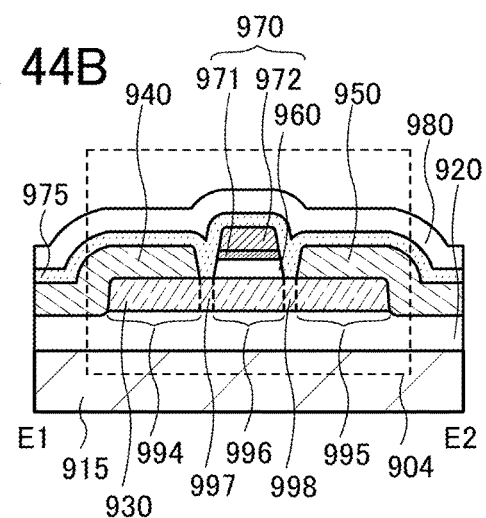

The transistor in one embodiment of the present invention may have a structure illustrated in FIGS. 44A and 44B. FIG. 44A is a top view of a transistor 904. A cross section in the direction of dashed-dotted line E1-E2 in FIG. 44A is illustrated in FIG. 44B. A cross section in the direction of dashed-dotted line E3-E4 in FIG. 44A is illustrated in FIG. 45A. The direction of dashed-dotted line E1-E2 is referred to as a channel length direction, and the direction of dashed-dotted line E3-E4 is referred to as a channel width direction in some cases.

The transistor 904 has the same structure as the transistor 903 except that the conductive layers 940 and 950 in contact with the oxide semiconductor layer 930 cover end portions of the oxide semiconductor layer 930.

In FIG. 44B, regions 994 and 997 can function as a source region, regions 995 and 998 can function as a drain region, and a region 996 can function as a channel formation region.

The resistance of the regions 994 and 995 can be reduced in a manner similar to that of the regions 991 and 992 in the transistor 901.

The resistance of the regions 997 and 998 can be reduced in a manner similar to that of the regions 991 and 992 in the transistor 903. In the case where the length of the regions 997 and 998 in the channel length direction is less than or equal to 100 nm, preferably less than or equal to 50 nm, a gate electric field prevents a significant decrease in on-state current. Therefore, a reduction in resistance of the regions 997 and 998 is not performed in some cases.

The transistors 903 and 904 each have a self-aligned structure that does not include a region where the conductive layer 970 overlaps with the conductive layers 940 and 950. A transistor with a self-aligned structure, which has extremely low parasitic capacitance between a gate electrode layer and source and drain electrode layers, is suitable for applications that require high-speed operation.

Figure 44C:
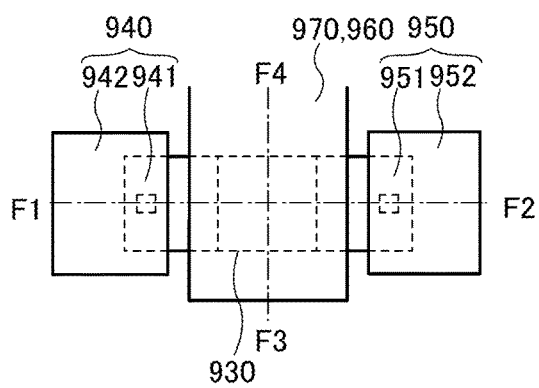
Figure 44D:
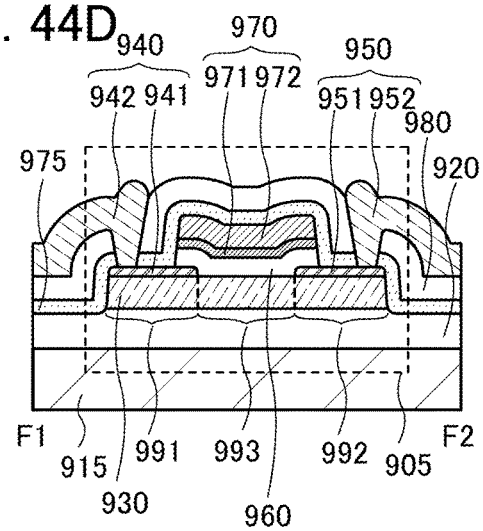

The transistor in one embodiment of the present invention may have a structure illustrated in FIGS. 44C and 44D. FIG. 44C is a top view of a transistor 905. A cross section in the direction of dashed-dotted line F1-F2 in FIG. 44C is illustrated in FIG. 44D. A cross section in the direction of dashed-dotted line F3-F4 in FIG. 44C is illustrated in FIG. 45A. The direction of dashed-dotted line F1-F2 is referred to as a channel length direction, and the direction of dashed-dotted line F3-F4 is referred to as a channel width direction in some cases.

The transistor 905 includes the insulating layer 920 in contact with the substrate 915; the oxide semiconductor layer 930 in contact with the insulating layer 920; conductive layers 941 and 951 electrically connected to the oxide semiconductor layer 930; the insulating layer 960 in contact with the oxide semiconductor layer 930 and the conductive layers 941 and 951; the conductive layer 970 in contact with the insulating layer 960; the insulating layer 975 in contact with the oxide semiconductor layer 930, the conductive layers 941 and 951, the insulating layer 960, and the conductive layer 970; the insulating layer 980 in contact with the insulating layer 975; and conductive layers 942 and 952 electrically connected to the conductive layers 941 and 951, respectively, through openings provided in the insulating layers 975 and 980. The transistor 905 may further include, for example, an insulating layer in contact with the insulating layer 980 and the conductive layers 942 and 952 as necessary.

The conductive layers 941 and 951 are in contact with the top surface of the oxide semiconductor layer 930 and are not in contact with side surfaces of the oxide semiconductor layer 930.

The transistor 905 has the same structure as the transistor 901 except that the conductive layers 941 and 951 are provided, that openings are provided in the insulating layers 975 and 980, and that the conductive layers 942 and 952 electrically connected to the conductive layers 941 and 951, respectively, through the openings are provided. The conductive layer 940 (the conductive layers 941 and 942) can function as a source electrode layer, and the conductive layer 950 (the conductive layers 951 and 952) can function as a drain electrode layer.

Figure 44E:
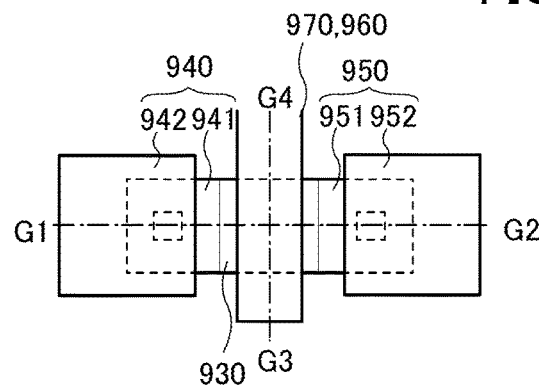
Figure 44F:
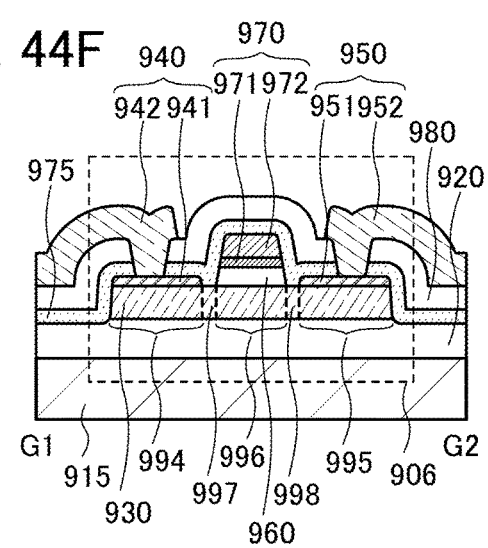

The transistor in one embodiment of the present invention may have a structure illustrated in FIGS. 44E and 44F. FIG. 44E is a top view of a transistor 906. A cross section in the direction of dashed-dotted line G1-G2 in FIG. 44E is illustrated in FIG. 44F. A cross section in the direction of dashed-dotted line G3-G4 in FIG. 44A is illustrated in FIG. 45A. The direction of dashed-dotted line G1-G2 is referred to as a channel length direction, and the direction of dashed-dotted line G3-G4 is referred to as a channel width direction in some cases.

The transistor 906 includes the insulating layer 920 in contact with the substrate 915; the oxide semiconductor layer 930 in contact with the insulating layer 920; the conductive layers 941 and 951 electrically connected to the oxide semiconductor layer 930; the insulating layer 960 in contact with the oxide semiconductor layer 930; the conductive layer 970 in contact with the insulating layer 960; the insulating layer 975 in contact with the insulating layer 920, the oxide semiconductor layer 930, the conductive layers 941 and 951, the insulating layer 960, and the conductive layer 970; the insulating layer 980 in contact with the insulating layer 975; and the conductive layers 942 and 952 electrically connected to the conductive layers 941 and 951, respectively, through openings provided in the insulating layers 975 and 980. The transistor 906 may further include, for example, an insulating layer (planarization film) in contact with the insulating layer 980 and the conductive layers 942 and 952 as necessary.

The conductive layers 941 and 951 are in contact with the top surface of the oxide semiconductor layer 930 and are not in contact with side surfaces of the oxide semiconductor layer 930.

The transistor 906 has the same structure as the transistor 903 except that the conductive layers 941 and 951 are provided. The conductive layer 940 (the conductive layers 941 and 942) can function as a source electrode layer, and the conductive layer 950 (the conductive layers 951 and 952) can function as a drain electrode layer.

In the structures of the transistors 905 and 906, the conductive layers 940 and 950 are not in contact with the insulating layer 920. These structures make the insulating layer 920 less likely to be deprived of oxygen by the conductive layers 940 and 950 and facilitate oxygen supply from the insulating layer 920 to the oxide semiconductor layer 930.

An impurity for forming an oxygen vacancy to increase conductivity may be added to the regions 991 and 992 in the transistor 903 and the regions 997 and 998 in the transistors 904 and 906. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 45C:
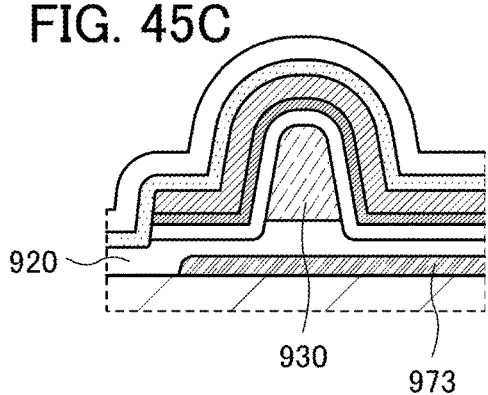
Figure 45D:
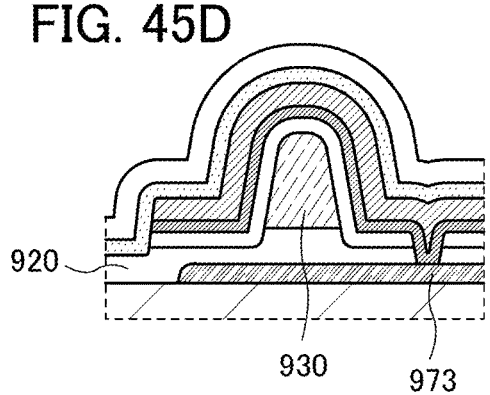
Figure 46A:
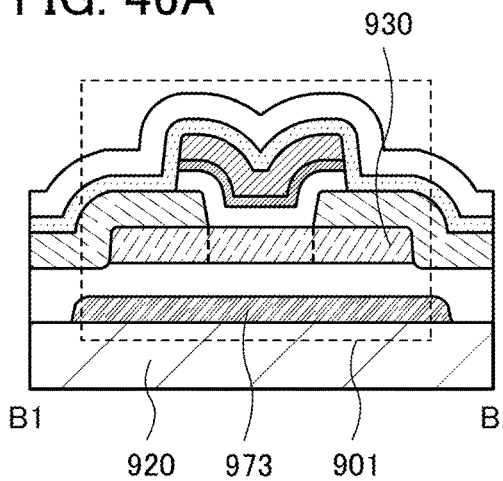
FIGS. 46A to 46F illustrate cross sections of transistors in a channel length direction.
Figure 46B:
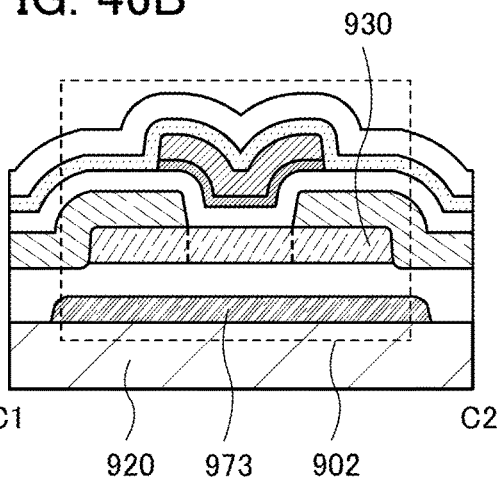
Figure 46C:
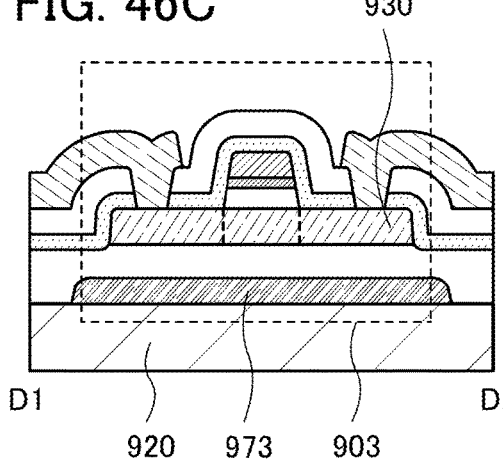
Figure 46D:
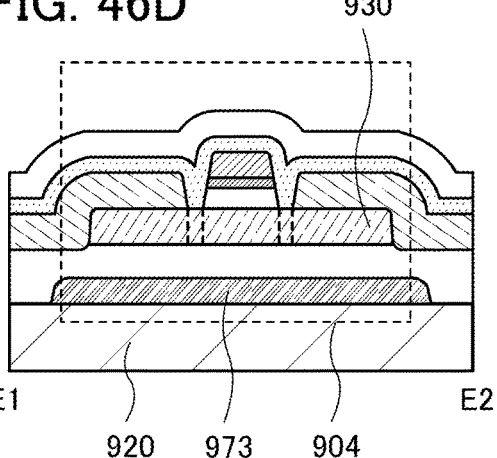
Figure 46E:
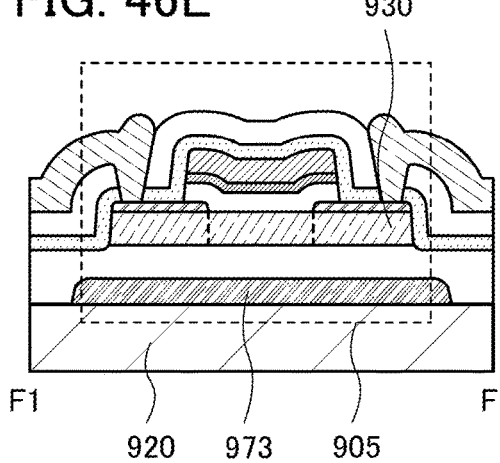
Figure 46F:
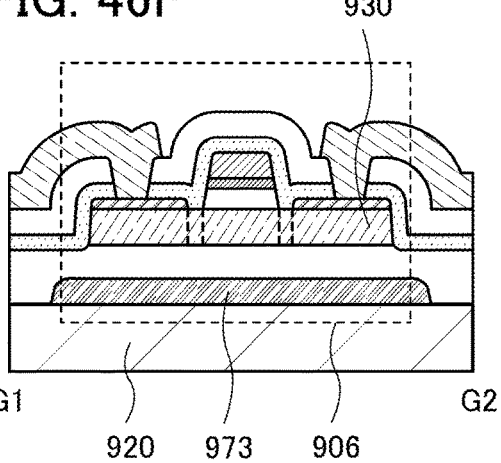

The transistor in one embodiment of the present invention may include a conductive layer 973 between the oxide semiconductor layer 930 and the substrate 915 as illustrated in cross-sectional views in the channel length direction in FIGS. 46A to 46F and cross-sectional views in the channel width direction in FIGS. 45C and 45D. When the conductive layer 973 is used as a second gate electrode layer (back gate), the on-state current can be increased or the threshold voltage can be controlled. In the cross-sectional views in FIGS. 46A to 46F, the width of the conductive layer 973 may be shorter than that of the oxide semiconductor layer 930. Moreover, the width of the conductive layer 973 may be shorter than that of the conductive layer 970.

In order to increase the on-state current, for example, the conductive layers 970 and 973 are made to have the same potential, and the transistor is driven as a double-gate transistor. Furthermore, in order to control the threshold voltage, a fixed potential that is different from the potential of the conductive layer 970 is applied to the conductive layer 973. To set the conductive layers 970 and 973 at the same potential, for example, as illustrated in FIG. 45D, the conductive layers 970 and 973 may be electrically connected to each other through a contact hole.

Although the transistors 901 to 906 in FIGS. 43A to 43F and FIGS. 44A to 44F are examples in which the oxide semiconductor layer 930 is a single layer, the oxide semiconductor layer 930 may be a stacked layer. The oxide semiconductor layer 930 in the transistors 901 to 906 can be replaced with the oxide semiconductor layer 930 in FIGS. 47B and 47C or FIGS. 47D and 47E.

Figure 47A:
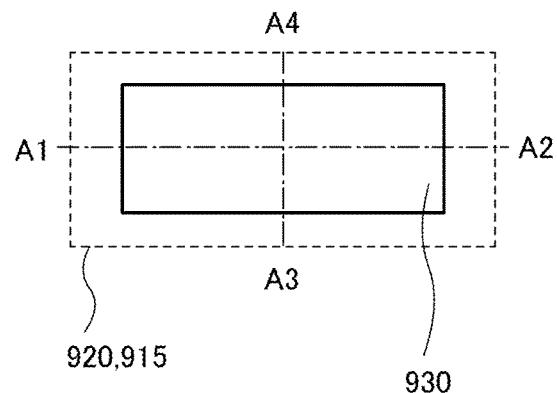
FIGS. 47A to 47E are a top view and cross-sectional views illustrating semiconductor layers.
Figure 47B:
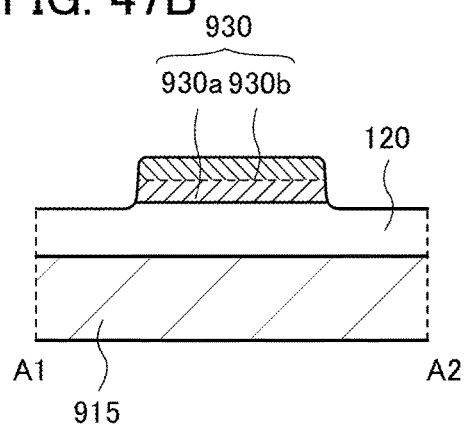
Figure 47D:
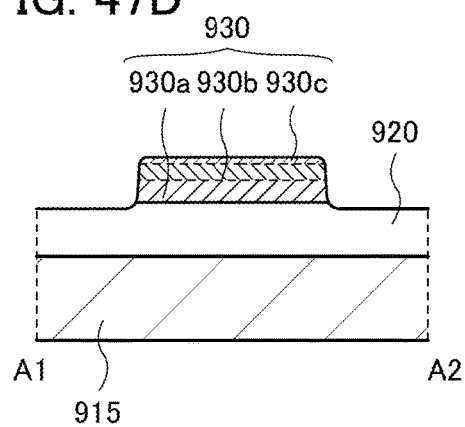
Figure 47C:
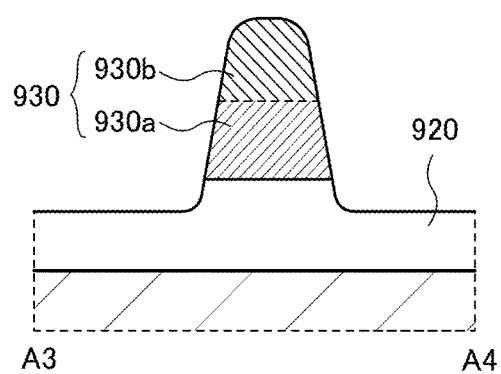
Figure 47E:
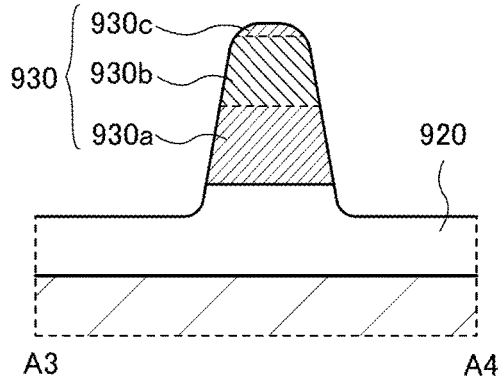

FIG. 47A is a top view of the oxide semiconductor layer 930, and FIGS. 47B and 47C are cross-sectional views of the oxide semiconductor layer 930 with a two-layer structure. FIGS. 47D and 47E are cross-sectional views of the oxide semiconductor layer 930 with a three-layer structure.

Oxide semiconductor layers with different compositions, for example, can be used as an oxide semiconductor layer 930a, an oxide semiconductor layer 930b, and an oxide semiconductor layer 930c.

Figure 48A:
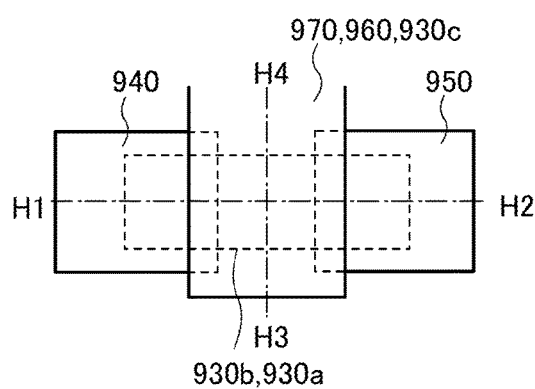
FIGS. 48A to 48F are top views and cross-sectional views of transistors.
Figure 48B:
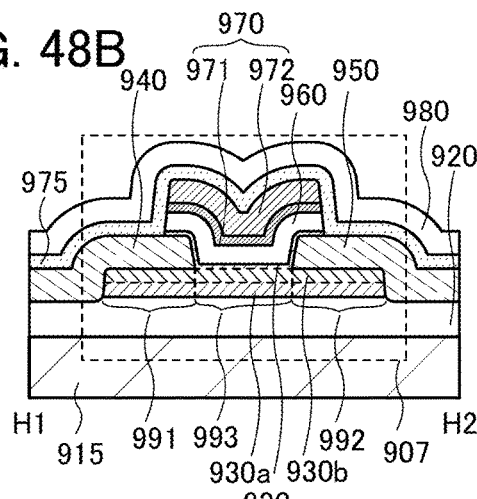
Figure 50A:
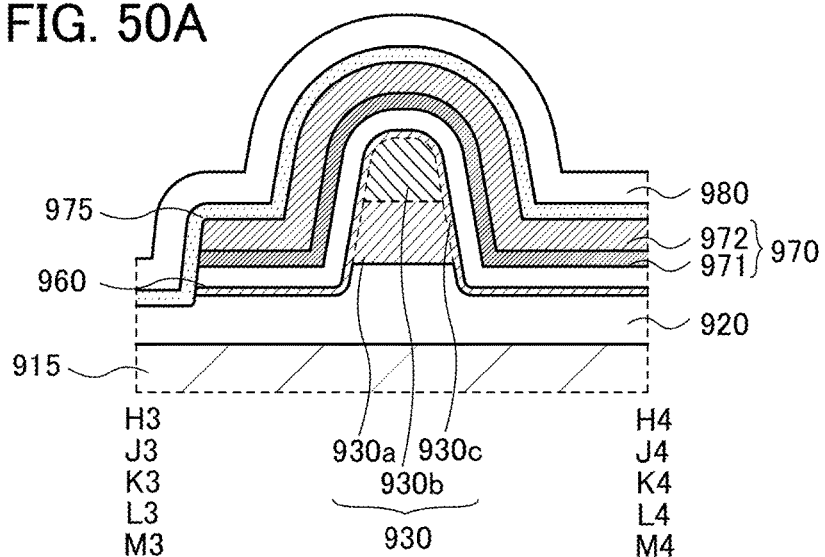
FIGS. 50A to 50D illustrate cross sections of transistors in a channel width direction.

The transistor in one embodiment of the present invention may have a structure illustrated in FIGS. 48A and 48B. FIG. 48A is a top view of a transistor 907. A cross section in the direction of dashed-dotted line H1-H2 in FIG. 48A is illustrated in FIG. 48B. A cross section in the direction of dashed-dotted line H3-H4 in FIG. 48A is illustrated in FIG. 50A. The direction of dashed-dotted line H1-H2 is referred to as a channel length direction, and the direction of dashed-dotted line H3-H4 is referred to as a channel width direction in some cases.

The transistor 907 includes the insulating layer 920 in contact with the substrate 915; a stack of the oxide semiconductor layers 930a and 930b in contact with the insulating layer 920; the conductive layers 940 and 950 electrically connected to the stack; the oxide semiconductor layer 930c in contact with the stack and the conductive layers 940 and 950; the insulating layer 960 in contact with the oxide semiconductor layer 930c; the conductive layer 970 in contact with the insulating layer 960; the insulating layer 975 in contact with the conductive layers 940 and 950, the oxide semiconductor layer 930c, the insulating layer 960, and the conductive layer 970; and the insulating layer 980 in contact with the insulating layer 975. The insulating layer 980 may function as a planarization film as necessary.

The transistor 907 has the same structure as the transistor 901 except that the oxide semiconductor layer 930 includes two layers (the oxide semiconductor layers 930a and 930b) in the regions 991 and 992, that the oxide semiconductor layer 930 includes three layers (the oxide semiconductor layers 930a to 930c) in the region 993, and that part of the oxide semiconductor layer (the oxide semiconductor layer 930c) exists between the insulating layer 960 and the conductive layers 940 and 950.

Figure 48C:
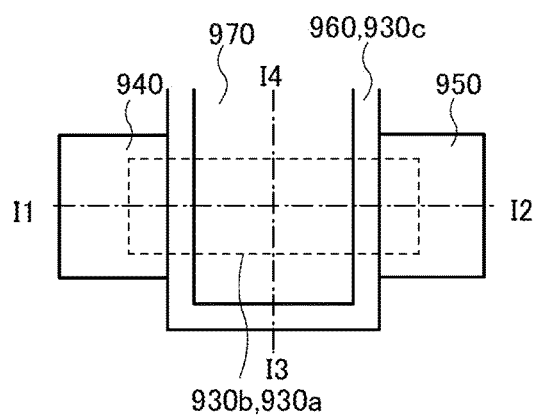
Figure 48D:
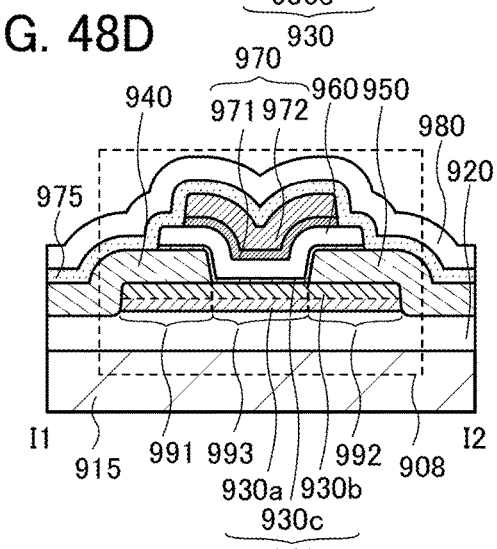
Figure 50B:
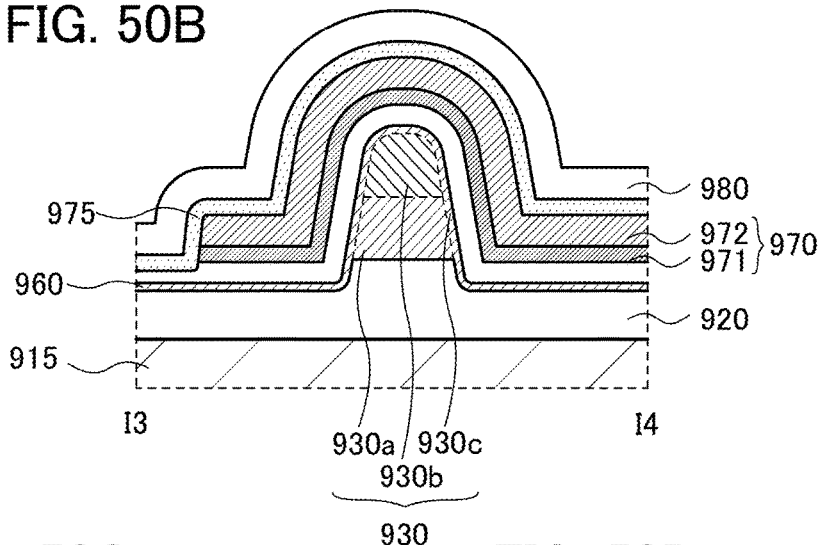

The transistor in one embodiment of the present invention may have a structure illustrated in FIGS. 48C and 48D. FIG. 48C is a top view of a transistor 908. A cross section in the direction of dashed-dotted line 11-12 in FIG. 48C is illustrated in FIG. 48D. A cross section in the direction of dashed-dotted line 13-14 in FIG. 48C is illustrated in FIG. 50B. The direction of dashed-dotted line 11-12 is referred to as a channel length direction, and the direction of dashed-dotted line 13-14 is referred to as a channel width direction in some cases.

The transistor 908 differs from the transistor 907 in that end portions of the insulating layer 960 and the oxide semiconductor layer 930c are not aligned with the end portion of the conductive layer 970.

Figure 48E:
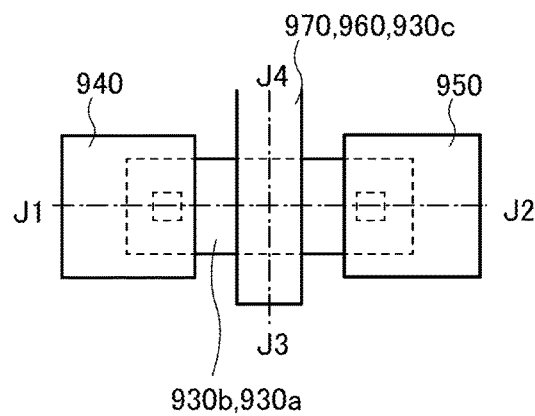
Figure 48F:
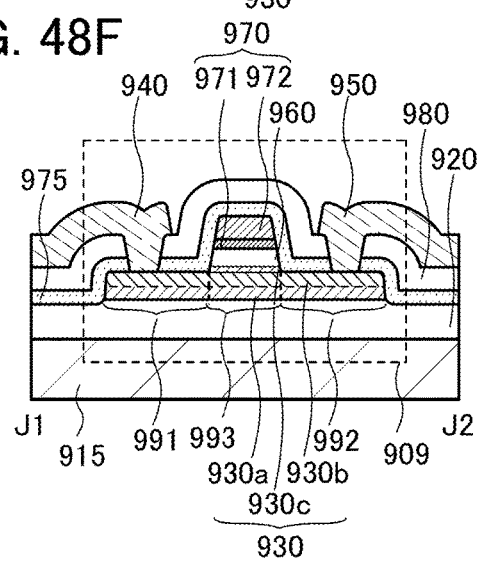

The transistor in one embodiment of the present invention may have a structure illustrated in FIGS. 48E and 48F. FIG. 48E is a top view of a transistor 909. A cross section in the direction of dashed-dotted line J1-J2 in FIG. 48E is illustrated in FIG. 48F. A cross section in the direction of dashed-dotted line J3-J4 in FIG. 48E is illustrated in FIG. 50A. The direction of dashed-dotted line J1-J2 is referred to as a channel length direction, and the direction of dashed-dotted line J3-J4 is referred to as a channel width direction in some cases.

The transistor 909 includes the insulating layer 920 in contact with the substrate 915; a stack of the oxide semiconductor layers 930a and 930b in contact with the insulating layer 920; the oxide semiconductor layer 930c in contact with the stack; the insulating layer 960 in contact with the oxide semiconductor layer 930c; the conductive layer 970 in contact with the insulating layer 960; the insulating layer 975 covering the stack, the oxide semiconductor layer 930c, the insulating layer 960, and the conductive layer 970; the insulating layer 980 in contact with the insulating layer 975; and the conductive layers 940 and 950 electrically connected to the stack through openings provided in the insulating layers 975 and 980. The transistor 909 may further include, for example, an insulating layer (planarization film) in contact with the insulating layer 980 and the conductive layers 940 and 950 as necessary.

The transistor 909 has the same structure as the transistor 903 except that the oxide semiconductor layer 930 includes two layers (the oxide semiconductor layers 930a and 930b) in the regions 991 and 992 and that the oxide semiconductor layer 930 includes three layers (the oxide semiconductor layers 930a to 930c) in the region 993.

Figure 49A:
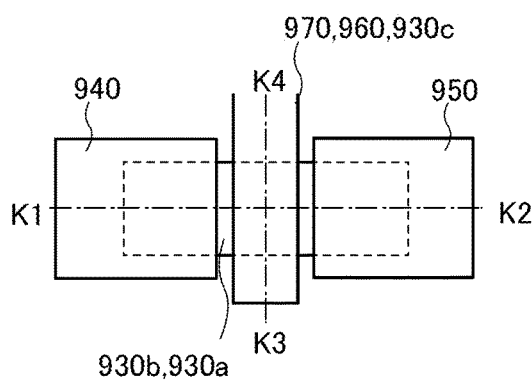
FIGS. 49A to 49F are top views and cross-sectional views of transistors.
Figure 49B:
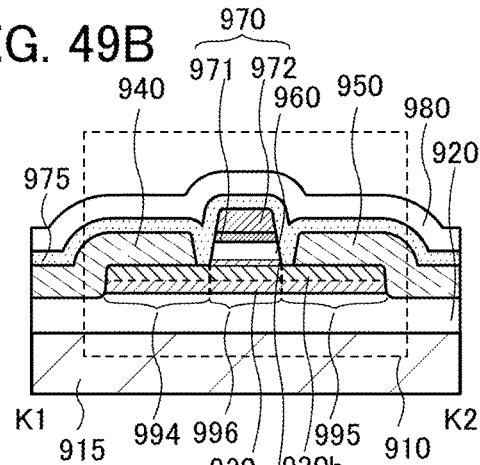

The transistor in one embodiment of the present invention may have a structure illustrated in FIGS. 49A and 49B. FIG. 49A is a top view of a transistor 910. A cross section in the direction of dashed-dotted line K1-K2 in FIG. 49A is illustrated in FIG. 49B. A cross section in the direction of dashed-dotted line K3-K4 in FIG. 49A is illustrated in FIG. 50A. The direction of dashed-dotted line K1-K2 is referred to as a channel length direction, and the direction of dashed-dotted line K3-K4 is referred to as a channel width direction in some cases.

The transistor 910 has the same structure as the transistor 904 except that the oxide semiconductor layer 930 includes two layers (the oxide semiconductor layers 930a and 930b) in the regions 994 and 995 and that the oxide semiconductor layer 930 includes three layers (the oxide semiconductor layers 930a to 930c) in the region 996.

Figure 49C:
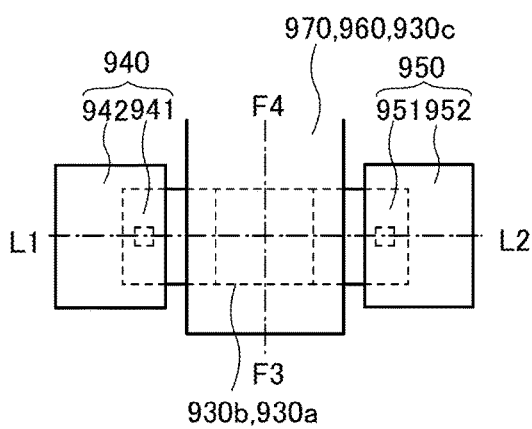
Figure 49D:
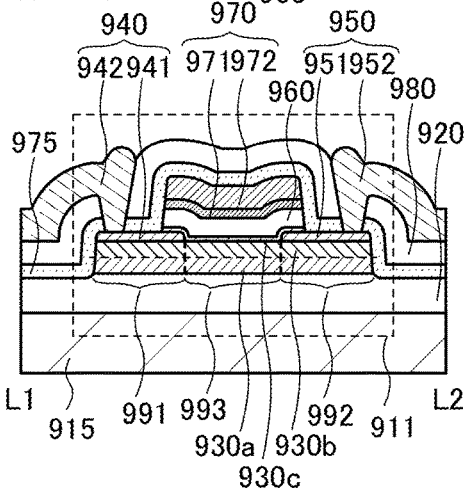

The transistor in one embodiment of the present invention may have a structure illustrated in FIGS. 49C and 49D. FIG. 49C is a top view of a transistor 911. A cross section in the direction of dashed-dotted line K1-K2 in FIG. 49C is illustrated in FIG. 49D. A cross section in the direction of dashed-dotted line K3-K4 in FIG. 49C is illustrated in FIG. 50A. The direction of dashed-dotted line K1-K2 is referred to as a channel length direction, and the direction of dashed-dotted line K3-K4 is referred to as a channel width direction in some cases.

The transistor 911 includes the insulating layer 920 in contact with the substrate 915; a stack of the oxide semiconductor layers 930a and 930b in contact with the insulating layer 920; the conductive layers 941 and 951 electrically connected to the stack; the oxide semiconductor layer 930c in contact with the stack and the conductive layers 941 and 951; the insulating layer 960 in contact with the oxide semiconductor layer 930c; the conductive layer 970 in contact with the insulating layer 960; the insulating layer 975 in contact with the stack, the conductive layers 941 and 951, the oxide semiconductor layer 930c, the insulating layer 960, and the conductive layer 970; the insulating layer 980 in contact with the insulating layer 975; and the conductive layers 942 and 952 electrically connected to the conductive layers 941 and 951, respectively, through openings provided in the insulating layers 975 and 980. The transistor 911 may further include, for example, an insulating layer (planarization film) in contact with the insulating layer 980 and the conductive layers 942 and 952 as necessary.

The transistor 911 has the same structure as the transistor 905 except that the oxide semiconductor layer 930 includes two layers (the oxide semiconductor layers 930a and 930b) in the regions 991 and 992, that the oxide semiconductor layer 930 includes three layers (the oxide semiconductor layers 930a to 930c) in the region 993, and that part of the oxide semiconductor layer (the oxide semiconductor layer 930c) exists between the insulating layer 960 and the conductive layers 941 and 951.

Figure 49E:
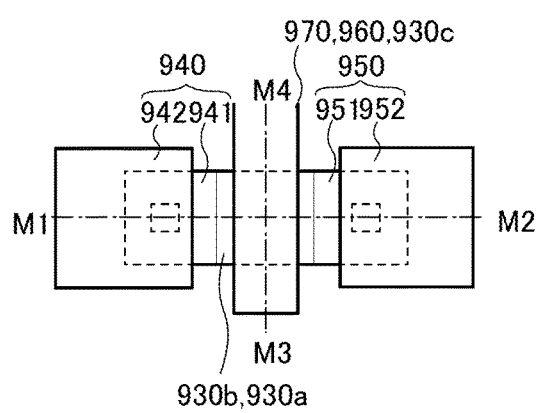
Figure 49F:
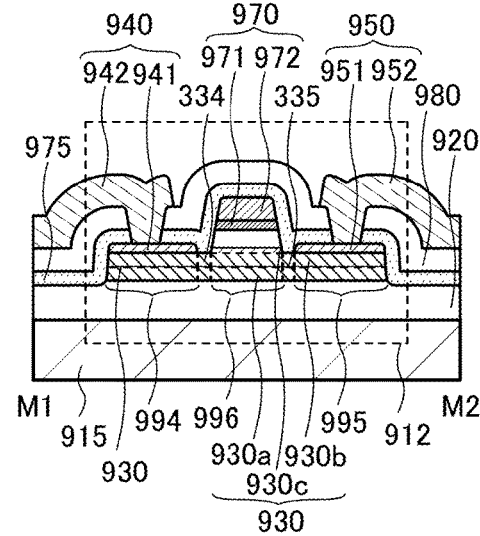

The transistor in one embodiment of the present invention may have a structure illustrated in FIGS. 49E and 49F. FIG. 49E is a top view of a transistor 912. A cross section in the direction of dashed-dotted line M1-M2 in FIG. 49E is illustrated in FIG. 49F. A cross section in the direction of dashed-dotted line M3-M4 in FIG. 49E is illustrated in FIG. 50A. The direction of dashed-dotted line M1-M2 is referred to as a channel length direction, and the direction of dashed-dotted line M3-M4 is referred to as a channel width direction in some cases.

The transistor 912 has the same structure as the transistor 906 except that the oxide semiconductor layer 930 includes two layers (the oxide semiconductor layers 930a and 930b) in the regions 994, 995, 997, and 998 and that the oxide semiconductor layer 930 includes three layers (the oxide semiconductor layers 930a to 930c) in the region 996.

Figure 50C:
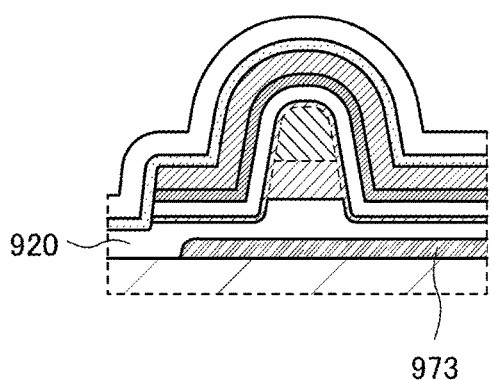
Figure 50D:
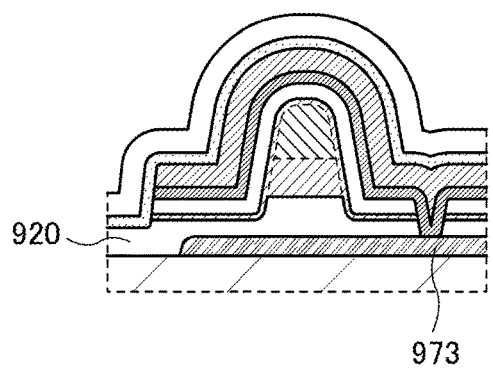
Figure 51A:
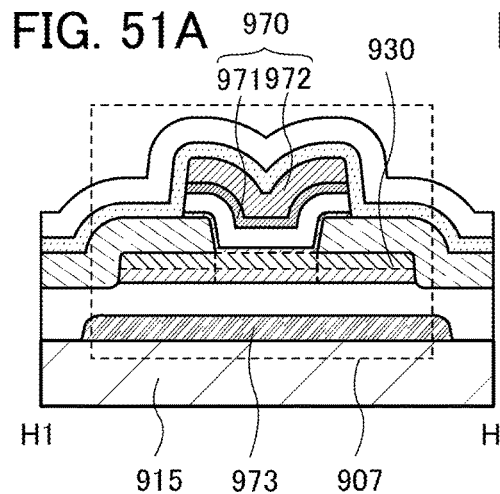
FIGS. 51A to 51F are cross-sectional views of transistors in a channel length direction.
Figure 51B:
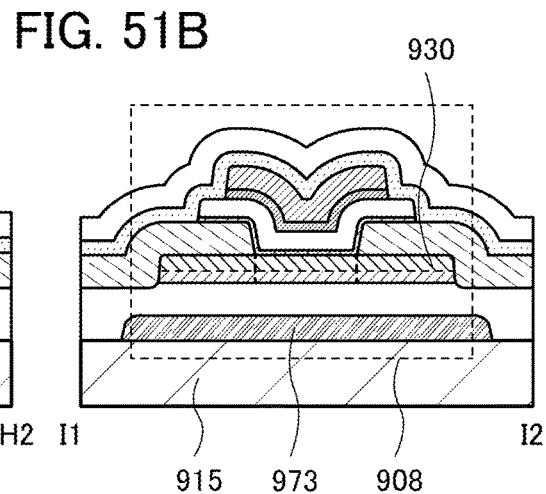
Figure 51C:
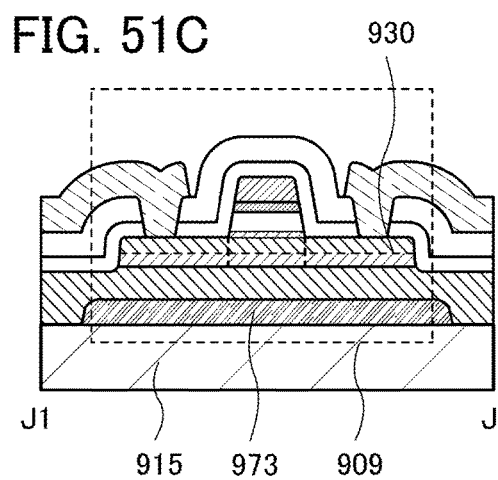
Figure 51D:
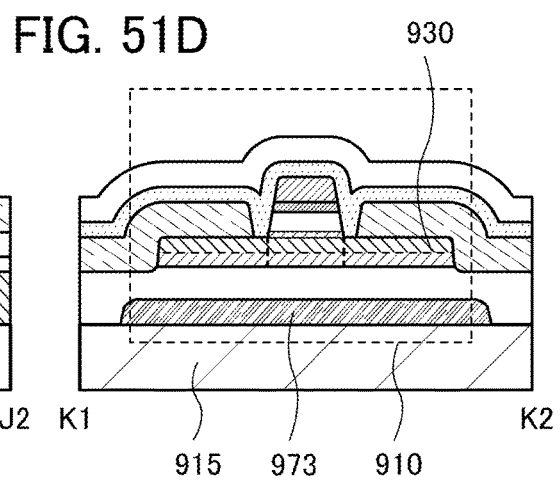
Figure 51E:
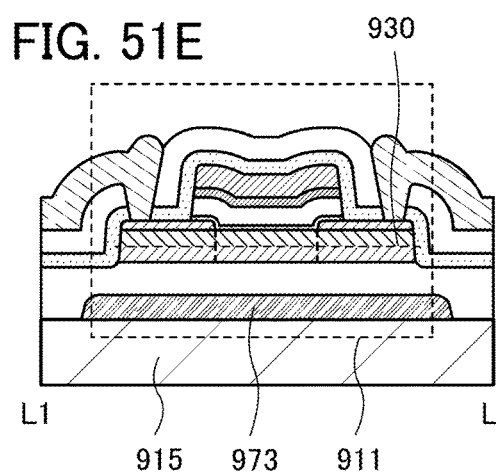
Figure 51F:
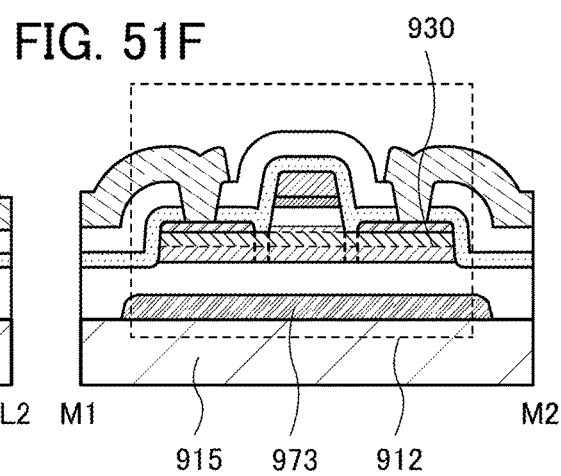

The transistor in one embodiment of the present invention may include the conductive layer 973 between the oxide semiconductor layer 930 and the substrate 115 as illustrated in cross-sectional views in the channel length direction in FIGS. 51A to 51F and cross-sectional views in the channel width direction in FIGS. 50C and 50D. When the conductive layer is used as a second gate electrode layer (back gate), the on-state current can be further increased or the threshold voltage can be controlled. In the cross-sectional views in FIGS. 51A to 51F, the width of the conductive layer 973 may be shorter than that of the oxide semiconductor layer 930. Moreover, the width of the conductive layer 973 may be shorter than that of the conductive layer 970.

Figure 52A:
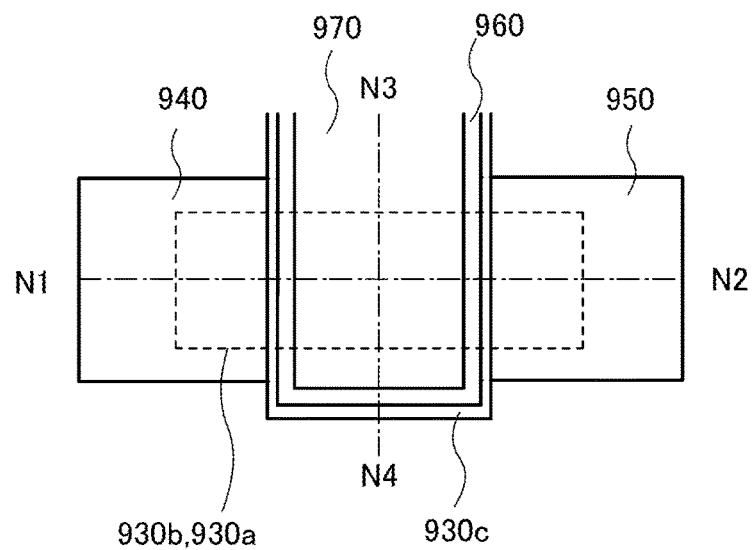
FIGS. 52A and 52B are a top view and a cross-sectional view of a transistor.
Figure 52B:
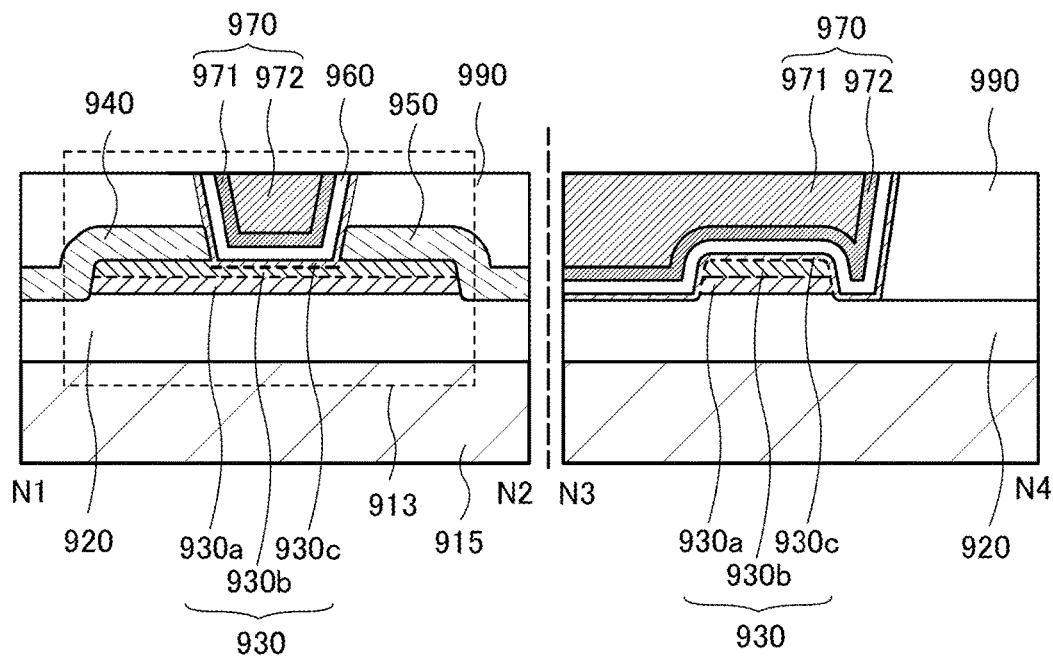

The transistor in one embodiment of the present invention may have a structure illustrated in FIGS. 52A and 52B. FIG. 52A is a top view and FIG. 52B is a cross-sectional view taken along dashed-dotted line N1-N2 and dashed-dotted line N3-N4 in FIG. 52A. Note that for simplification of the drawing, some components are not illustrated in the top view in FIG. 52A.

A transistor 913 illustrated in FIGS. 52A and 52B includes the substrate 915, the insulating layer 920 over the substrate 915, the oxide semiconductor layer 930 (the oxide semiconductor layer 930a, the oxide semiconductor layer 930b, and the oxide semiconductor layer 930c) over the insulating layer 920, the conductive layers 940 and 950 which are in contact with the oxide semiconductor layer 930 and are apart from each other, the insulating layer 960 in contact with the oxide semiconductor layer 930c, and the conductive layer 970 in contact with the insulating layer 960. Note that the oxide semiconductor layer 930c, the insulating layer 960, and the conductive layer 970 are provided in an opening which is provided in the insulating layer 990 over the transistor 913 and reaches the oxide semiconductor layer 930b.

The transistor 913 has a smaller region in which a conductor serving as a source electrode or a drain electrode overlaps with a conductor serving as a gate electrode than the other transistors described above; thus, the parasitic capacitance in the transistor 913 can be reduced. Therefore, the transistor 913 is preferable as a component of a circuit for which high-speed operation is needed. As illustrated in FIG. 52B, a top surface of the transistor 913 is preferably planarized by a chemical mechanical polishing (CMP) method or the like, but is not necessarily planarized.

Figure 53A:
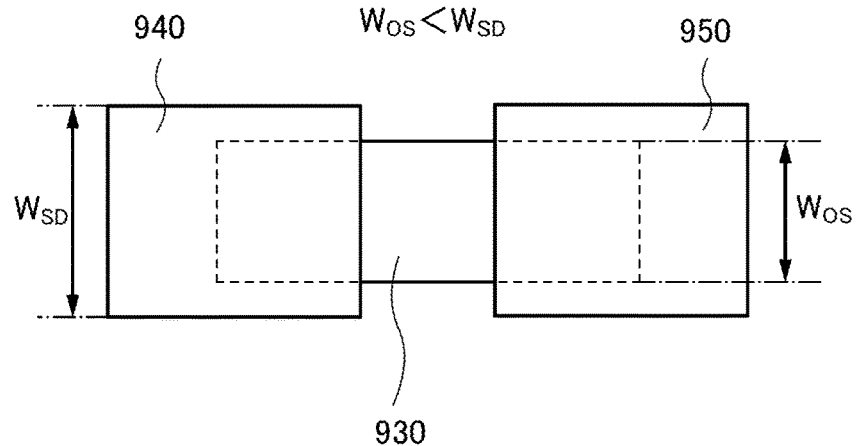
FIGS. 53A to 53C are each a top view illustrating a transistor.
Figure 53B:
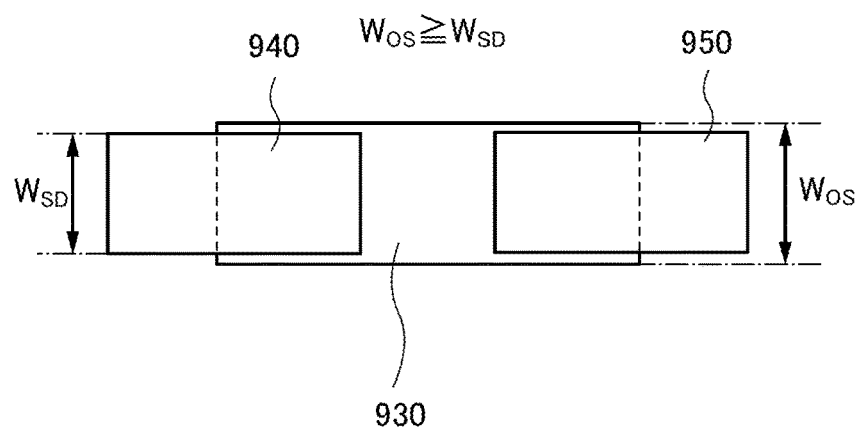
Figure 53C:
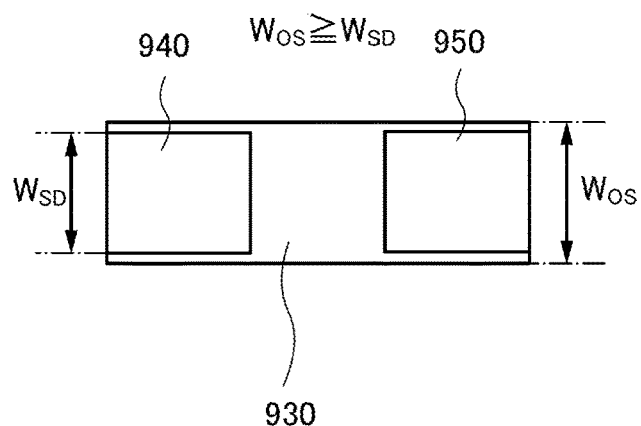

As shown in the top views in FIGS. 53A and 53B (showing only the oxide semiconductor layer 930, the conductive layer 940, and the conductive layer 950), the widths (WSD) of the conductive layer 940 (source electrode layer) and the conductive layer 950 (drain electrode layer) in the transistor of one embodiment of the present invention may be either longer than or shorter than the width (Wos) of the oxide semiconductor layer 930. When Wos WSD (WSD is less than or equal to Wos) is satisfied, a gate electric field is easily applied to the entire oxide semiconductor layer 930, so that electrical characteristics of the transistor can be improved. As illustrated in FIG. 53C, the conductive layers 940 and 950 may be formed only in a region that overlaps with the oxide semiconductor layer 930.

In the transistor in one embodiment of the present invention (any of the transistors 901 to 913), the conductive layer 970 functioning as a gate electrode layer electrically surrounds the oxide semiconductor layer 930 in the channel width direction with the insulating layer 960 functioning as a gate insulating film positioned therebetween. This structure increases the on-state current. Such a transistor structure is referred to as a surrounded channel (s-channel) structure.

In the transistor including the oxide semiconductor layers 930a and 930b and the transistor including the oxide semiconductor layers 930a to 930c, selecting appropriate materials for the two or three layers forming the oxide semiconductor layer 930 makes current flow to the oxide semiconductor layer 930b. Since current flows to the oxide semiconductor layer 930b, the current is hardly influenced by interface scattering, leading to high on-state current. Thus, increasing the thickness of the oxide semiconductor layer 930b improves the on-state current in some cases.

A semiconductor device including a transistor with any of the above structures can have favorable electrical characteristics.

This embodiment can be combined with any of the other embodiments as appropriate.

Embodiment 9

In this embodiment, components of the transistors described in Embodiment 8 will be described in detail.

As the substrate 915, a glass substrate, a quartz substrate, a semiconductor substrate, a ceramic substrate, a metal substrate with an insulated surface, or the like can be used. Alternatively, a silicon substrate provided with a transistor can be used, and an insulating layer, a wiring, a conductor functioning as a contact plug, and the like may be provided over the silicon substrate. Note that when p-channel transistors are formed using the silicon substrate, a silicon substrate with n$^-$-type conductivity is preferably used. Alternatively, an SOI substrate including an n$^-$-type or i-type silicon layer may be used. A surface of the silicon substrate where the transistor is formed preferably has a (110) plane orientation. Forming a p-channel transistor with the (110) plane can increase mobility.

The insulating layer 920 can have a function of supplying oxygen to the oxide semiconductor layer 930 as well as a function of preventing diffusion of impurities from a component included in the substrate 915. For this reason, the insulating layer 920 is preferably an insulating film containing oxygen and further preferably, the insulating layer 920 is an insulating film containing oxygen in which the oxygen content is higher than that in the stoichiometric composition. For example, the insulating layer 120 is a film of which the amount of released oxygen when converted into oxygen atoms is $1.0 \times 10^{19}$ atoms/cm$^3$ or more in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C. In the case where the substrate 915 is provided with another device, the insulating layer 920 also has a function as an interlayer insulating film. In that case, the insulating layer 920 is preferably subjected to planarization treatment such as chemical mechanical polishing (CMP) treatment so as to have a flat surface.

For example, the insulating layer 920 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 920 may be a stack of any of the above materials.

In this embodiment, detailed description is given mainly on the case where the oxide semiconductor layer 930 of the transistor has a three-layer structure in which the oxide semiconductor layers 930a to 930c are sequentially stacked from the insulating layer 920 side.

Note that in the case where the oxide semiconductor layer 930 is a single layer, a layer corresponding to the oxide semiconductor layer 930b described in this embodiment is used.

In the case where the oxide semiconductor layer 930 has a two-layer structure, a stack in which layers corresponding to the oxide semiconductor layer 930a and the oxide semiconductor layer 930b described in this embodiment are sequentially stacked from the insulating layer 920 side is used. In such a case, the oxide semiconductor layers 930a and 930b can be replaced with each other.

In the case where the oxide semiconductor layer 930 has a layered structure of four or more layers, for example, a structure in which another oxide semiconductor layer is added to the three-layer stack of the oxide semiconductor layer 930 described in this embodiment can be employed.

For the oxide semiconductor layer 930b, for example, an oxide semiconductor whose electron affinity (an energy difference between a vacuum level and the conduction band minimum) is higher than those of the oxide semiconductor layers 930a and 930c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 930a and 930c each contain one or more kinds of metal elements contained in the oxide semiconductor layer 930b. For example, the oxide semiconductor layers 930a and 930c are preferably formed using an oxide semiconductor whose conduction band minimum is closer to a vacuum level than that of the oxide semiconductor layer 930b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 970, a channel is formed in the oxide semiconductor layer 930b whose conduction band minimum is the lowest in the oxide semiconductor layer 930.

Furthermore, since the oxide semiconductor layer 930a contains one or more kinds of metal elements contained in the oxide semiconductor layer 930b, an interface state is unlikely to be formed at the interface between the oxide semiconductor layers 930a and 930b, compared with the interface between the oxide semiconductor layer 930b and the insulating layer 920 on the assumption that the oxide semiconductor layer 930b is in contact with the insulating layer 920. The interface state sometimes forms a channel; therefore, the threshold voltage of the transistor is changed in some cases. Thus, with the oxide semiconductor layer 930a, variations in electrical characteristics of the transistor, such as a threshold voltage, can be reduced. Moreover, the reliability of the transistor can be improved.

Since the oxide semiconductor layer 930c contains one or more kinds of metal elements contained in the oxide semiconductor layer 930b, scattering of carriers is unlikely to occur at the interface between the oxide semiconductor layers 930b and 930c, compared with the interface between the oxide semiconductor layer 930b and the gate insulating film (the insulating layer 960) on the assumption that the oxide semiconductor layer 930b is in contact with the gate insulating film. Thus, with the oxide semiconductor layer 930c, the field-effect mobility of the transistor can be increased.

For the oxide semiconductor layers 930a and 930c, for example, a material containing Al, Ti, Ga, Ge, Y, Zr, Sn, La, Ce, or Hf with a higher atomic ratio than that used for the oxide semiconductor layer 930b can be used. Specifically, the atomic ratio of any of the above metal elements in the oxide semiconductor layers 930a and 930c is 1.5 times or more, preferably 2 times or more, further preferably 3 times or more as large as that in the oxide semiconductor layer 930b. Any of the above metal elements is strongly bonded to oxygen and thus has a function of suppressing generation of an oxygen vacancy in the oxide semiconductor layers 930a and 930c. That is, an oxygen vacancy is less likely to be generated in the oxide semiconductor layers 930a and 930c than in the oxide semiconductor layer 930b.

An oxide semiconductor that can be used for each of the oxide semiconductor layers 930a to 930c preferably contains at least In or Zn. Both In and Zn are preferably contained. In order to reduce variations in electrical characteristics of the transistor including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layers 930a to 930c is an In—M—Zn oxide containing at least indium, zinc, and M (M is a metal such as Al, Ti, Ga, Ge, Y, Zr, Sn, La, Ce, or Hf), in the case where the oxide semiconductor layer 930a has an atomic ratio of In to M and Zn which is $x_1:y_1:z_1$, the oxide semiconductor layer 930b has an atomic ratio of In to M and Zn which is $x_2:y_2:z_2$, and the oxide semiconductor layer 930c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the oxide semiconductor layer

930b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 930a and 930c are preferably less than 50 atomic % and greater than 50 atomic %, respectively, further preferably less than 25 atomic % and greater than 75 atomic %, respectively. In addition, in the case where Zn and O are not taken into consideration, the proportion of In and the proportion of M in the oxide semiconductor layer 930b are preferably greater than 25 atomic % and less than 75 atomic %, respectively, and further preferably greater than 34 atomic % and less than 66 atomic %, respectively.

The indium content in the oxide semiconductor layer 930b is preferably higher than those in the oxide semiconductor layers 930a and 930c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 930b, a transistor having high field-effect mobility can be obtained.

The thickness of the oxide semiconductor layer 930a is greater than or equal to 3 nm and less than or equal to 100 nm, preferably greater than or equal to 5 nm and less than or equal to 50 nm, further preferably greater than or equal to 5 nm and less than or equal to 25 nm. The thickness of the oxide semiconductor layer 930b is greater than or equal to 3 nm and less than or equal to 200 nm, preferably greater than or equal to 5 nm and less than or equal to 150 nm, further preferably greater than or equal to 10 nm and less than or equal to 100 nm. The thickness of the oxide semiconductor layer 930c is greater than or equal to 1 nm and less than or equal to 50 nm, preferably greater than or equal to 2 nm and less than or equal to 30 nm, further preferably greater than or equal to 3 nm and less than or equal to 15 nm. In addition, the oxide semiconductor layer 930b is preferably thicker than the oxide semiconductor layer 930c.

In order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to the state where an oxide semiconductor layer has a carrier density which is lower than $1 \times 10^{15}/cm^3$, lower than $1 \times 10^{13}/cm^3$, lower than $8 \times 10^{11}/cm^3$, or lower than $1 \times 10^8/cm^3$, and is higher than or equal to $1 \times 10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 930a to 930c and at interfaces between the oxide semiconductor layers.

In order to form an intrinsic or substantially intrinsic oxide semiconductor layer, the oxide semiconductor layer is controlled to have a region in which the concentration of silicon estimated by secondary ion mass spectrometry (SIMS) is lower than $1 \times 10^{19}$ atoms/cm$^3$, preferably lower than $5 \times 10^{18}$ atoms/cm$^3$, further preferably lower than $1 \times 10^{18}$ atoms/cm$^3$. Furthermore, the oxide semiconductor layer is controlled to have a region in which the concentration of hydrogen is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. Furthermore, the concentration of nitrogen at a certain depth of the oxide semiconductor layer or in a region of the oxide semiconductor layer is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The high concentration of silicon or carbon might reduce the crystallinity of the oxide semiconductor layer. In order to avoid the reduction of the crystallinity of the oxide semiconductor layer, for example, the oxide semiconductor layer is controlled to have a region in which the concentration of silicon is lower than $1 \times 10^{19}$ atoms/cm$^3$, preferably lower than $5 \times 10^{18}$ atoms/cm$^3$, further preferably lower than $1 \times 10^{18}$ atoms/cm$^3$. Furthermore, the oxide semiconductor layer is controlled to have a region in which the concentration of carbon is lower than $1 \times 10^{19}$ atoms/cm$^3$, preferably lower than $5 \times 10^{18}$ atoms/cm$^3$, further preferably lower than $1 \times 10^{18}$ atoms/cm$^3$.

As described above, a transistor in which a highly purified oxide semiconductor film is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor of one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating film.

Accordingly, with the oxide semiconductor layer 930 having a layered structure including the oxide semiconductor layers 930a to 930c, a channel can be formed in the oxide semiconductor layer 930b; thus, the transistor can have high field-effect mobility and stable electrical characteristics.

In a band structure, the conduction band minimums of the oxide semiconductor layers 930a to 930c are continuous. This can be understood also from the fact that the compositions of the oxide semiconductor layers 930a to 930c are close to one another and oxygen is easily diffused among the oxide semiconductor layers 930a to 930c. Thus, the oxide semiconductor layers 930a to 930c have a continuous physical property though they have different compositions and form a stack. In the drawings, interfaces between the oxide semiconductor layers of the stack are indicated by dotted lines.

The oxide semiconductor layer 930 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 930*a* and 930*c*, and an In—Ga—Zn oxide whose atomic ratio of In to Ga and Zn is 1:1:1, 2:1:3, 5:5:6, or 3:1:2 can be used for the oxide semiconductor layer 930*b*. In each of the oxide semiconductor layers 930*a*, 930*b*, and 930*c*, the proportion of each atom in the atomic ratio varies within a range of ±40% as an error.

The oxide semiconductor layer 930*b* of the oxide semiconductor layer 930 serves as a well, so that a channel is formed in the oxide semiconductor layer 930*b*. Since the conduction band minimums are continuous, the oxide semiconductor layer 930 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 930*a* and 930*c*. The oxide semiconductor layer 930*b* can be distanced away from the trap levels owing to the existence of the oxide semiconductor layers 930*a* and 930*c*.

However, when the energy differences between the conduction band minimum of the oxide semiconductor layer 930*b* and the conduction band minimum of each of the oxide semiconductor layers 930*a* and 930*c* are small, an electron in the oxide semiconductor layer 930*b* might reach the trap level by passing over the energy differences. When the electron is trapped in the trap level, negative charge is generated at the interface with the insulating layer, so that the threshold voltage of the transistor is shifted in the positive direction.

The oxide semiconductor layers 930*a* to 930*c* preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 940 functioning as a source electrode layer and the conductive layer 950 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus allows subsequent processes to be performed at relatively high temperatures. It is also possible to use a stack of any of the above materials and Cu or an alloy such as Cu—Mn, which has low resistance. In the transistors 905, 906, 911, and 912, for example, it is possible to use W for the conductive layers 941 and 951 and use a stack of Ti and Al for the conductive layers 942 and 952.

The above materials are capable of extracting oxygen from an oxide semiconductor film. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 940 and 950, the conductive layers 940 and 950 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 940 and 950 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 960 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 960 may be a stack including any of the above materials. The insulating layer 960 may contain La, N, Zr, or the like as an impurity.

An example of a layered structure of the insulating layer 960 is described. The insulating layer 960 includes, for example, oxygen, nitrogen, silicon, or hafnium. Specifically, the insulating layer 960 preferably includes hafnium oxide and silicon oxide or silicon oxynitride.

Hafnium oxide and aluminum oxide have higher dielectric constants than silicon oxide and silicon oxynitride. Therefore, the insulating layer 860 using hafnium oxide or aluminum oxide can have larger thickness than the insulating layer 860 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the these examples.

For the insulating layers 920 and 960 in contact with the oxide semiconductor layer 930, a film that releases less nitrogen oxide is preferably used. In the case where the oxide semiconductor is in contact with an insulating layer that releases a large amount of nitrogen oxide, the density of states due to nitrogen oxide increases in some cases. The density of states caused by nitrogen oxide can be formed in the energy gap of the oxide semiconductor. For the insulating layers 920 and 960, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 920 and 960, a shift in the threshold voltage of the transistor can be reduced, which leads to reduced fluctuations in the electrical characteristics of the transistor.

For the conductive layer 970 functioning as a gate electrode layer, for example, a conductive film formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 971 and tungsten is used for the conductive layer 972 to form the conductive layer 970.

As the insulating layer 975, a silicon nitride film, an aluminum nitride film, or the like containing hydrogen can be used. In the transistors 903, 904, 906, 909, 910, and 912 described in Embodiment 2, when an insulating film containing hydrogen is used as the insulating layer 975, part of the oxide semiconductor layer can have n-type conductivity. In addition, a nitride insulating film functions as a blocking film against moisture and the like and can improve the reliability of the transistor.

An aluminum oxide film can also be used as the insulating layer 975. It is particularly preferable to use an aluminum oxide film as the insulating layer 975 in the transistors 901, 902, 905, 907, 908, and 911 described in Embodiment 2. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 930, preventing release of oxygen from the oxide semiconductor layer, and preventing unnecessary release of oxygen from the insulating layer 920. Furthermore, oxygen contained in the aluminum oxide film can be diffused into the oxide semiconductor layer.

Furthermore, the insulating layer 980 is preferably formed over the insulating layer 975. The insulating layer 980 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 980 may be a stack of any of the above materials.

Here, like the insulating layer 920, the insulating layer 980 preferably contains oxygen more than that in the stoichiometric composition. Oxygen released from the insulating layer 980 can be diffused into the channel formation region in the oxide semiconductor layer 930 through the insulating layer 960, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 907 to 912 in one embodiment of the present invention, the oxide semiconductor layer 930c is formed to cover the oxide semiconductor layer 930b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor of one embodiment of the present invention, as described above, the gate electrode layer (the conductive layer 970) is formed to electrically surround the oxide semiconductor layer 930 in the channel width direction; accordingly, a gate electric field is applied to the oxide semiconductor layer 930 in the side surface direction in addition to the perpendicular direction. In other words, a gate electric field is applied to the entire channel formation layer and an effective channel width is increased, leading to a further increase in on-state current.

Furthermore, in the transistor in one embodiment of the present invention in which the oxide semiconductor layer 930 has a two-layer structure or a three-layer structure, since the oxide semiconductor layer 930b where a channel is formed is provided over the oxide semiconductor layer 930a, an interface state is less likely to be formed. In the transistor in one embodiment of the present invention in which the oxide semiconductor layer 930 has a three-layer structure, since the oxide semiconductor layer 930b is positioned at the middle of the three-layer structure, the influence of an impurity that enters from upper and lower layers on the oxide semiconductor layer 930b can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is absorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O film is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

This embodiment can be combined with any of the other embodiments as appropriate.

Embodiment 10

A structure of an oxide semiconductor film that can be used in one embodiment of the present invention will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. Furthermore, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

An oxide semiconductor film is classified roughly into a single crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

While in the high-resolution planar TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that in structural analysis of the CAAC-OS film including an $InGaZnO_4$ crystal by an out-of-plane method, another peak may appear when $2\theta$ is around 36°, in addition to the peak at $2\theta$ of around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film with a low impurity concentration. The impurity is an element other than the main components of the oxide semiconductor film, such as hydrogen, carbon, silicon, or a transition metal element. An element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity. Additionally, the impurity contained in the oxide semiconductor film might serve as a carrier trap or a carrier generation source.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have low carrier density. Thus, a transistor including the oxide semiconductor film rarely has a negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. An electric charge trapped by the carrier traps in the oxide semiconductor film takes a long time to be released. The trapped electric charge may behave like a fixed electric charge. Thus, the transistor which includes the oxide semiconductor film having a high impurity concentration and a high density of defect states might have unstable electrical characteristics.

In a transistor using the CAAC-OS film, change in electric characteristics of the transistor due to irradiation with visible light or ultraviolet light is small.

Next, a microcrystalline oxide semiconductor film is described.

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS, for example, a crystal grain boundary is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is analyzed by an out-of-plane method with an XRD apparatus using an X-ray beam having a diameter larger than the size of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS film when an electron beam having a probe diameter close to or smaller than the size of a crystal part is applied. Furthermore, in a nanobeam electron diffraction pattern of the nc-OS film, circumferentially distributed spots are observed in some cases. Also in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film is an oxide semiconductor film having disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

An oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes having a distance therebetween of from 0.28 nm to 0.30 nm is regarded as corresponding to the a-b plane of the InGaZnO$_4$ crystal, focusing on the lattice fringes in the high-resolution TEM image.

Note that an oxide semiconductor film may be a stacked film including two or more films of an amorphous oxide semiconductor film, an a-like OS film, a microcrystalline oxide semiconductor film, and a CAAC-OS film, for example.

This embodiment can be combined with any of the other embodiments as appropriate.

Embodiment 11

A semiconductor device of one embodiment of the present invention can be used in a camera module and provided in a variety of electronic devices. In this embodiment, an example of a camera module and examples of an electronic device to each of which the semiconductor device described in the above embodiment is applied are described.

Figure 54:
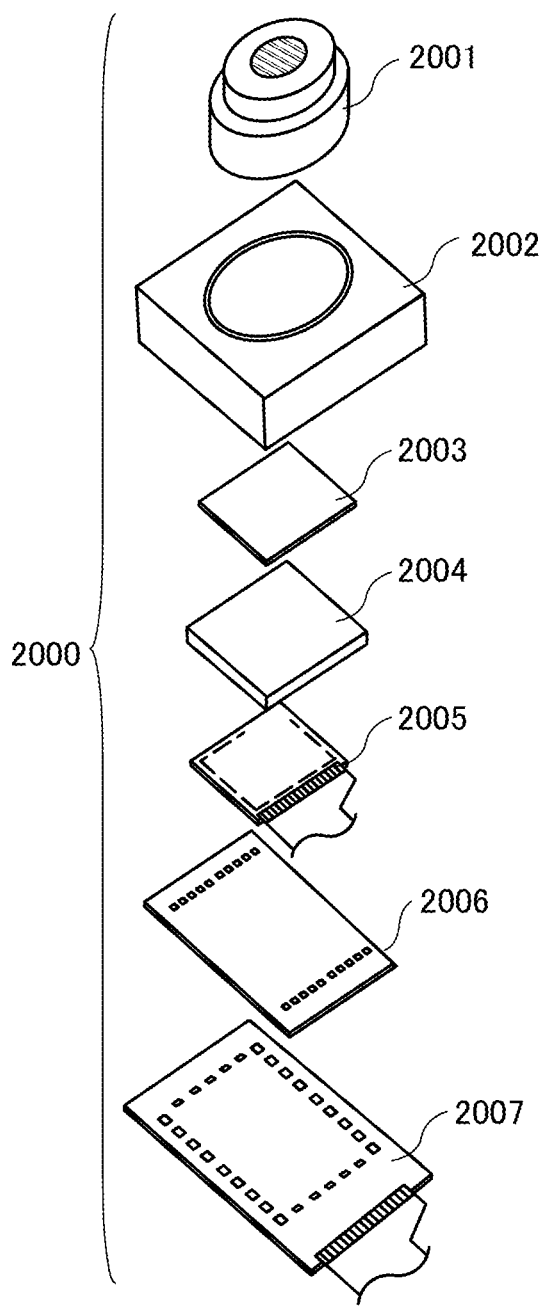
FIG. 54 is a view illustrating a module.

A camera module 2000 illustrated in FIG. 54 includes a lens unit 2001, an autofocus unit 2002, a lid glass 2003, a sensor cover 2004, a semiconductor device 2005, a substrate 2006, and an FPC 2007.

A semiconductor device, an imaging device, an imaging system, and a camera module of embodiments of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of such an electronic device are illustrated in FIGS. 55A to 55F.

Figure 55A:
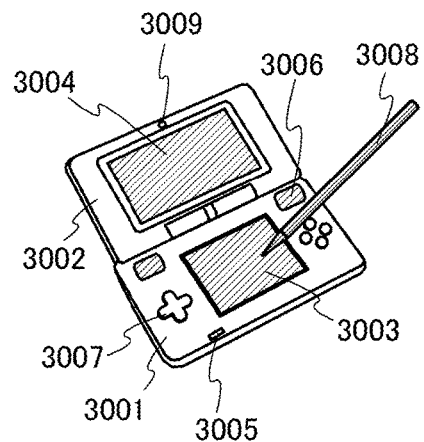
FIGS. 55A to 55F illustrate electronic devices.

FIG. 55A illustrates a portable game machine including a housing 3001, a housing 3002, a display portion 3003, a display portion 3004, a microphone 3005, speakers 3006, an operation key 3007, a stylus 3008, a camera 3009, and the like. Although the portable game machine in FIG. 55A has the two display portions 3003 and 3004, the number of display portions included in a portable game machine is not limited to this. The semiconductor device of one embodiment of the present invention can be used for the camera 3009.

Figure 55B:
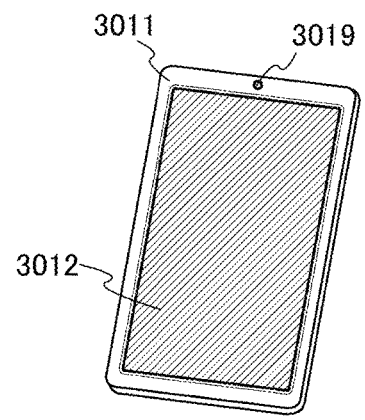

FIG. 55B illustrates a portable data terminal, which includes a first housing 3011, a display portion 3012, a camera 3019, and the like. A touch panel function of the display portion 3012 enables input and output of information. The semiconductor device of one embodiment of the present invention can be used for the camera 3019.

Figure 55C:
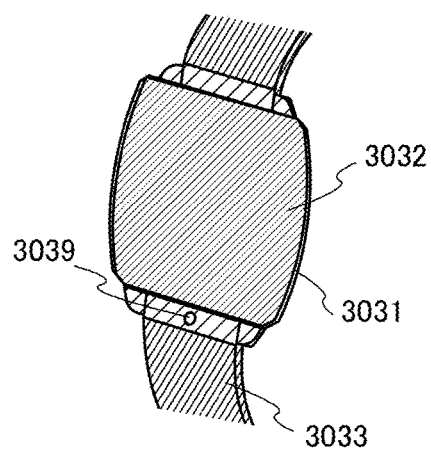

FIG. 55C illustrates a wrist-watch-type information terminal, which includes a housing 3031, a display portion 3032, a wristband 3033, a camera 3039, and the like. The display portion 3032 may be a touch panel. The semiconductor device of one embodiment of the present invention can be used for the camera 3039.

Figure 55D:
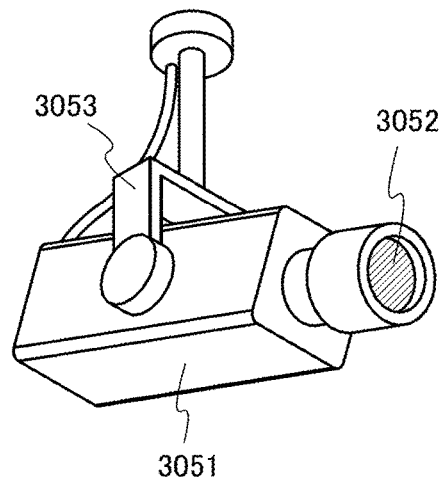

FIG. 55D illustrates a monitoring camera, which includes a housing 3051, a lens 3052, a support portion 3053, and the like. The semiconductor device of one embodiment of the present invention can be used in a focus position of the lens 3052.

Figure 55E:
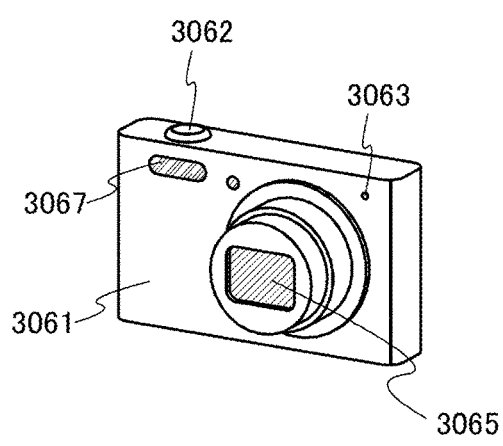

FIG. 55E illustrates a digital camera, which includes a housing 3061, a shutter button 3062, a microphone 3063, a light-emitting portion 3067, a lens 3065, and the like. The semiconductor device of one embodiment of the present invention can be provided in a focus position of the lens 3065.

Figure 55F:
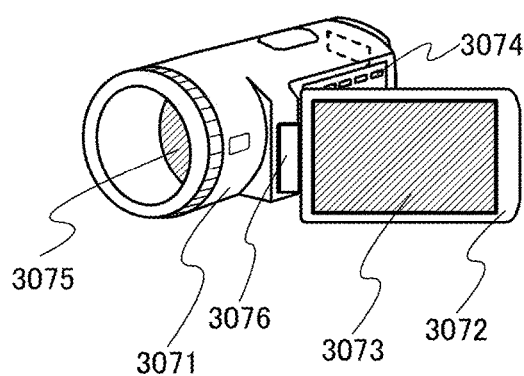

FIG. 55F illustrates a video camera including a first housing 3071, a second housing 3072, a display portion 3073, operation keys 3074, a lens 3075, a joint 3076, a joint 3076, and the like. The operation keys 3074 and the lens 3075 are provided for the first housing 3071, and the display portion 3073 is provided for the second housing 3072. The first housing 3071 and the second housing 3072 are connected to each other with the joint 3076, and an angle between the first housing 3071 and the second housing 3072 can be changed with the joint 3076. Images displayed on the display portion 3073 may be switched in accordance with the angle at the joint 3076 between the first housing 3071 and the second housing 3072. The semiconductor device of one embodiment of the present invention can be provided in a focus position of the lens 3075.

This embodiment can be combined with any of the other embodiments as appropriate.

This application is based on Japanese Patent Application serial no. 2015-094491 filed with Japan Patent Office on May 4, 2015, the entire contents of which are hereby incorporated by reference.

What is claimed is:

1. A semiconductor device configured to take a moving image, comprising:
 a pixel portion including a plurality of pixels each configured to convert irradiation light to generate first data and configured to generate second data corresponding to a difference between the first data in a first frame period and the first data in a second frame period;

a first circuit configured to convert the second data into a digital signal and output the digital signal as compressed data of the moving image; and a second circuit configured to control output of the compressed data, wherein the first circuit is configured to be supplied with no power when the difference is zero.

2. The semiconductor device according to claim 1, wherein each of the plurality of pixels includes a photoelectric conversion element and a transistor electrically connected to the photoelectric conversion element, wherein a channel formation region of the transistor includes an oxide semiconductor.

3. The semiconductor device according to claim 2, wherein the photoelectric conversion element includes a selenium-based semiconductor.

4. The semiconductor device according to claim 2, wherein the semiconductor device is configured to take an image with a global shutter system.

5. An imaging system comprising:
a photodetector portion including the semiconductor device according to claim 1; and
a data processing portion including a decoder,
wherein the decoder is configured to extract the compressed data input from the photodetector portion.

6. An electronic device comprising:
the semiconductor device according to claim 1; and
a housing, a display portion, or an operation key.

7. A semiconductor device configured to take a moving image, comprising:
a pixel portion including a plurality of pixels each configured to convert irradiation light to generate first data and configured to generate second data corresponding to a difference between the first data in a first frame period and the first data in a second frame period;
a first circuit configured to convert the second data into a digital signal and output the digital signal as compressed data of the moving image;
a second circuit configured to control output of the compressed data; and
a third circuit configured to determine whether or not there is the difference on the basis of the second data,
wherein when the third circuit determines that there is no difference, power supply to at least one of the first circuit and the second circuit is stopped, and
wherein when the third circuit determines that there is the difference, power is supplied to the first circuit and the second circuit, and thus the compressed data is output through the second circuit.

8. The semiconductor device according to claim 7, wherein the third circuit includes a fourth circuit and a fifth circuit,
wherein the fourth circuit is configured to make reference current flow in the fourth circuit,
wherein the fifth circuit is configured to correct current flowing in the fourth circuit to the reference current when the current flowing in the fourth circuit is changed from the reference current, and wherein power supply is stopped when the current flowing in the fourth circuit is corrected.

9. The semiconductor device according to claim 7, wherein each of the plurality of pixels includes a photoelectric conversion element and a transistor electrically connected to the photoelectric conversion element,
wherein a channel formation region of the transistor includes an oxide semiconductor.

10. The semiconductor device according to claim 9, wherein the photoelectric conversion element includes a selenium-based semiconductor.

11. The semiconductor device according to claim 9, wherein the semiconductor device is configured to take an image with a global shutter system.

12. An imaging system comprising:
a photodetector portion including the semiconductor device according to claim 7; and
a data processing portion including a decoder,
wherein the decoder is configured to extract the compressed data input from the photodetector portion.

13. An electronic device comprising:
the semiconductor device according to claim 7; and
a housing, a display portion, or an operation key.

14. A semiconductor device configured to take a moving image, comprising:
a pixel portion including a plurality of pixels each configured to convert irradiation light to generate first data and configured to generate second data corresponding to a difference between the first data in a first frame period and the first data in a second frame period;
a first circuit configured to convert the second data into a digital signal and output the digital signal as compressed data of the moving image; and
a second circuit configured to control output of the compressed data,
wherein the second circuit is configured to be supplied with no power when the difference is zero.

15. The semiconductor device according to claim 14, wherein each of the plurality of pixels includes a photoelectric conversion element and a transistor electrically connected to the photoelectric conversion element,
wherein a channel formation region of the transistor includes an oxide semiconductor.

16. The semiconductor device according to claim 15, wherein the photoelectric conversion element includes a selenium-based semiconductor.

17. The semiconductor device according to claim 15, wherein the semiconductor device is configured to take an image with a global shutter system.

18. An imaging system comprising:
a photodetector portion including the semiconductor device according to claim 14; and
a data processing portion including a decoder,
wherein the decoder is configured to extract the compressed data input from the photodetector portion.

19. An electronic device comprising:
the semiconductor device according to claim 14; and
a housing, a display portion, or an operation key.

* * * * *